（12） United States Patent
Yamazaki et al.

(10) Patent No.: US 10,303,009 B2
(45) Date of Patent: May 28, 2019

(54) DISPLAY DEVICE, DISPLAY MODULE, ELECTRONIC DEVICE, AND MANUFACTURING METHOD OF DISPLAY DEVICE

(71) Applicant: Semiconductor Energy Laboratory Co., Ltd., Kanagawa-ken (JP)

(72) Inventors: Shunpei Yamazaki, Tokyo (JP); Daisuke Kubota, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 28 days.

(21) Appl. No.: 15/634,194

(22) Filed: Jun. 27, 2017

(65) Prior Publication Data

US 2018/0004047 A1     Jan. 4, 2018

(30) Foreign Application Priority Data

Jun. 30, 2016   (JP) ................................ 2016-130007
Jul. 8, 2016   (JP) ................................ 2016-136220

(51) Int. Cl.
*G02F 1/1343*   (2006.01)
*G02F 1/1333*   (2006.01)
(Continued)

(52) U.S. Cl.
CPC ...... *G02F 1/134309* (2013.01); *G02F 1/1333* (2013.01); *G02F 1/1368* (2013.01);
(Continued)

(58) Field of Classification Search
CPC .............................................. G02F 1/134309
See application file for complete search history.

(56) References Cited

U.S. PATENT DOCUMENTS 6,714,268 B2   3/2004   Wang et al.
7,038,641 B2   5/2006   Hirota et al.
(Continued)

FOREIGN PATENT DOCUMENTS

JP   2001-066593 A   3/2001
JP   2002-196702 A   7/2002
(Continued)

OTHER PUBLICATIONS

Lee, J-H et al., "High Ambient-Contrast-Ratio Display Using Tandem Reflective Liquid Crystal Display and Organic Light-Emitting Device," Optics Express, 2005, vol. 13, No. 23, pp. 9431-9438.
(Continued)

*Primary Examiner* — Sang V Nguyen
(74) *Attorney, Agent, or Firm* — Husch Blackwell LLP

(57) ABSTRACT

A display device with a wide viewing angle is provided. A display device with a high aperture ratio is provided. The display device includes a first display element, a second display element, and an insulating layer. The first display element includes a first pixel electrode configured to reflect visible light. The second display element is configured to emit visible light. The second display element includes a second pixel electrode and a common electrode. The first pixel electrode is positioned on an opposite side of the insulating layer from the second pixel electrode. The common electrode is positioned on an opposite side of the second pixel electrode from the insulating layer. A shortest distance X between a first plane and a second plane is longer than or equal to 500 nm and shorter than or equal to 200 μm. The first plane includes a plane of the first pixel electrode on the insulating layer side in a display region of the first display element, and the second plane includes a plane of the common electrode on the insulating layer side in a display region of the second display element.

20 Claims, 28 Drawing Sheets

(51) Int. Cl.
  *G02F 1/1335* (2006.01)
  *G02F 1/1362* (2006.01)
  *G02F 1/1368* (2006.01)
  *H01L 27/32* (2006.01)
  *H01L 51/52* (2006.01)
  *H01L 27/12* (2006.01)
  *H01L 29/786* (2006.01)

(52) U.S. Cl.
  CPC .. *G02F 1/133345* (2013.01); *G02F 1/133553* (2013.01); *G02F 1/136227* (2013.01); *G02F 1/136286* (2013.01); *H01L 27/3232* (2013.01); *H01L 27/3248* (2013.01); *H01L 27/3258* (2013.01); *H01L 51/5206* (2013.01); *H01L 51/5231* (2013.01); *G02F 1/133305* (2013.01); *G02F 2201/121* (2013.01); *G02F 2201/123* (2013.01); *G02F 2201/40* (2013.01); *G02F 2201/44* (2013.01); *G02F 2202/10* (2013.01); *H01L 27/1225* (2013.01); *H01L 29/7869* (2013.01); *H01L 2251/558* (2013.01)

(56) References Cited

U.S. PATENT DOCUMENTS

| | | |
|---|---|---|
| 7,084,936 B2 | 8/2006 | Kato |
| 7,102,704 B2 | 9/2006 | Mitsui et al. |
| 7,176,991 B2 | 2/2007 | Mitsui et al. |
| 7,239,361 B2 | 7/2007 | Kato |
| 7,248,235 B2 | 7/2007 | Fujii et al. |
| 7,385,654 B2 | 6/2008 | Mitsui et al. |
| 8,830,424 B2 | 9/2014 | Hirakata et al. |
| 9,088,006 B2 | 7/2015 | Yamazaki et al. |
| 2003/0201960 A1 | 10/2003 | Fujieda |
| 2006/0072047 A1 | 4/2006 | Sekiguchi |
| 2008/0180618 A1 | 7/2008 | Fujieda |
| 2010/0171905 A1 | 7/2010 | Huang et al. |
| 2015/0325812 A1 | 11/2015 | Yamazaki et al. |
| 2016/0079315 A1* | 3/2016 | Oh .............. H01L 51/5271 257/40 |
| 2016/0233282 A1* | 8/2016 | Song .............. H01L 51/56 |
| 2016/0299387 A1 | 10/2016 | Yamazaki et al. |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2011-191750 A | 9/2011 |
| JP | 2013-221965 A | 10/2013 |
| JP | 2014-197522 A | 10/2014 |
| WO | WO 2004/053819 A1 | 6/2004 |

OTHER PUBLICATIONS

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, May 22, 2016, vol. 47, pp. 1002-1004.

Shieh, H-P., "Transflective Display by Hybrid OLED and LCD," LEOS 2005 (IEEE Lasers and Electro-Optics Society Annual Meeting), Oct. 22, 2005, pp. 650-651, IEEE.

* cited by examiner

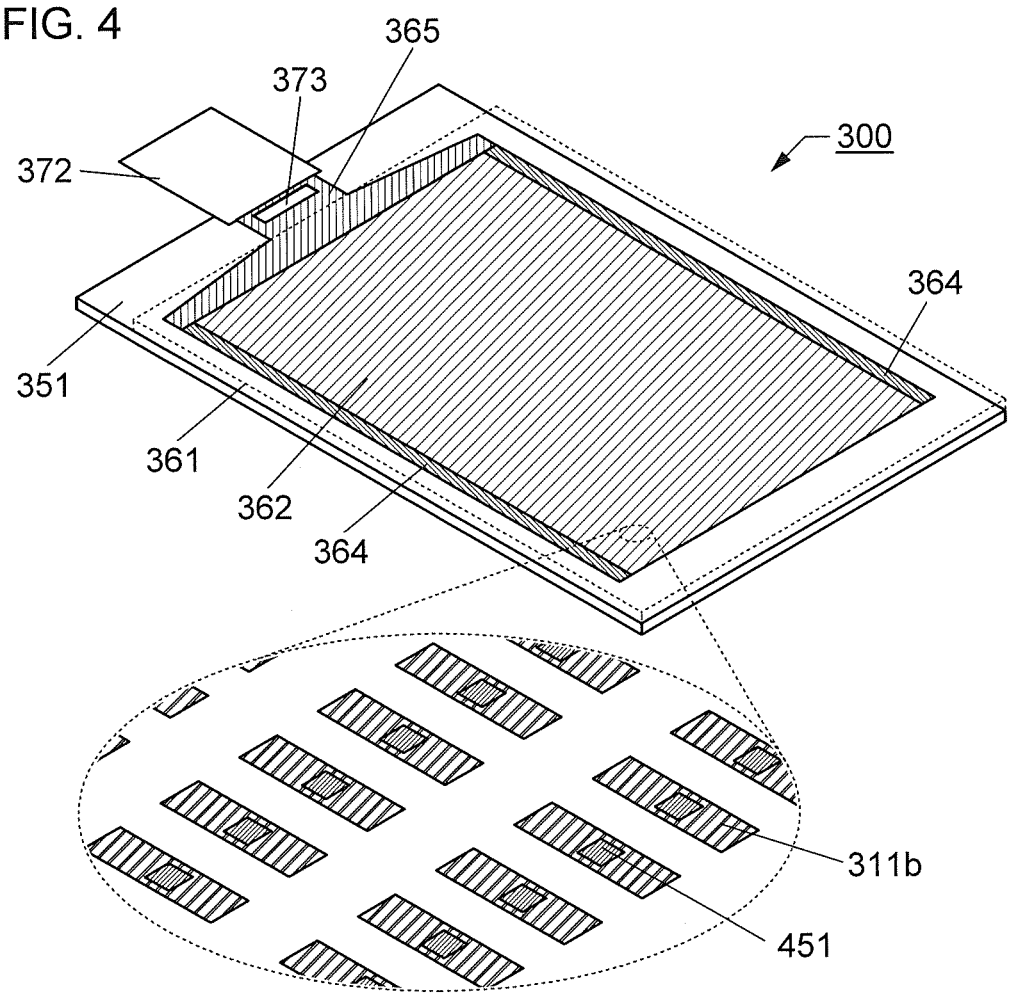

$ND = N_1D_1 + N_2D_2 + \cdots + N_aD_a$ $D_1\tan\theta_1 + D_2\tan\theta_2 \leqq 9L/10 + A$ $\sin\theta_1/\sin 85° = 1/N_1$ $\sin\theta_2/\sin 85° = 1/N_2$ FIG. 23A
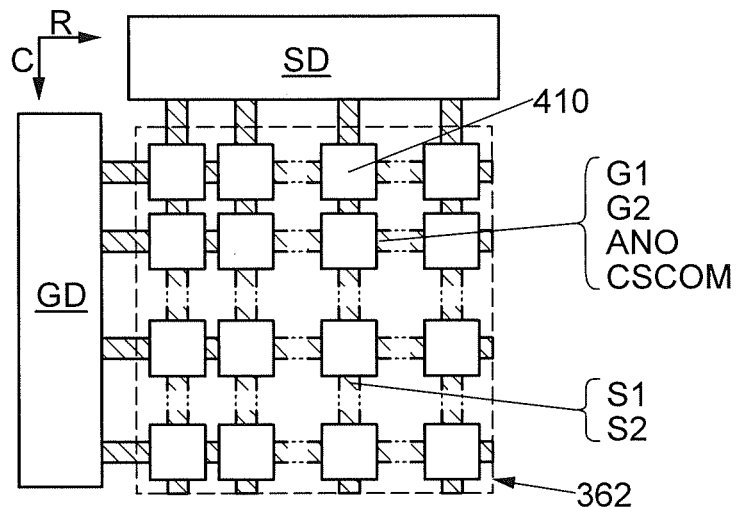
FIG. 23B1
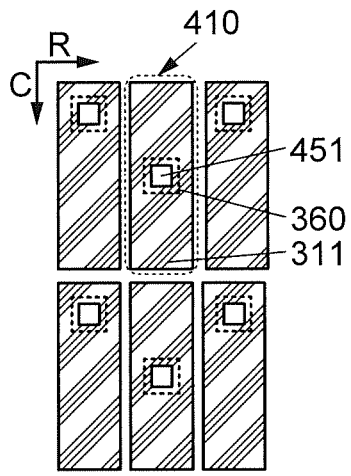
FIG. 23B2
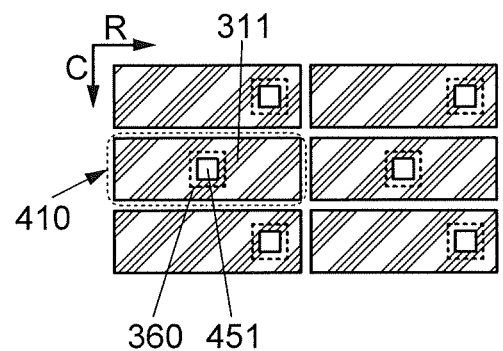
FIG. 23B3
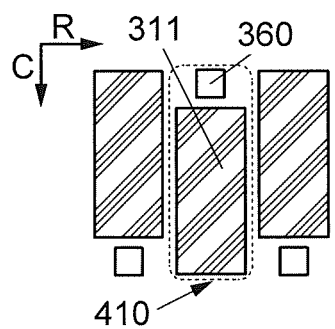
FIG. 23B4
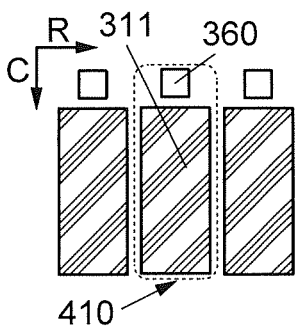

US 10,303,009 B2

DISPLAY DEVICE, DISPLAY MODULE, ELECTRONIC DEVICE, AND MANUFACTURING METHOD OF DISPLAY DEVICE

BACKGROUND OF THE INVENTION

1. Field of the Invention

One embodiment of the present invention relates to a display device, a display module, an electronic device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a driving method thereof, and a manufacturing method thereof.

2. Description of the Related Art

Recent display devices have been expected to be applied to a variety of uses. Light-emitting devices including light-emitting elements, liquid crystal display devices including liquid crystal elements, and the like have been developed as display devices.

Patent Document 1, for example, discloses a flexible light-emitting device to which an organic electroluminescent (EL) element is applied.

Patent Document 2 discloses a transflective liquid crystal display device having a region reflecting visible light and a region transmitting visible light. The transflective liquid crystal display device can be used as a reflective liquid crystal display device in an environment where sufficient external light can be obtained and as a transmissive liquid crystal display device in an environment where sufficient external light cannot be obtained.

REFERENCE

Patent Documents

[Patent Document 1] Japanese Published Patent Application No. 2014-197522
[Patent Document 2] Japanese Published Patent Application No. 2011-191750

SUMMARY OF THE INVENTION

An object of one embodiment of the present invention is to provide a display device with low power consumption. Another object of one embodiment of the present invention is to provide a display device with high visibility regardless of the ambient brightness. Another object of one embodiment of the present invention is to provide an all-weather display device. Another object of one embodiment of the present invention is to provide a display device with a wide viewing angle. Another object of one embodiment of the present invention is to provide a display device with a high aperture ratio. Another object of one embodiment of the present invention is to provide a display device with high light extraction efficiency. Another object of one embodiment of the present invention is to provide a display device with high convenience. Another object of one embodiment of the present invention is to reduce the thickness or weight of a display device. Another object of one embodiment of the present invention is to provide a novel display device, a novel input/output device, a novel electronic device, or the like.

Note that the descriptions of these objects do not preclude the existence of other objects. One embodiment of the present invention does not necessarily achieve all the objects. Other objects can be derived from the description of the specification, the drawings, and the claims.

[1] One embodiment of the present invention is a display device including a first display element, a second display element, and an insulating layer. The first display element includes a first pixel electrode configured to reflect visible light. The second display element is configured to emit visible light. The second display element includes a second pixel electrode and a common electrode. The first pixel electrode is positioned on an opposite side of the insulating layer from the second pixel electrode. The common electrode is positioned on an opposite side of the second pixel electrode from the insulating layer. A shortest distance X between a first plane and a second plane is longer than or equal to 500 nm and shorter than or equal to 200 μm. The first plane includes a plane of the first pixel electrode on the insulating layer side in a display region of the first display element, and the second plane includes a plane of the common electrode on the insulating layer side in a display region of the second display element. The display device preferably includes a first transistor and a second transistor. The first transistor is configured to control driving of the first display element. The second transistor is configured to control driving of the second display element. The insulating layer has a portion serving as a gate insulating layer of the first transistor and a portion serving as a gate insulating layer of the second transistor.

[2] One embodiment of the present invention is a display device including a first display element, a second display element, a first insulating layer, a second insulating layer, a first transistor, and a second transistor. The first transistor is configured to control driving of the first display element. The second transistor is configured to control driving of the second display element. The first display element includes a first pixel electrode configured to reflect visible light. The second display element is configured to emit visible light. The second display element includes a second pixel electrode and a common electrode. The first transistor and the second transistor are positioned between the first insulating layer and the second insulating layer. The first transistor is electrically connected to the first pixel electrode through an opening in the first insulating layer. The second transistor is electrically connected to the second pixel electrode through an opening in the second insulating layer. The common electrode is positioned on an opposite side of the second pixel electrode from the second insulating layer. A shortest distance X between a first plane and a second plane is longer than or equal to 500 nm and shorter than or equal to 200 μm. The first plane includes a plane of the first pixel electrode on the first transistor side in a display region of the first display element, and the second plane includes a plane of the common electrode on the second transistor side in a display region of the second display element. One or both of the first transistor and the second transistor preferably include an oxide semiconductor in a channel formation region. The display device preferably includes an optical member. A shortest distance between the optical member and the first transistor is longer than a shortest distance between the optical member and the first display element. A shortest distance between the optical member and the second display element is longer than the shortest distance between the optical member and the first transistor. The optical member preferably includes at least one of a polarizing plate, a light diffusion layer, and an anti-reflective layer.

In [1] or [2], the shortest distance X is preferably longer than or equal to 1 μm and shorter than or equal to 20 μm.

In [1] or [2], the first pixel electrode may include an opening. In that case, the second display element includes a region overlapping with the opening. The second display element is configured to emit visible light to the opening.

[3] One embodiment of the present invention is a display device including a first display element, a second display element, and an insulating layer. The first display element is configured to reflect visible light. The second display element is configured to emit visible light. The first display element is positioned on an opposite side of the insulating layer from the second display element. When a viewer sees the display device from a direction inclined by 85° from a direction perpendicular to a display surface of the display device, the viewer can see 10% or more of the area of a display region of the second display element. When a viewer sees the display device from a direction inclined by 30° from the direction perpendicular to the display surface of the display device, the viewer can see 100% of the area of the display region of the second display element.

[4] One embodiment of the present invention is the display device in [3], which has the following characteristics. The first display element includes a first pixel electrode configured to reflect visible light. The second display element includes a second pixel electrode and a common electrode. The first pixel electrode is positioned on an opposite side of the insulating layer from the second pixel electrode. The common electrode is positioned on an opposite side of the second pixel electrode from the insulating layer.

[5] One embodiment of the present invention is the display device in [4], which has the following characteristics. The first pixel electrode includes an opening. The second display element includes a region overlapping with the opening. The second display element is configured to emit visible light to the opening.

[6] One embodiment of the present invention is the display device in [5], which has the following characteristics. The display device satisfies Formula (1), Formula (2), Formula (3), and Formula (4). A first plane includes a plane of the first pixel electrode on an opposite side of the insulating layer in a display region of the first display element. A second plane includes a plane of the common electrode on the insulating layer side in a display region of the second display element.

[Formulae 1]

$$D\tan\theta_1 \leq \frac{9}{10}L + A \quad (1)$$

$$\frac{\sin\theta_1}{\sin 85°} = \frac{1}{N} \quad (2)$$

$$D\tan\theta_2 \leq A \quad (3)$$

$$\frac{\sin\theta_2}{\sin 30°} = \frac{1}{N} \quad (4)$$

In the above formulae, A, which is greater than or equal to 0, represents the length between an end portion of the first pixel electrode and a foot of a perpendicular drawn from an end portion of the display region of the second display element to the first plane. Furthermore, D represents the shortest distance between the first plane and the second plane, and L represents the width of the second pixel electrode. In addition, N, which is greater than or equal to 1, represents the refractive index between the first plane and the second plane in the region overlapping with the opening. Each of $\theta_1$ and $\theta_2$ represents an angle formed by a perpendicular from the second plane to the first plane and incident light from the second display element to the first plane.

In [6], a stacked-layer structure of a layers may be included between the first plane and the second plane and in the region overlapping with the opening. In this case, N satisfies Formula (5).

[Formula 2]

$$N = \frac{\sum_{x=1}^{a} N_x D_x}{D} \quad (5)$$

In the above formula, a is an integer greater than or equal to 2, and x is an integer greater than or equal to 1 and less than or equal to a. Furthermore, $D_x$ represents the thickness of an x-th layer in the stacked-layer structure, and $N_x$, which is greater than or equal to 1, represents the refractive index of the x-th layer in the stacked-layer structure.

[7] One embodiment of the present invention is the display device in [5], which has the following characteristics. A stacked-layer structure of a layers is included between a first plane and a second plane and in the region overlapping with the opening. The display device satisfies Formula (6), Formula (7), Formula (8), and Formula (9). The first plane includes a plane of the first pixel electrode on an opposite side of the insulating layer in a display region of the first display element. The second plane includes a plane of the common electrode on the insulating layer side in a display region of the second display element.

[Formulae 3]

$$\sum_{x=1}^{a} D_x \tan\theta_x \leq \frac{9}{10}L + A \quad (6)$$

$$\frac{\sin\theta_x}{\sin 85°} = \frac{1}{N_x} \quad (7)$$

$$\sum_{y=1}^{a} D_y \tan\theta_y \leq A \quad (8)$$

$$\frac{\sin\theta_y}{\sin 30°} = \frac{1}{N_y} \quad (9)$$

In the above formulae, a is an integer greater than or equal to 2, and each of x and y is an integer greater than or equal to 1 and less than or equal to a. Note that A, which is greater than or equal to 0, represents the length between an end portion of the first pixel electrode and a foot of a perpendicular drawn from an end portion of the display region of the second display element to the first plane. Furthermore, $D_x$ represents the thickness of an x-th layer in the stacked-layer structure, $D_y$ represents the thickness of a y-th layer in the stacked-layer structure, and L represents the width of the second pixel electrode. In addition, $N_x$, which is greater than or equal to 1, represents the refractive index of the x-th layer in the stacked-layer structure, and $N_y$, which is greater than or equal to 1, represents the refractive index of the y-th layer in the stacked-layer structure. Furthermore, $\theta_x$ represents an angle formed by a perpendicular from the second plane to the first plane and refracted light of light emitted from the second display element that enters the x-th layer from an (x−1)-th layer, and $\theta_y$ represents an angle formed by the perpendicular from the second plane to the first plane and refracted light of light emitted from the second display element that enters the y-th layer from a (y−1)-th layer.

The display device in any one of [3] to [7] preferably includes a first transistor and a second transistor. The first transistor is configured to control driving of the first display element. The second transistor is configured to control driving of the second display element. In this case, the insulating layer has a portion serving as a gate insulating layer of the first transistor and a portion serving as a gate insulating layer of the second transistor. One or both of the first transistor and the second transistor preferably include an oxide semiconductor in a channel formation region.

The display device in any one of [3] to [7] preferably includes an optical member. A shortest distance between the optical member and the first transistor is longer than a shortest distance between the optical member and the first display element. A shortest distance between the optical member and the second display element is longer than the shortest distance between the optical member and the first transistor. The optical member preferably includes at least one of a polarizing plate, a light diffusion layer, and an anti-reflective layer.

Any of the above display devices is preferably configured to display an image using one or both of light reflected by the first display element and light emitted from the second display element.

In any of the above display devices, the first display element is preferably a reflective liquid crystal element.

In any of the above display devices, the second display element is preferably an electroluminescent element.

One embodiment of the present invention is a display module including any of the above display devices and a circuit board such as a flexible printed circuit (FPC).

One embodiment of the present invention is an electronic device including the above display module and at least one of an antenna, a battery, a housing, a camera, a speaker, a microphone, and an operation button.

One embodiment of the present invention is a method for manufacturing a display device including a first display element, a second display element, and an insulating layer. The first display element includes a first pixel electrode configured to reflect visible light, a liquid crystal layer, and a first common electrode configured to transmit visible light. The second display element includes a second pixel electrode configured to transmit visible light, a light-emitting layer, and a second common electrode configured to reflect visible light. A shortest distance X between a first plane and a second plane is longer than or equal to 500 nm and shorter than or equal to 200 μm. The first plane includes a plane of the first pixel electrode on the insulating layer side in a display region of the first display element, and the second plane includes a plane of the second common electrode on the insulating layer side in a display region of the second display element. In the method for manufacturing the display device, the first common electrode is formed over a first substrate; the first pixel electrode is formed over a formation substrate; the insulating layer is formed over the first pixel electrode; the second pixel electrode, the light-emitting layer, and the second common electrode are formed in this order over the insulating layer to form the second display element; the formation substrate and a second substrate are bonded to each other with an adhesive; the formation substrate and the first pixel electrode are separated from each other; and the liquid crystal layer is positioned between the first common electrode and the exposed first pixel electrode and the first substrate and the second substrate are bonded to each other with an adhesive to form the first display element.

In the above method for manufacturing a display device, after the first pixel electrode is formed, an opening may be provided in the first pixel electrode and the second display element may be formed in a region overlapping with the opening.

In the above method for manufacturing a display device, the adhesive used to bond the first substrate and the second substrate to each other may include a conductive particle. The first common electrode is electrically connected to a conductive layer by the conductive particle when the first substrate and the second substrate are bonded to each other. The conductive layer and the first pixel electrode are formed by processing one conductive film.

According to one embodiment of the present invention, a display device with low power consumption can be provided. According to one embodiment of the present invention, a display device with high visibility regardless of the ambient brightness can be provided. According to one embodiment of the present invention, an all-weather display device can be provided. According to one embodiment of the present invention, a display device with a wide viewing angle can be provided. According to one embodiment of the present invention, a display device with a high aperture ratio can be provided. According to one embodiment of the present invention, a display device with high light extraction efficiency can be provided. According to one embodiment of the present invention, a display device with high convenience can be provided. According to one embodiment of the present invention, the thickness or weight of a display device can be reduced. According to one embodiment of the present invention, a novel display device, a novel input/output device, a novel electronic device, or the like can be provided.

Note that the descriptions of these effects do not preclude the existence of other effects. One embodiment of the present invention does not necessarily have all the effects. Other effects can be derived from the description of the specification, the drawings, and the claims.

BRIEF DESCRIPTION OF THE DRAWINGS

FIG. 4 is a perspective view illustrating an example of a display device.

FIG. 23A illustrates an example of a display device, and FIGS. 23B1, 23B2, 23B3, and 23B4 each illustrate an example of a pixel.

DETAILED DESCRIPTION OF THE INVENTION

Figure 1:
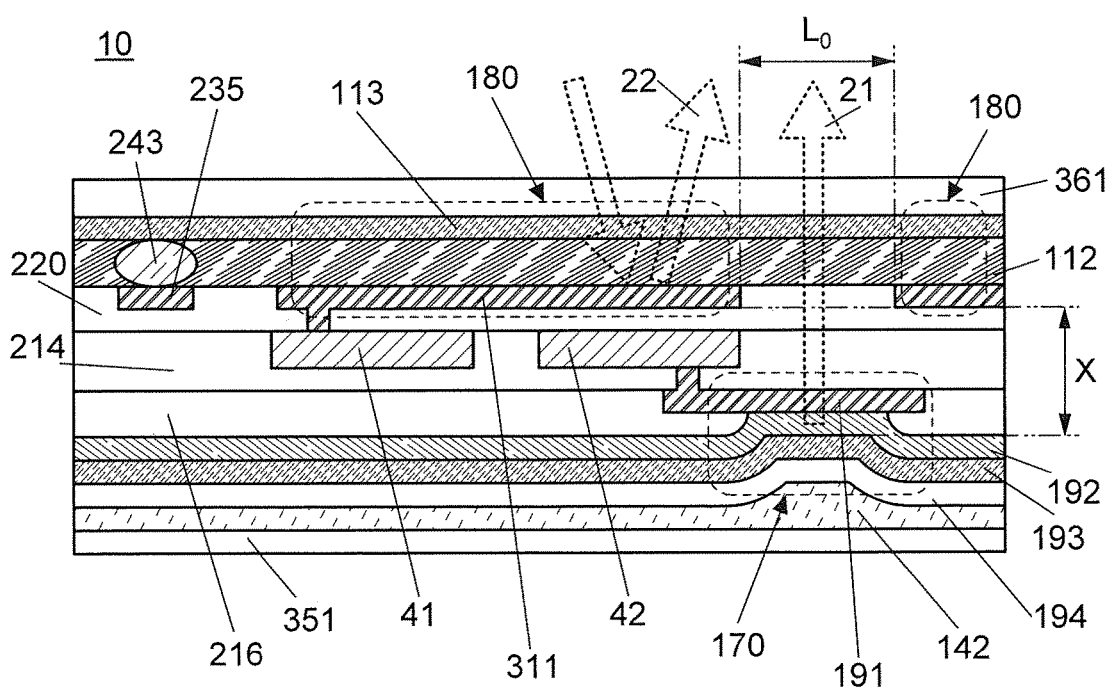
FIG. 1 is a cross-sectional view illustrating an example of a display device.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated.

Further, the same hatching pattern is applied to portions having similar functions, and the portions are not denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film," and the term "insulating film" can be changed into the term "insulating layer."

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

An example of a crystal structure of an oxide semiconductor or a metal oxide is described. Note that an oxide semiconductor deposited by a sputtering method using an In—Ga—Zn oxide target (In:Ga:Zn=4:2:4.1 in an atomic ratio) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of more than or equal to 0.5 nm and less than or equal to 10 nm, preferably more than or equal to 0.5 nm and less than or equal to 3 nm and are dispersed in the material, in some cases.

Embodiment 1

In this embodiment, a display device of one embodiment of the present invention will be described with reference to FIG. 1, FIGS. 2A and 2B, FIGS. 3A and 3B, FIG. 4, FIG. 5, FIG. 6, FIGS. 7A and 7B, FIGS. 8A to 8E, FIGS. 9A to 9D, FIGS. 10A to 10C, FIGS. 11A and 11B, and FIGS. 12A and 12B.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which displays an image by reflecting external light can be used. Such an element does not include a light source (or does not require an artificial light source); thus, power consumed in displaying an image can be significantly reduced.

As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than Micro Electro Mechanical Systems (MEMS) shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

The display device of this embodiment has a first mode in which an image is displayed using only the first display element, a second mode in which an image is displayed using only the second display element, and a third mode in which an image is displayed using both the first display element and the second display element. The display device of this embodiment can be switched between these modes automatically or manually.

In the first mode, an image is displayed using the first display element and external light. Because a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or light near white light and is sufficiently strong, for example. The first mode is suitable for displaying text. Furthermore, the first mode enables eye-friendly display owing to the use of reflected external light, which leads to an effect of easing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. In that case, glare can be reduced, and power consumption can also be reduced. The second mode is suitable for displaying a vivid (still and moving) image or the like.

In the third mode, an image is displayed using both light reflected by the first display element and light emitted from the second display element. An image displayed in the third mode can be more vivid than an image displayed in the first mode while power consumption can be lower than that in the second mode. The third mode is effective in the case where the illuminance is relatively low or in the case where the chromaticity of external light is not white, for example, in an environment under indoor illumination or in the morning or evening.

With such a structure, an all-weather display device or a highly convenient display device with high visibility regardless of the ambient brightness can be fabricated.

FIG. 1 is a cross-sectional view of a display device 10. The display device 10 includes a liquid crystal element 180 as the first display element and a light-emitting element 170 as the second display element.

The display device 10 illustrated in FIG. 1 includes the liquid crystal element 180, the light-emitting element 170, a transistor 41, a transistor 42, and the like between a pair of substrates (a substrate 351 and a substrate 361).

The liquid crystal element 180 includes an electrode 311 having a function of reflecting visible light, a liquid crystal layer 112, and an electrode 113 having a function of transmitting visible light. The liquid crystal layer 112 is positioned between the electrode 311 and the electrode 113.

The liquid crystal element 180 has a function of reflecting visible light. The liquid crystal element 180 reflects light 22 to the substrate 361 side.

The electrode 311 is electrically connected to a source or a drain of the transistor 41 through an opening provided in an insulating layer 220. The electrode 311 functions as a pixel electrode. The electrode 113 is electrically connected to a conductive layer 235 via a connector 243. The electrode 311 and the conductive layer 235 can be formed by processing one conductive film.

The light-emitting element 170 includes an electrode 191, an EL layer 192, and an electrode 193. The EL layer 192 is positioned between the electrode 191 and the electrode 193. The EL layer 192 contains at least a light-emitting substance. The electrode 191 has a function of transmitting visible light. The electrode 193 preferably has a function of reflecting visible light.

The light-emitting element 170 has a function of emitting visible light. Specifically, the light-emitting element 170 is an electroluminescent element that emits light to the substrate 361 side (light emission 21) when voltage is applied between the electrode 191 and the electrode 193.

The electrode 191 is electrically connected to a source or a drain of the transistor 42 through an opening provided in an insulating layer 214. The electrode 191 functions as a pixel electrode. An end portion of the electrode 191 is covered with an insulating layer 216.

The light-emitting element 170 is preferably covered with an insulating layer 194. In FIG. 1, the insulating layer 194 is provided in contact with the electrode 193. The insulating layer 194 can prevent an impurity from entering the light-emitting element 170, leading to an increase in the reliability of the light-emitting element 170. The insulating layer 194 and the substrate 351 are bonded to each other with an adhesive layer 142.

The transistor 41 and the transistor 42 are positioned on the same plane. The transistor 41 has a function of controlling the driving of the liquid crystal element 180. The transistor 42 has a function of controlling the driving of the light-emitting element 170.

A circuit electrically connected to the liquid crystal element 180 and a circuit electrically connected to the light-emitting element 170 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The electrode 311, which serves as the pixel electrode of the liquid crystal element 180, is positioned on the opposite side of a gate insulating layer included in the transistors 41 and 42 from the electrode 191, which serves as the pixel electrode of the light-emitting element 170.

In the case where a transistor including an oxide semiconductor in its channel formation region and having extremely low off-state current is used as the transistor 41 or in the case where a memory element electrically connected to the transistor 41 is used, for example, in displaying a still image using the liquid crystal element 180, even if writing operation to a pixel is stopped, the gray level can be maintained. In other words, an image can be kept displayed even with an extremely low frame rate. In one embodiment of the present invention, the frame rate can be extremely low and driving with low power consumption can be performed.

A distance X in FIG. 1 is the shortest distance between a first plane and a second plane. The first plane includes a plane of the electrode 311 on the substrate 351 side in a display region of the liquid crystal element 180, and the second plane includes a plane of the electrode 193 on the substrate 361 side in a display region of the light-emitting element 170. Note that the electrode 311 is a layer having a function of reflecting visible light, which is included in the liquid crystal element 180. The electrode 193 is a layer having a function of reflecting visible light, which is included in the light-emitting element 170. The electrode 193 can reflect light emitted from the EL layer 192. Thus, the distance X can be determined with reference to the electrode 193. Note that the display region of the display element is a region contributing to displaying an image in the display element.

Figure 2A:
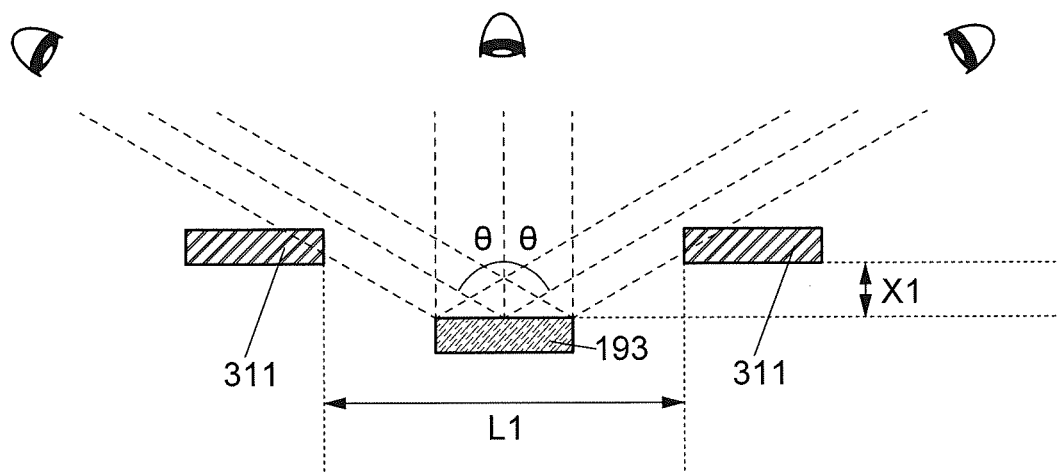
FIGS. 2A and 2B are cross-sectional views each illustrating a positional relationship between an electrode included in a liquid crystal element and an electrode included in a light-emitting element.
Figure 2B:
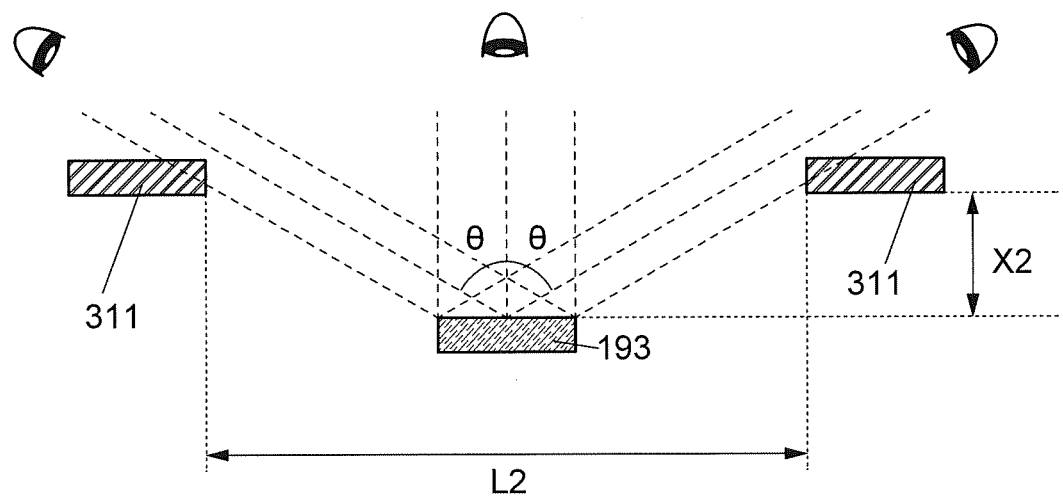

As illustrated in FIGS. 2A and 2B, when the display device is seen from the direction inclined toward the left or right by an angle θ from the direction perpendicular to a display surface, which is regarded as 0°, a light-emitting region of the light-emitting element 170 is partially blocked from view by the electrode 311, in some cases. When light emitted from the light-emitting element 170 is partially blocked by the electrode 311, the luminance of an image that a viewer sees is lower than that in the case of seeing from the direction perpendicular to the display surface (θ=0°). FIGS. 2A and 2B illustrate only the electrode 193 of the light-emitting element 170 for easy description.

The proportion of the display region of the light-emitting element 170 that is blocked from view by the electrode 311 when the display device is seen from the direction inclined by the angle θ is the same (or viewing angle characteristics are the same) in FIGS. 2A and 2B. At the same time, a distance X2 in FIG. 2B is longer than a distance X1 in FIG. 2A. In that case, a length L2 in FIG. 2B is longer than a length L1 in FIG. 2A.

A length $L_0$ shown in FIG. 1 corresponds to, for example, the length of a region where the electrode 311 is not provided, e.g., the length of an opening in the electrode 311. The shorter the length $L_0$ is, the larger the area of the electrode 311 in each pixel can be. Accordingly, the aperture ratio of the liquid crystal element 180 can be increased.

In the case where the viewing angle characteristics of the display device are the same as illustrated in FIGS. 2A and 2B, the length $L_0$ can be made shorter as the distance X becomes shorter. When the length $L_0$ is fixed, the viewing angle can be increased as the distance X becomes shorter.

In the display device of this embodiment, the distance X is preferably greater than or equal to 500 nm and less than or equal to 200 μm, further preferably greater than or equal to 1 μm and less than or equal to 100 μm, and still further preferably greater than or equal to 1 μm and less than or equal to 20 μm. When the distance X is short, high viewing angle characteristics of the display device and a high aperture ratio of the liquid crystal element 180 can be both achieved. In addition, since the length $L_0$ can be made short, the aperture ratio of the liquid crystal element 180 can be increased and the total aperture ratio of the liquid crystal element 180 and the light-emitting element 170 can be increased.

If the distance X is too short, the distance between the transistor and the electrode in the display element is shortened, which might cause an increase in parasitic capacitance. Thus, the distance X is preferably greater than or equal to 500 nm. To reduce the parasitic capacitance between the electrode 311 and the transistor, the thickness of the insulating layer 220 is preferably greater than or equal to 200 nm, and further preferably greater than or equal to 500 nm.

The shorter the distance X is, the shorter the distance from the display surface (which is on the substrate 361 side) of the display device 10 to the electrode 193 can be. Accordingly, the luminance of the light-emitting element 170 can be increased, and the light extraction efficiency of the display device 10 can be increased.

In a structure formed by simply bonding a display panel including the liquid crystal element 180 and a display panel including the light-emitting element 170 to each other, a thick layer (mainly used as a substrate) made of glass, a resin, or the like is positioned between the liquid crystal element 180 and the light-emitting element 170; thus, it is difficult to make the distance X short. The display device of this embodiment does not include a substrate between the liquid crystal element 180 and the light-emitting element 170. Thus, the distance X can be short.

Figure 3A:
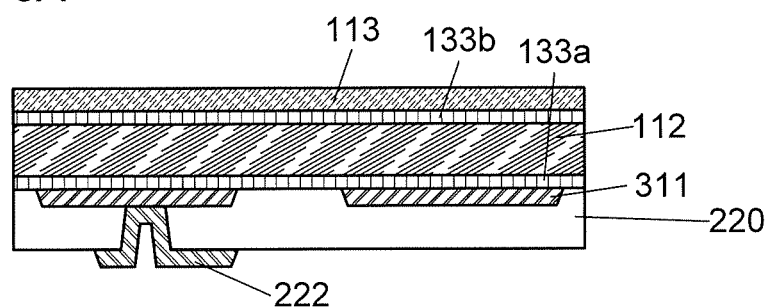
FIGS. 3A and 3B are cross-sectional views each illustrating an example of a display device.
Figure 3B:
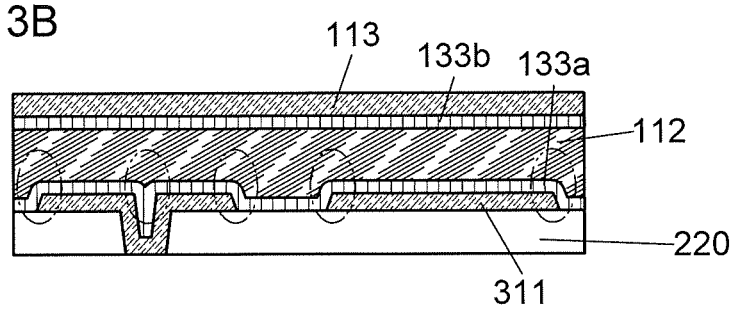

FIGS. 3A and 3B are specific cross-sectional views each illustrating the liquid crystal layer 112 and components around the liquid crystal layer 112. In each of FIGS. 3A and 3B, the liquid crystal layer 112 is positioned between an alignment film 133a and an alignment film 133b. As illustrated in FIG. 3A, the electrode 311 is embedded in the insulating layer 220 in the display device of this embodiment. A plane of the electrode 311 on the liquid crystal layer 112 side and a plane of the insulating layer 220 on the liquid crystal layer 112 side can form the same plane (or the same surface). That is, the plane of the electrode 311 on the liquid crystal layer 112 side and the plane of the insulating layer 220 on the liquid crystal layer 112 side are positioned on the same plane or in contact with the same plane, or the planes have the same height or have (substantially) no step difference at the boundary, for example. Furthermore, the alignment film 133a is provided flatly.

Meanwhile, in a comparative example illustrated in FIG. 3B, the electrode 311 is provided on the plane of the insulating layer 220 on the liquid crystal layer 112 side. The alignment film 133a has an uneven surface (see portions in dashed-dotted frames) due to the thickness of the electrode 311. Near an end portion of the electrode 311, the initial alignment of the liquid crystal layer 112 is more prone to variation due to the uneven surface of the alignment film 133a in some cases. When such a region of the liquid crystal layer 112 that is more prone to initial alignment variation is used for displaying an image, the contrast might degrade. Furthermore, in the case where the region of the liquid crystal layer 112 that is more prone to initial alignment variation exists between two adjacent pixels, the degradation in contrast can be reduced by covering the region with a light-blocking layer or the like. However, this might reduce the aperture ratio.

As illustrated in FIG. 3A, the alignment film 133a is provided flat in the display device of this embodiment; thus, a defect is less likely to occur in alignment treatment such as rubbing treatment, and the initial alignment can be made uniform more easily even near the end portion of the electrode 311. Providing the alignment film 133a flatly can reduce the generation of the region prone to the initial alignment variation of the liquid crystal layer 112 between two adjacent pixels. Thus, the aperture ratio can be increased, and the display device can easily achieve a high resolution.

Here, an example of a method for manufacturing the display device 10 illustrated in FIG. 1 is described. Note that the specific description of the method for manufacturing the display device of this embodiment will be described later. First, the electrode 311, the transistors 41 and 42, and the light-emitting element 170 are formed in this order over a formation substrate. Next, the formation substrate and the substrate 351 are bonded to each other. After that, the formation substrate and the substrate 351 are separated from each other, so that the electrode 311, the transistors 41 and 42, the light-emitting element 170, and the like are transferred from the formation substrate to the substrate 351. Then, the substrate 351 and the substrate 361 over which the electrode 113 and the like are provided are bonded to each other with the liquid crystal layer 112 provided therebetween. In this manner, the display device can be fabricated.

Since the electrode 311 is formed before the transistor 41, the electrode 311 can be formed flat without being influenced by the unevenness due to the transistor 41 and a contact portion between the electrode 311 and the transistor 41.

In the case where the transistor 41 and the light-emitting element 170 are formed before the electrode 311, to reduce the unevenness due to the transistor 41 and the light-emitting element 170, it is necessary to form a planarization film over the transistor 41 or the light-emitting element 170 and to form the electrode 311 over the planarization film. In that case, the electrode 311 and the transistor 41 are connected to each other through an opening in the planarization film and the contact portion therebetween forms a step, leading to a reduction in aperture ratio.

When the electrode 311 is formed before the transistor 41 and the light-emitting element 170, the planarization film is unnecessary. Specifically, the thickness of the insulating layer 220 can be reduced. Accordingly, the distance between the electrode 311 and the transistor 41 and the distance between the electrode 311 and the light-emitting element 170 can be shortened.

As described above, in the display device of this embodiment, forming the pixel electrode of the liquid crystal element flat can reduce variation of the initial alignment of the liquid crystal layer. Thus, a display defect in the display device can be inhibited. Furthermore, a reduction in aperture ratio due to the alignment defect of the liquid crystal layer can be inhibited.

Since the distance between the pixel electrode of the liquid crystal element and the light-emitting element can be shortened in the display device of this embodiment, high viewing angle characteristics of the display device and a high aperture ratio of the liquid crystal element can be both achieved. In addition, the total aperture ratio of the liquid crystal element and the light-emitting element can be increased.

Next, structure examples of the display device of this embodiment will be described with reference to FIG. 4, FIG. 5, FIG. 6, and FIGS. 7A and 7B.

Structure Example 1

FIG. 4 is a schematic perspective view of a display device 300. In the display device 300, the substrate 351 and the substrate 361 are bonded to each other. In FIG. 4, the substrate 361 is denoted by a dashed line.

The display device 300 includes a display portion 362, a circuit 364, a wiring 365, and the like. FIG. 4 illustrates an example in which the display device 300 is provided with an integrated circuit (IC) 373 and an FPC 372. Thus, the structure illustrated in FIG. 4 can be regarded as a display module including the display device 300, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 4 illustrates an example in which the IC 373 is provided over the substrate 351 by a chip on glass (COG) method, a chip on film (COF) method, or the like. An IC including a scan line driver circuit, a signal line driver circuit, or the like can be used as the IC 373, for example. Note that the display device 300 and the display module are not necessarily provided with an IC. The IC may be provided over the FPC by a COF method or the like.

FIG. 4 illustrates an enlarged view of part of the display portion 362. Electrodes 311b included in a plurality of display elements are arranged in a matrix in the display portion 362. The electrode 311b has a function of reflecting visible light, and serves as a reflective electrode of the liquid crystal element 180.

As illustrated in FIG. 4, the electrode 311b includes an opening 451. In addition, the display portion 362 includes the light-emitting element 170 that is positioned closer to the substrate 351 than the electrode 311b. Light from the light-emitting element 170 is emitted to the substrate 361 side through the opening 451 in the electrode 311b. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased. It is particularly preferable that the area of the opening 451 be larger than the area of the light-emitting region of the light-emitting element 170. When the area of the opening 451 is small, part of light from the light-emitting element 170 is blocked by the electrode 311b and cannot be extracted to the outside, in some cases. The opening 451 with a sufficiently large area can reduce waste of light emitted from the light-emitting element 170.

Figure 5:
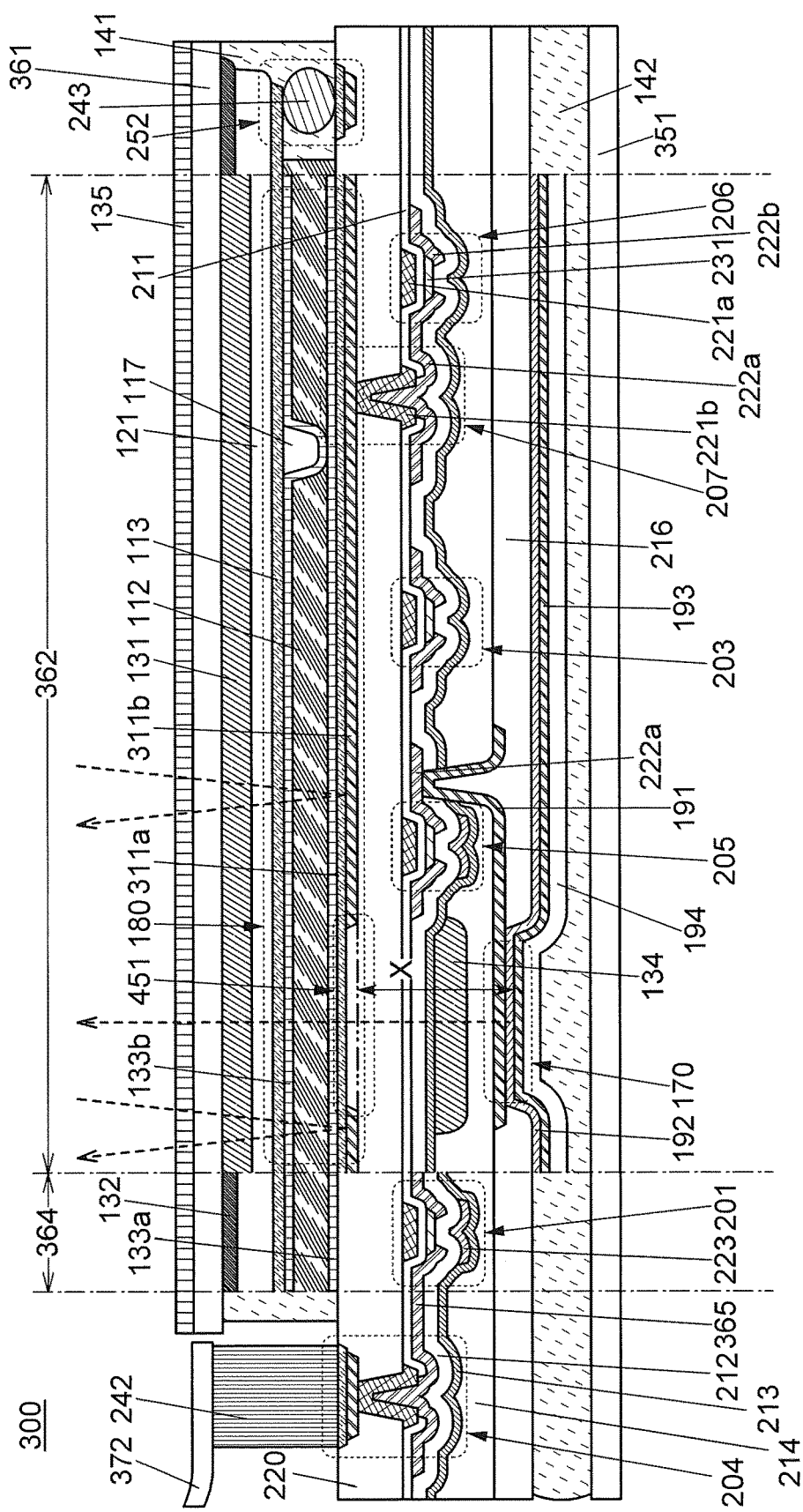
FIG. 5 is a cross-sectional view illustrating an example of a display device.

FIG. 5 illustrates an example of cross-sections of part of a region including the FPC 372, part of a region including the circuit 364, and part of a region including the display portion 362 of the display device 300 illustrated in FIG. 4.

The display device 300 illustrated in FIG. 5 includes a transistor 201, a transistor 203, a transistor 205, a transistor 206, the liquid crystal element 180, the light-emitting element 170, the insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with the adhesive layer 142.

The substrate 361 is provided with the coloring layer 131, a light-blocking layer 132, an insulating layer 121, the electrode 113 functioning as a common electrode of the liquid crystal element 180, the alignment film 133b, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 serves as a spacer for holding a cell gap of the liquid crystal element 180. In the case where the insulating layer 117 transmits visible light, the insulating layer 117 may be positioned to overlap with a display region of the liquid crystal element 180.

The liquid crystal element 180 is a reflective liquid crystal element. The liquid crystal element 180 has a stacked-layer structure of an electrode 311a, the liquid crystal layer 112, and the electrode 113. The electrode 311b that reflects visible light is provided in contact with a surface of the electrode 311a on the substrate 351 side. The electrode 311b includes the opening 451. The electrode 311a and the electrode 113 transmit visible light. The alignment film 133a is provided between the liquid crystal layer 112 and the electrode 311a. The alignment film 133b is provided between the liquid crystal layer 112 and the electrode 113.

In the liquid crystal element 180, the electrode 311b has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311b. Then, the light is transmitted through the liquid crystal layer 112 and the electrode 113 again to reach the polarizing plate 135. In this case, alignment of a liquid crystal can be controlled with a voltage that is applied between the electrode 311b and the electrode 113, and thus optical modulation of light can be controlled. In other words, the intensity of light emitted through the polarizing plate 135 can be controlled. Light excluding light in a particular wavelength region is absorbed by the coloring layer 131, and thus, emitted light is red light, for example.

As illustrated in FIG. 5, the electrode 311a that transmits visible light is preferably provided across the opening 451. Accordingly, liquid crystals in the liquid crystal layer 112 are aligned in a region overlapping with the opening 451 as in the other regions, in which case an alignment defect of the liquid crystals is prevented from being generated in a boundary portion of these regions and undesired light leakage can be suppressed.

At a connection portion 207, the electrode 311b is electrically connected to a conductive layer 222a included in the transistor 206 via a conductive layer 221b. The transistor 206 has a function of controlling the driving of the liquid crystal element 180.

A connection portion 252 is provided in part of a region where the adhesive layer 141 is provided. In the connection portion 252, a conductive layer obtained by processing the same conductive film as the electrode 311a is electrically connected to part of the electrode 113 with the connector 243. Accordingly, a signal or a potential input from the FPC 372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 5, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

The light-emitting element 170 is a bottom-emission light-emitting element. The light-emitting element 170 has a stacked-layer structure in which the electrode 191, the EL layer 192, and the electrode 193 are stacked in this order from the insulating layer 220 side. The electrode 191 is connected to the conductive layer 222a included in the transistor 205 through an opening provided in the insulating layer 214. The transistor 205 has a function of controlling the driving of the light-emitting element 170. The insulating layer 216 covers an end portion of the electrode 191. The electrode 193 includes a material that reflects visible light, and the electrode 191 includes a material that transmits visible light. The insulating layer 194 is provided to cover the electrode 193. Light is emitted from the light-emitting element 170 to the substrate 361 side through the coloring layer 134, the insulating layer 220, the opening 451, the electrode 311a, and the like.

The liquid crystal element 180 and the light-emitting element 170 can exhibit various colors when the color of the coloring layer varies among pixels. The display device 300 can display a color image using the liquid crystal element 180. The display device 300 can display a color image using the light-emitting element 170.

The transistor 201, the transistor 203, the transistor 205, and the transistor 206 are formed on a plane of the insulating layer 220 on the substrate 351 side. These transistors can be fabricated through the same process.

The transistor 203 is used for controlling whether the pixel is selected or not (such a transistor is also referred to as a switching transistor or a selection transistor). The transistor 205 is used for controlling current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and a conductive layer 222b functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistors can be controlled.

There is no limitation of the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material containing an oxide for the conductive layer 223. A conductive film used for the conductive layer 223 is formed under an atmosphere containing oxygen, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by later heat treatment; as a result, oxygen vacancies in the semiconductor layer 231 can be reduced.

It is particularly preferable to use a low-resistance oxide semiconductor for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a similar structure to the connection portion 207. On the top surface of the connection portion 204, a conductive layer obtained by processing the same conductive film as the electrode 311a is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrates 351 and 361 are formed using a flexible material, the flexibility of the display device can be increased.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including an LED is preferably used to reduce power consumption.

As the adhesive layer, any of a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

As the connection layer 242, an anisotropic conductive film (ACF), an anisotropic conductive paste (ACP), or the like can be used.

The light-emitting element 170 may be a top emission, bottom emission, or dual emission light-emitting element, or the like. A conductive film that transmits visible light is used as the electrode through which light is extracted. A conductive film that reflects visible light is preferably used as the electrode through which light is not extracted.

The EL layer 192 includes at least a light-emitting layer. In addition to the light-emitting layer, the EL layer 192 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 192, and an inorganic compound may also be included. The layers included in the EL layer 192 can be formed by any of the following methods: an evaporation method (including a vacuum evaporation method), a transfer method, a printing method, an inkjet method, a coating method, and the like.

The EL layer 192 may contain an inorganic compound such as quantum dots. When quantum dots are used for the light-emitting layer, quantum dots can function as light-emitting materials, for example.

With the use of the combination of a color filter (coloring layer) and a microcavity structure (optical adjustment layer), light with high color purity can be extracted from the display device. The thickness of the optical adjustment layer varies depending on the color of the pixel.

As materials for a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is preferably set small enough to be able to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

Examples of an insulating material that can be used for the insulating layers include a resin such as acrylic or epoxy resin, and an inorganic insulating material such as silicon oxide, silicon oxynitride, silicon nitride oxide, silicon nitride, or aluminum oxide.

Examples of a material that can be used for the coloring layers include a metal material, a resin material, and a resin material containing a pigment or dye.

Structure Example 2

Figure 6:
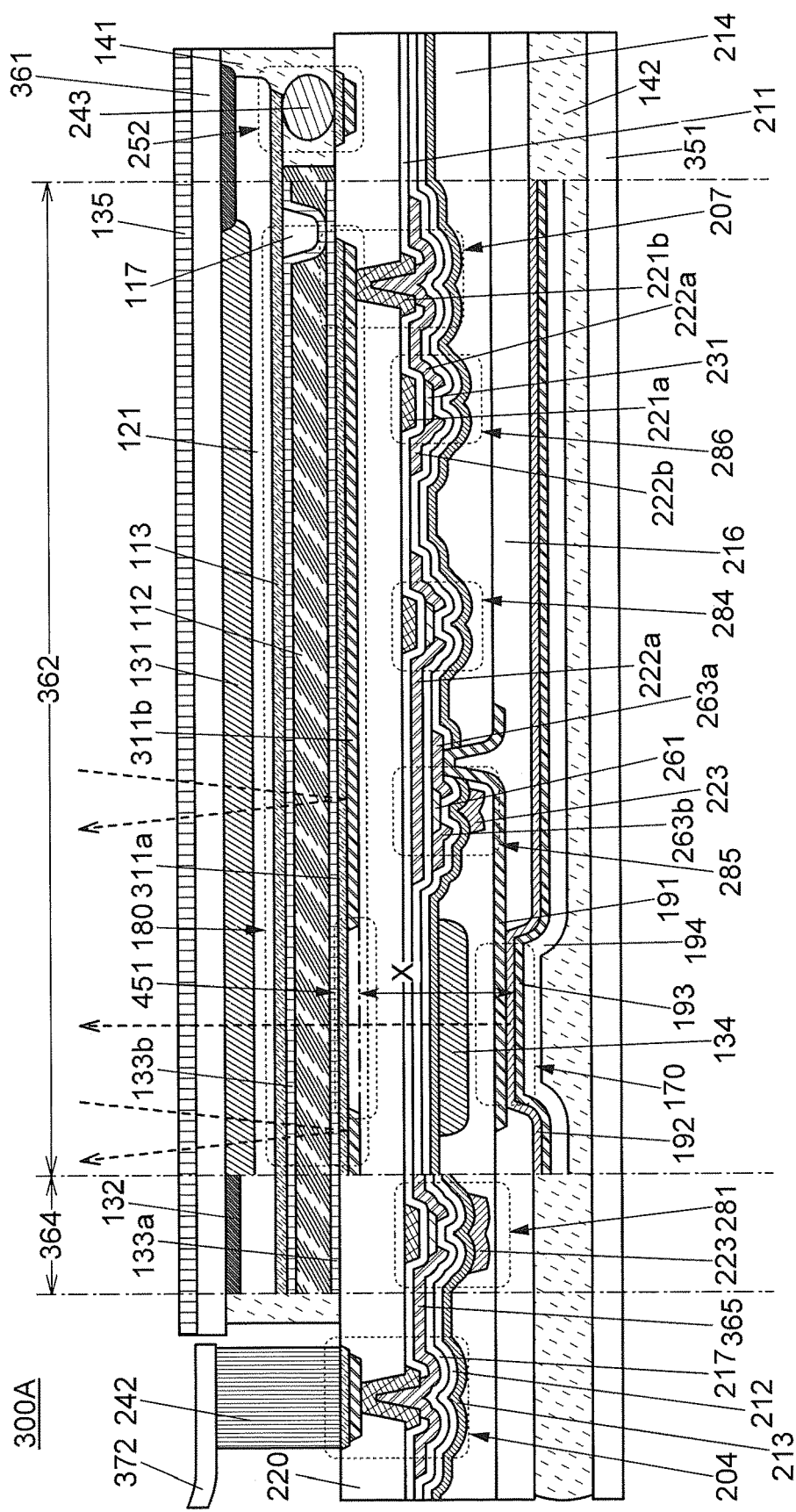
FIG. 6 is a cross-sectional view illustrating an example of a display device.

A display device 300A illustrated in FIG. 6 is different from the display device 300 mainly in that a transistor 281, a transistor 284, a transistor 285, and a transistor 286 are included instead of the transistor 201, the transistor 203, the transistor 205, and the transistor 206.

Note that the positions of the insulating layer 117, the connection portion 207, and the like in FIG. 6 are different from those in FIG. 5. FIG. 6 illustrates an end portion of a pixel. The insulating layer 117 is provided so as to overlap with an end portion of the coloring layer 131 and an end portion of the light-blocking layer 132. As in this structure, the insulating layer 117 may be provided in a region not overlapping with a display region (or in a region overlapping with the light-blocking layer 132).

Two transistors included in the display device may partly overlap with each other like the transistor 284 and the transistor 285. In that case, the area occupied by a pixel circuit can be reduced, leading to an increase in resolution. Furthermore, the light-emitting area of the light-emitting element 170 can be increased, leading to an improvement in aperture ratio. The light-emitting element 170 with a high aperture ratio requires low current density to obtain necessary luminance; thus, the reliability is improved.

Each of the transistors 281, 284, and 286 includes the conductive layer 221a, the insulating layer 211, the semiconductor layer 231, the conductive layer 222a, and the conductive layer 222b. The conductive layer 221a overlaps with the semiconductor layer 231 with the insulating layer 211 positioned therebetween. The conductive layer 222a and the conductive layer 222b are electrically connected to the semiconductor layer 231. The transistor 281 includes the conductive layer 223.

The transistor 285 includes the conductive layer 222a, an insulating layer 217, a semiconductor layer 261, the conductive layer 223, the insulating layer 212, the insulating layer 213, a conductive layer 263a, and a conductive layer 263b. The conductive layer 222a overlaps with the semiconductor layer 261 with the insulating layer 217 positioned therebetween. The conductive layer 223 overlaps with the semiconductor layer 261 with the insulating layers 212 and 213 positioned therebetween. The conductive layer 263a and the conductive layer 263b are electrically connected to the semiconductor layer 261.

The conductive layer 221a functions as a gate. The insulating layer 211 functions as a gate insulating layer. The conductive layer 222a included in the transistor 286 functions as one of a source and a drain. The conductive layer 222b functions as the other of the source and the drain.

The conductive layer 222a shared by the transistor 284 and the transistor 285 has a portion functioning as one of a source and a drain of the transistor 284 and a portion functioning as a gate of the transistor 285. The insulating layer 217, the insulating layer 212, and the insulating layer 213 function as gate insulating layers. One of the conductive layer 263a and the conductive layer 263b functions as a source and the other functions as a drain. The conductive layer 223 functions as a gate.

Structure Example 3

Figure 7A:
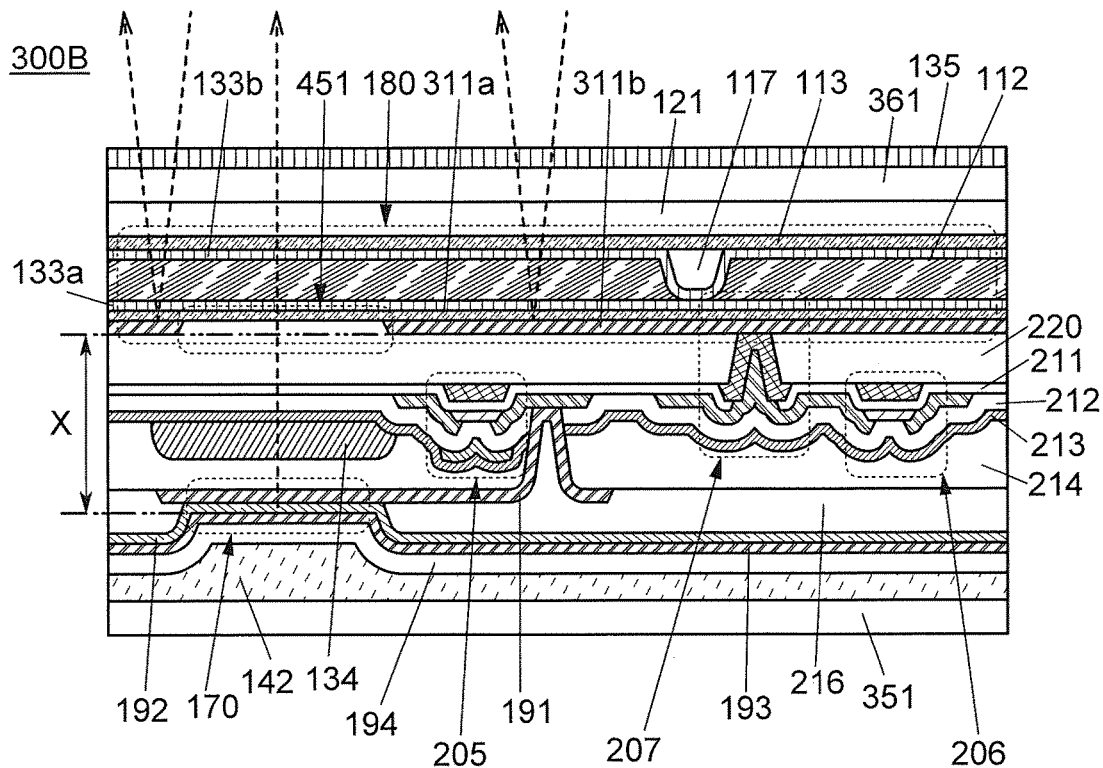
FIGS. 7A and 7B are cross-sectional views each illustrating an example of a display device.

FIG. 7A is a cross-sectional view illustrating a display portion of a display device 300B.

The display device 300B is different from the display device 300 in that the coloring layer 131 is not provided. The transistor 203 is not illustrated in FIG. 7A. Other components are similar to those of the display device 300 and thus are not described in detail.

The liquid crystal element 180 emits white light. Since the coloring layer 131 is not provided, the display device 300B can display a black-and-white image or a grayscale image using the liquid crystal element 180.

Structure Example 4

Figure 7B:
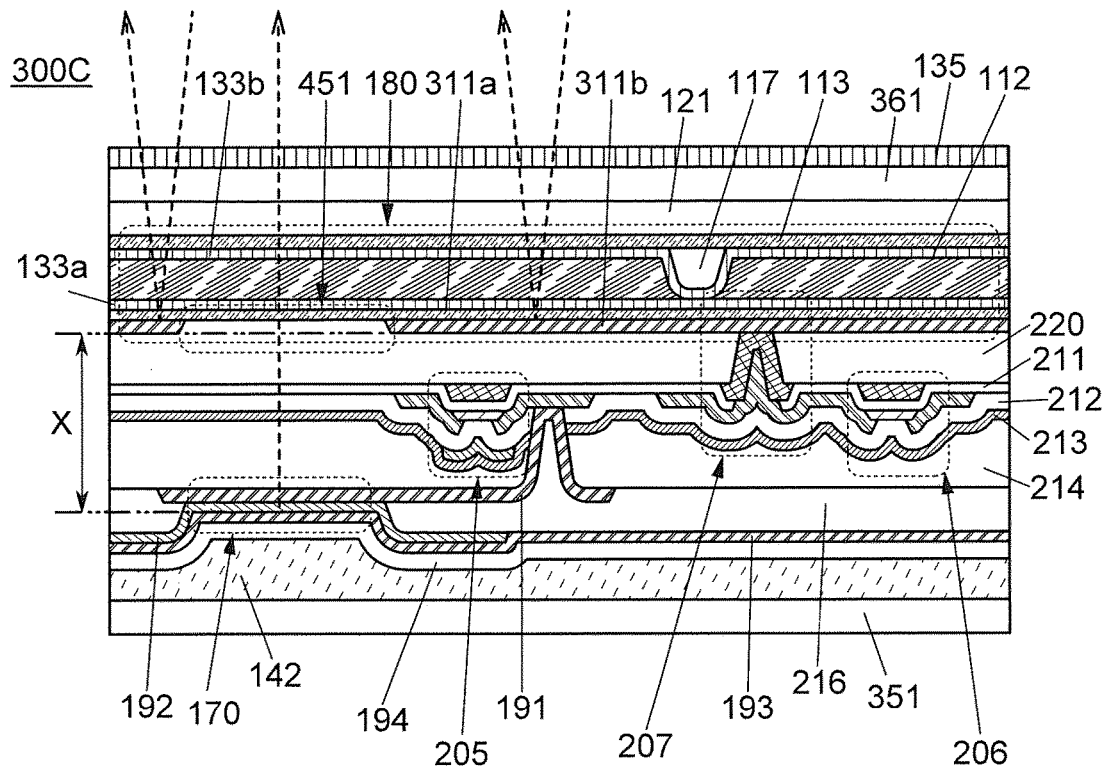

A display device 300C illustrated in FIG. 7B is different from the display device 300B in that the EL layer 192 is separately provided for each color (the EL layer 192 is provided for each light-emitting element 170) and the coloring layer 134 is not provided. Other components are similar to those of the display device 300B and thus are not described in detail.

In the light-emitting element 170 employing a separate coloring method, at least one layer (typified by the light-emitting layer) included in the EL layer 192 is separately provided for each color. All layers included in the EL layer may be separately provided for each color.

There is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

FIGS. 8A to 8E illustrate structure examples of transistors.

Figure 8A:
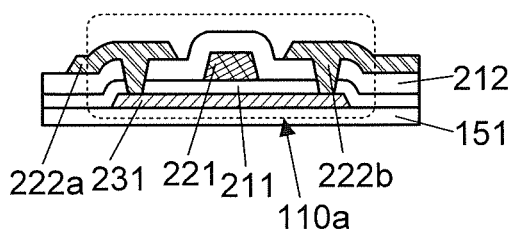
FIGS. 8A to 8E are cross-sectional views illustrating examples of transistors.

A transistor 110a illustrated in FIG. 8A is a top-gate transistor.

The transistor 110a includes a conductive layer 221, the insulating layer 211, the semiconductor layer 231, the insulating layer 212, the conductive layer 222a, and the conductive layer 222b. The semiconductor layer 231 is provided over an insulating layer 151. The conductive layer 221 overlaps with the semiconductor layer 231 with the insulating layer 211 positioned therebetween. The conductive layer 222a and the conductive layer 222b are electrically connected to the semiconductor layer 231 through openings provided in the insulating layer 211 and the insulating layer 212.

The conductive layer 221 functions as a gate. The insulating layer 211 functions as a gate insulating layer. One of the conductive layer 222a and the conductive layer 222b functions as a source and the other functions as a drain.

In the transistor 110a, the conductive layer 221 can be physically distanced from the conductive layer 222a or 222b easily; thus, the parasitic capacitance between the conductive layer 221 and the conductive layer 222a or 222b can be reduced.

Figure 8B:
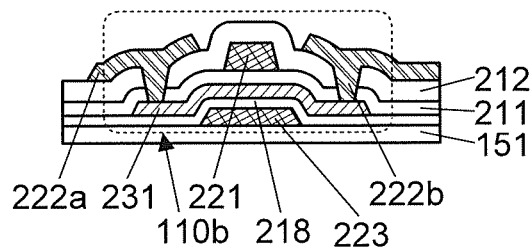

A transistor 110b illustrated in FIG. 8B includes, in addition to the components of the transistor 110a, the conductive layer 223 and an insulating layer 218. The conductive layer 223 is provided over the insulating layer 151. The conductive layer 223 overlaps with the semiconductor layer 231. The insulating layer 218 covers the conductive layer 223 and the insulating layer 151.

The conductive layer 223 functions as one of a pair of gates. Thus, the on-state current of the transistor can be increased and the threshold voltage can be controlled.

Figure 8C:
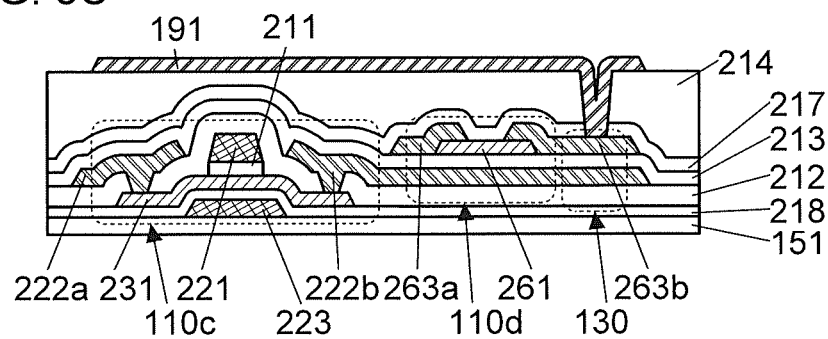
Figure 8D:
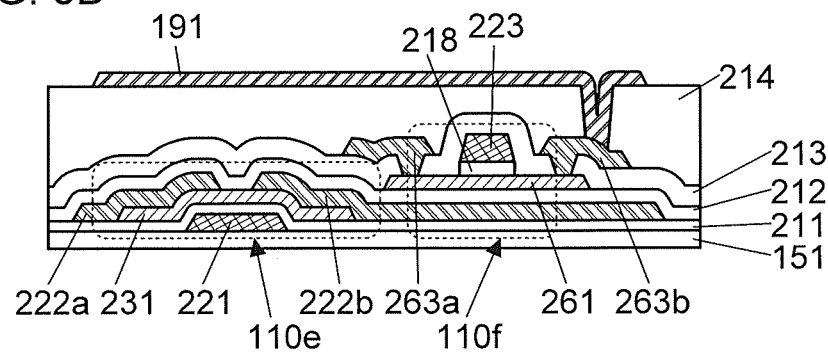
Figure 8E:
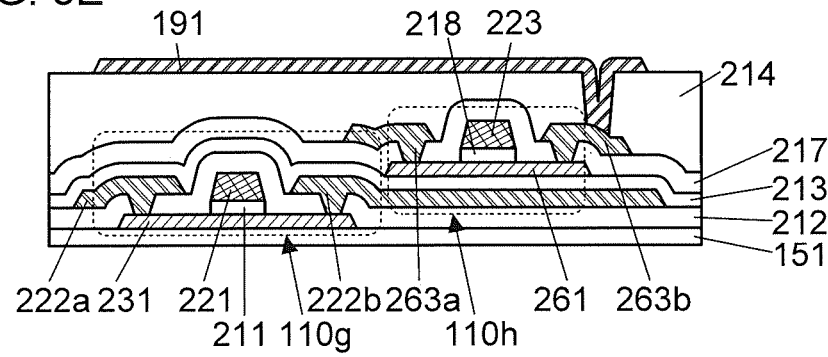

FIGS. 8C to 8E each illustrate an example of a stacked-layer structure of two transistors. The structures of the two stacked transistors can be independently determined, and the combination of the structures is not limited to those illustrated in FIGS. 8C to 8E.

FIG. 8C illustrates a stacked-layer structure of a transistor 110c and a transistor 110d. The transistor 110c includes two gates. The transistor 110d has a bottom-gate structure. Note that the transistor 110c may have a structure including one gate (top-gate structure). The transistor 110d may include two gates.

The transistor 110c includes the conductive layer 223, the insulating layer 218, the semiconductor layer 231, the conductive layer 221, the insulating layer 211, the conductive layer 222a, and the conductive layer 222b. The conductive layer 223 is provided over the insulating layer 151. The conductive layer 223 overlaps with the semiconductor layer 231 with the insulating layer 218 positioned therebetween. The insulating layer 218 covers the conductive layer 223 and the insulating layer 151. The conductive layer 221 overlaps with the semiconductor layer 231 with the insulating layer 211 positioned therebetween. Although FIG. 8C illustrates an example where the insulating layer 211 is provided only in a region overlapping with the conductive layer 221, the insulating layer 211 may be provided so as to cover an end portion of the semiconductor layer 231, as illustrated in FIG. 8B and other drawings. The conductive layer 222a and the conductive layer 222b are electrically connected to the semiconductor layer 231 through openings provided in the insulating layer 212.

The transistor 110d includes the conductive layer 222b, the insulating layer 213, the semiconductor layer 261, the conductive layer 263a, and the conductive layer 263b. The conductive layer 222b includes a region overlapping with the semiconductor layer 261 with the insulating layer 213 positioned therebetween. The insulating layer 213 covers the conductive layer 222b. The conductive layer 263a and the conductive layer 263b are electrically connected to the semiconductor layer 261.

The conductive layer 221 and the conductive layer 223 each function as a gate of the transistor 110c. The insulating layer 218 and the insulating layer 211 each function as a gate insulating layer of the transistor 110c. The conductive layer 222a functions as one of a source and a drain of the transistor 110c.

The conductive layer 222b has a portion functioning as the other of the source and the drain of the transistor 110c and a portion functioning as a gate of the transistor 110d. The insulating layer 213 functions as a gate insulating layer of the transistor 110d. One of the conductive layer 263a and the conductive layer 263b functions as a source of the transistor 110d and the other functions as a drain of the transistor 110d.

The transistor 110c and the transistor 110d are preferably applied to a pixel circuit of the light-emitting element 170. For example, the transistor 110c can be used as a selection transistor and the transistor 110d can be used as a driving transistor.

The conductive layer 263b is electrically connected to the electrode 191 that functions as a pixel electrode of the light-emitting element through an opening provided in the insulating layer 217 and the insulating layer 214.

FIG. 8D illustrates a stacked-layer structure of a transistor 110e and a transistor 110f. The transistor 110e has a bottom-gate structure. The transistor 110f includes two gates. The transistor 110e may include two gates.

The transistor 110e includes the conductive layer 221, the insulating layer 211, the semiconductor layer 231, the conductive layer 222a, and the conductive layer 222b. The conductive layer 221 is provided over the insulating layer 151. The conductive layer 221 overlaps with the semiconductor layer 231 with the insulating layer 211 positioned therebetween. The insulating layer 211 covers the conductive layer 221 and the insulating layer 151. The conductive layer 222a and the conductive layer 222b are electrically connected to the semiconductor layer 231.

The transistor 110f includes the conductive layer 222b, the insulating layer 212, the semiconductor layer 261, the conductive layer 223, the insulating layer 218, the insulating layer 213, the conductive layer 263a, and the conductive layer 263b. The conductive layer 222b includes a region overlapping with the semiconductor layer 261 with the insulating layer 212 positioned therebetween. The insulating layer 212 covers the conductive layer 222b. The conductive layer 263a and the conductive layer 263b are electrically connected to the semiconductor layer 261 through openings provided in the insulating layer 213. The conductive layer 223 overlaps with the semiconductor layer 261 with the insulating layer 218 positioned therebetween. The insulating layer 218 is provided in a region overlapping with the conductive layer 223.

The conductive layer 221 functions as a gate of the transistor 110e. The insulating layer 211 functions as a gate insulating layer of the transistor 110e. The conductive layer 222a functions as one of a source and a drain of the transistor 110e.

The conductive layer 222b has a portion functioning as the other of the source and the drain of the transistor 110e and a portion functioning as a gate of the transistor 110f. The conductive layer 223 functions as another gate of the transistor 110f. The insulating layer 212 and the insulating layer 218 each function as a gate insulating layer of the transistor 110f. One of the conductive layer 263a and the conductive layer 263b functions as a source of the transistor 110f and the other functions as a drain of the transistor 110f.

The conductive layer 263b is electrically connected to the electrode 191 that functions as a pixel electrode of a light-emitting element through an opening provided in the insulating layer 214.

FIG. 8E illustrates a stacked-layer structure of a transistor 110g and a transistor 110h. The transistor 110g has a top-gate structure. The transistor 110h includes two gates. The transistor 110g may include two gates.

The transistor 110g includes the semiconductor layer 231, the conductive layer 221, the insulating layer 211, the conductive layer 222a, and the conductive layer 222b. The semiconductor layer 231 is provided over the insulating layer 151. The conductive layer 221 overlaps with the semiconductor layer 231 with the insulating layer 211 positioned therebetween. The insulating layer 211 overlaps with the conductive layer 221. The conductive layer 222a and the conductive layer 222b are electrically connected to the semiconductor layer 231 through openings provided in the insulating layer 212.

The transistor 110h includes the conductive layer 222b, the insulating layer 213, the semiconductor layer 261, the conductive layer 223, the insulating layer 218, the insulating layer 217, the conductive layer 263a, and the conductive layer 263b. The conductive layer 222b includes a region overlapping with the semiconductor layer 261 with the insulating layer 213 positioned therebetween. The insulating layer 213 covers the conductive layer 222b. The conductive layer 263a and the conductive layer 263b are electrically connected to the semiconductor layer 261 through openings provided in the insulating layer 217. The conductive layer 223 overlaps with the semiconductor layer 261 with the insulating layer 218 positioned therebetween. The insulating layer 218 is provided in a region overlapping with the conductive layer 223.

The conductive layer 221 functions as a gate of the transistor 110g. The insulating layer 211 functions as a gate insulating layer of the transistor 110g. The conductive layer 222a functions as one of a source and a drain of the transistor 110g.

The conductive layer 222b has a portion functioning as the other of the source and the drain of the transistor 110g and a portion functioning as a gate of the transistor 110h. The conductive layer 223 functions as another gate of the transistor 110h. The insulating layer 212 and the insulating layer 218 each function as a gate insulating layer of the transistor 110h. One of the conductive layer 263a and the conductive layer 263b functions as a source of the transistor 110h and the other functions as a drain of the transistor 110h.

The conductive layer 263b is electrically connected to the electrode 191 that functions as a pixel electrode of a light-emitting element through an opening provided in the insulating layer 214.

Hereinafter, the method for manufacturing the display device of this embodiment will be specifically described with reference to FIGS. 9A to 9D, FIGS. 10A to 10C, FIGS. 11A and 11B, and FIGS. 12A and 12B.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

<Example of Manufacturing Method of Display Device>

An example of a manufacturing method of the display device 300 illustrated in FIG. 5 will be described below. The manufacturing method will be described with reference to FIGS. 9A to 9D, FIGS. 10A to 10C, FIGS. 11A and 11B, and FIGS. 12A and 12B, focusing on the display portion 362 of the display device 300. Note that the transistor 203 is not illustrated in FIGS. 9A to 9D, FIGS. 10A to 10C, FIGS. 11A and 11B, and FIGS. 12A and 12B.

Figure 9A:
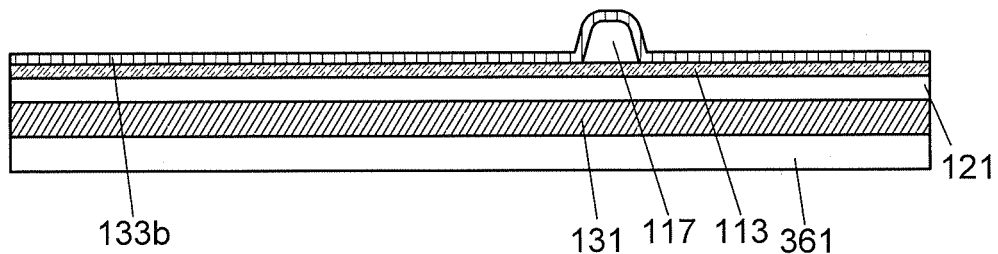
FIGS. 9A to 9D are cross-sectional views illustrating an example of a manufacturing method of a display device.

First, the coloring layer 131 is formed over the substrate 361 (FIG. 9A). The coloring layer 131 is formed using a photosensitive material, in which case the processing into an island shape can be performed by a photolithography method or the like. Note that in the circuit 364 and the like illustrated in FIG. 5, the light-blocking layer 132 is provided over the substrate 361.

Then, the insulating layer 121 is formed over the coloring layer 131 and the light-blocking layer 132.

The insulating layer 121 preferably functions as a planarization layer. A resin such as acrylic or epoxy is suitably used for the insulating layer 121.

An inorganic insulating film may be used for the insulating layer 121. For example, an inorganic insulating film such as a silicon nitride film, a silicon oxynitride film, a silicon oxide film, a silicon nitride oxide film, an aluminum oxide film, or an aluminum nitride film can be used for the insulating layer 121. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

Next, the electrode 113 is formed. The electrode 113 can be formed in the following manner: a conductive film is formed, a resist mask is formed, the conductive film is etched, and the resist mask is removed. The electrode 113 is formed using a conductive material that transmits visible light.

After that, the insulating layer 117 is formed over the electrode 113. An organic insulating film is preferably used for the insulating layer 117.

Subsequently, the alignment film 133b is formed over the electrode 113 and the insulating layer 117 (FIG. 9A). The alignment film 133b can be formed in the following manner: a thin film is formed using a resin or the like, and then, rubbing treatment is performed.

Note that steps illustrated in FIGS. 9B to 9D, FIGS. 10A to 10C, FIGS. 11A and 11B, and FIG. 12A are performed independently of the steps described with reference to FIG. 9A.

Figure 9B:
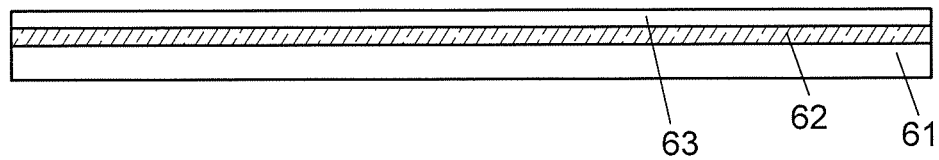

First, a separation layer 62 is formed over a formation substrate 61, and an insulating layer 63 is formed over the separation layer 62 (FIG. 9B).

In this step, a material is selected that would cause separation at the interface between the formation substrate 61 and the separation layer 62, the interface between the separation layer 62 and the insulating layer 63, or in the separation layer 62 when the formation substrate 61 is peeled. In this embodiment, an example in which separation occurs at the interface between the insulating layer 63 and the separation layer 62 is described; however, one embodiment of the present invention is not limited to such an example and depends on a material used for the separation layer 62 or the insulating layer 63.

The formation substrate 61 has stiffness high enough for easy transfer and has resistance to heat applied in the manufacturing process. Examples of a material that can be used for the formation substrate 61 include glass, quartz, ceramics, sapphire, a resin, a semiconductor, a metal, and an alloy. Examples of the glass include alkali-free glass, barium borosilicate glass, and aluminoborosilicate glass.

The separation layer 62 can be formed using an organic material or an inorganic material.

Examples of an inorganic material that can be used for the separation layer 62 include a metal containing an element selected from tungsten, molybdenum, titanium, tantalum, niobium, nickel, cobalt, zirconium, zinc, ruthenium, rhodium, palladium, osmium, iridium, and silicon; an alloy containing any of the above elements; and a compound containing any of the above elements. A crystal structure of a layer containing silicon may be amorphous, microcrystal, or polycrystal.

In the case of using an inorganic material, the thickness of the separation layer 62 is greater than or equal to 1 nm and less than or equal to 1000 nm, preferably greater than or equal to 10 nm and less than or equal to 200 nm, and further preferably greater than or equal to 10 nm and less than or equal to 100 nm.

In the case of using an inorganic material, the separation layer 62 can be formed by a sputtering method, a CVD method, an ALD method, or an evaporation method, for example.

Examples of an organic material that can be used for the separation layer 62 include a polyimide resin, an acrylic resin, an epoxy resin, a polyamide resin, a polyimide-amide resin, a siloxane resin, a benzocyclobutene-based resin, and a phenol resin.

In the case of using an organic material, the thickness of the separation layer 62 is preferably greater than or equal to 0.01 μm and less than 10 μm, further preferably greater than or equal to 0.1 μm and less than or equal to 3 μm, and still further preferably greater than or equal to 0.5 μm and less than or equal to 1 μm. The separation layer 62 whose thickness is within the above range can lead to a reduction in manufacturing cost. The thickness of the separation layer 62 is not necessarily within the above range and may be greater than or equal to 10 μm: for example, greater than or equal to 10 μm and less than or equal to 200 μm.

In the case of using an organic material, the separation layer 62 can be formed by spin coating, dipping, spray coating, ink-jetting, dispensing, screen printing, or offset printing, or with a doctor knife, a slit coater, a roll coater, a curtain coater, or a knife coater, for example.

An inorganic insulating film is preferably formed using the insulating layer 63. For example, an inorganic insulating film such as a silicon nitride film, a silicon oxynitride film, a silicon oxide film, a silicon nitride oxide film, an aluminum oxide film, or an aluminum nitride film can be used for the insulating layer 63. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

For example, a stacked-layer structure of a layer containing a high-melting-point metal material such as tungsten and a layer containing an oxide of the metal material may be used for the separation layer 62, and a stacked-layer structure of a plurality of inorganic insulating films containing silicon nitride, silicon oxynitride, silicon nitride oxide, or the like may be used for the insulating layer 63. When a high-melting-point metal material is used for the separation layer 62, layers formed after the separation layer 62 can be formed at higher temperatures; thus, impurity concentration can be reduced and a highly reliable display device can be fabricated. A step for removing a layer unnecessary for the display device (e.g., the separation layer 62 or the insulating layer 63) may be performed after the peeling. The separation layer 62 or the insulating layer 63 is not necessarily removed and may be used as a component of the display device.

Figure 9C:
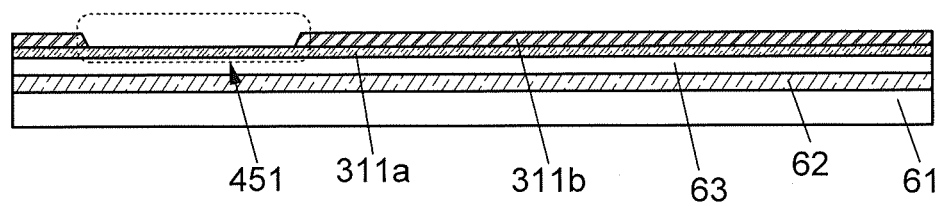

Next, the electrode 311a is formed over the insulating layer 63, and the electrode 311b is formed over the electrode 311a (FIG. 9C). The electrode 311b includes the opening 451 over the electrode 311a. Each of the electrodes 311a and 311b can be formed in the following manner: a conductive film is formed, a resist mask is formed, the conductive film is etched, and the resist mask is removed. The electrode 311a is formed using a conductive material that transmits visible light. The electrode 311b is formed using a conductive material that reflects visible light.

Figure 9D:
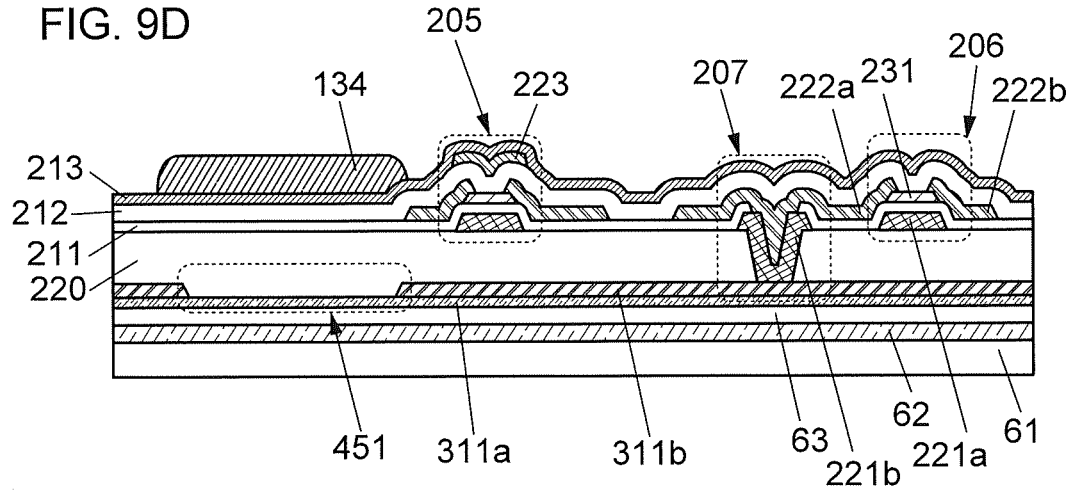

After that, the insulating layer 220 is formed (FIG. 9D). Then, an opening that reaches the electrode 311b is formed in the insulating layer 220.

The insulating layer 220 can be used as a barrier layer that prevents diffusion of impurities contained in the separation layer 62 into the transistor and the display element formed later. In the case of using an organic material for the separation layer 62, the insulating layer 220 preferably prevents diffusion of moisture or the like contained in the separation layer 62 into the transistor and the display element when the separation layer 62 is heated. Thus, the insulating layer 220 preferably has a high barrier property.

The insulating layer 220 can be formed using the inorganic insulating film, the resin, or the like that can be used for the insulating layer 121.

Next, the transistor 205 and the transistor 206 are formed over the insulating layer 220.

There is no particular limitation on a semiconductor material used for the semiconductor layer of the transistor, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

Described here is the case where a bottom-gate transistor including an oxide semiconductor layer as the semiconductor layer 231 is fabricated as the transistor 206. The transistor 205 includes the conductive layer 223 and the insulating layer 212 in addition to the components of the transistor 206, and has two gates.

An oxide semiconductor is preferably used for the semiconductor layer of the transistor. The use of a semiconductor material having a wider band gap and a lower carrier density than silicon can reduce off-state current of the transistor.

Specifically, first, the conductive layer 221a and the conductive layer 221b are formed over the insulating layer 220. The conductive layer 221a and the conductive layer 221b can be formed in the following manner: a conductive film is formed, a resist mask is formed, the conductive film is etched, and the resist mask is removed. At this time, the conductive layer 221*b* and the electrode 311*b* are connected to each other through an opening in the insulating layer 220.

Next, the insulating layer 211 is formed.

For the insulating layer 221, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

An inorganic insulating film is preferably formed at high temperatures because the film can have higher density and a higher barrier property as the deposition temperature becomes higher. The substrate temperature during the deposition of the inorganic insulating film is preferably higher than or equal to room temperature (25° C.) and lower than or equal to 350° C., and further preferably higher than or equal to 100° C. and lower than or equal to 300° C.

Then, the semiconductor layer 231 is formed. In this embodiment, an oxide semiconductor layer is formed as the semiconductor layer 231. The oxide semiconductor layer can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the time of forming the oxide semiconductor film. To fabricate a transistor having high field-effect mobility, however, the percentage of oxygen flow rate (partial pressure of oxygen) at the time of forming the oxide semiconductor film is preferably higher than or equal to 0% and lower than or equal to 30%, further preferably higher than or equal to 5% and lower than or equal to 30%, and still further preferably higher than or equal to 7% and lower than or equal to 15%.

The oxide semiconductor film preferably contains at least indium or zinc. It is particularly preferable to contain indium and zinc.

The energy gap of the oxide semiconductor is preferably 2 eV or more, further preferably 2.5 eV or more, and still further preferably 3 eV or more. The use of such an oxide semiconductor having a wide energy gap leads to a reduction in off-state current of a transistor.

The oxide semiconductor film can be formed by a sputtering method. Alternatively, a PLD method, a PECVD method, a thermal CVD method, an ALD method, a vacuum evaporation method, or the like may be used.

Note that an example of an oxide semiconductor will be described in Embodiment 5.

Next, the conductive layer 222*a* and the conductive layer 222*b* are formed. The conductive layer 222*a* and the conductive layer 222*b* can be formed in the following manner: a conductive film is formed, a resist mask is formed, the conductive film is etched, and the resist mask is removed.

Each of the conductive layers 222*a* and 222*b* is connected to the semiconductor layer 231. Here, the conductive layer 222*a* included in the transistor 206 is electrically connected to the conductive layer 221*b*. As a result, the electrode 311*b* and the conductive layer 222*a* can be electrically connected to each other at the connection portion 207.

Note that during the processing of the conductive layer 222*a* and the conductive layer 222*b*, the semiconductor layer 231 might be partly etched to be thin in a region not covered by the resist mask.

In the above manner, the transistor 206 can be fabricated (FIG. 9D). In the transistor 206, part of the conductive layer 221*a* functions as a gate, part of the insulating layer 211 functions as a gate insulating layer, and the conductive layer 222*a* and the conductive layer 222*b* function as a source and a drain.

Next, the insulating layer 212 that covers the transistor 206 is formed, and the conductive layer 223 is formed over the insulating layer 212.

The insulating layer 212 can be formed in a manner similar to that of the insulating layer 211.

The conductive layer 223 included in the transistor 205 can be formed in the following manner: a conductive film is formed, a resist mask is formed, the conductive film is etched, and the resist mask is removed.

In the above manner, the transistor 205 can be fabricated (FIG. 9D). In the transistor 205, part of the conductive layer 221*a* and part of the conductive layer 223 function as gates, part of the insulating layer 211 and part of the insulating layer 212 function as gate insulating layers, and the conductive layer 222*a* and the conductive layer 222*b* function as a source and a drain.

Next, the insulating layer 213 is formed (FIG. 9D). The insulating layer 213 can be formed in a manner similar to that of the insulating layer 211.

It is preferable to use an oxide insulating film formed in an atmosphere containing oxygen, such as a silicon oxide film or a silicon oxynitride film, for the insulating layer 212. An insulating film with low oxygen diffusibility and oxygen permeability, such as a silicon nitride film, is preferably stacked as the insulating layer 213 over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer. As a result, oxygen vacancies in the oxide semiconductor layer can be filled and defects at the interface between the oxide semiconductor layer and the insulating layer 212 can be repaired, leading to a reduction in defect levels. Accordingly, an extremely highly reliable display device can be fabricated.

Figure 10A:
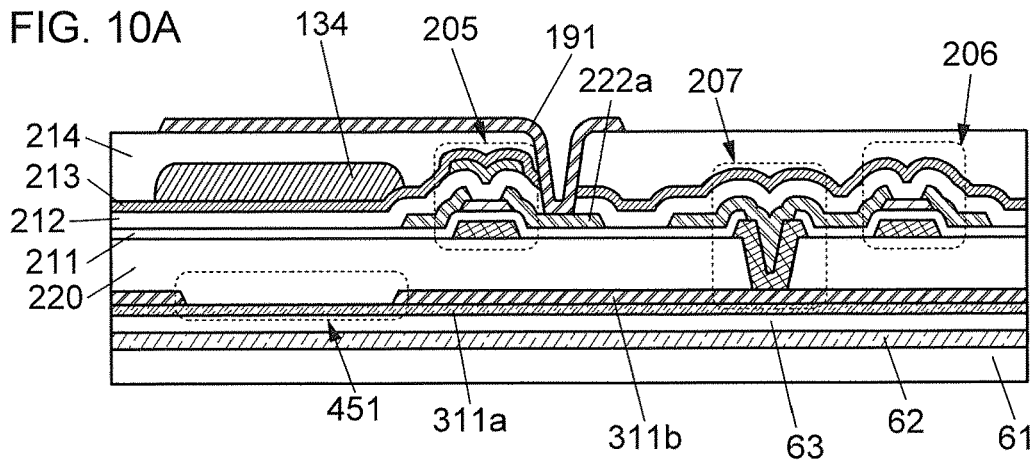
FIGS. 10A to 10C are cross-sectional views illustrating an example of a manufacturing method of a display device.

Next, the coloring layer 134 is formed over the insulating layer 213 (FIG. 9D), and then, the insulating layer 214 is formed (FIG. 10A). The coloring layer 134 is positioned so as to overlap with the opening 451 in the electrode 311*b*.

The coloring layer 134 can be formed in a manner similar to that of the coloring layer 131. The display element is formed on the insulating layer 214 in a later step; thus, the insulating layer 214 preferably functions as a planarization layer. For the insulating layer 214, the description of the resin or the inorganic insulating film that can be used for the insulating layer 121 can be referred to.

After that, an opening that reaches the conductive layer 222a included in the transistor 205 is formed in the insulating layer 212, the insulating layer 213, and the insulating layer 214.

Subsequently, the electrode 191 is formed (FIG. 10A). The electrode 191 can be formed in the following manner: a conductive film is formed, a resist mask is formed, the conductive film is etched, and the resist mask is removed. Here, the conductive layer 222a included in the transistor 205 and the electrode 191 are connected to each other. The electrode 191 is formed using a conductive material that transmits visible light.

Figure 10B:
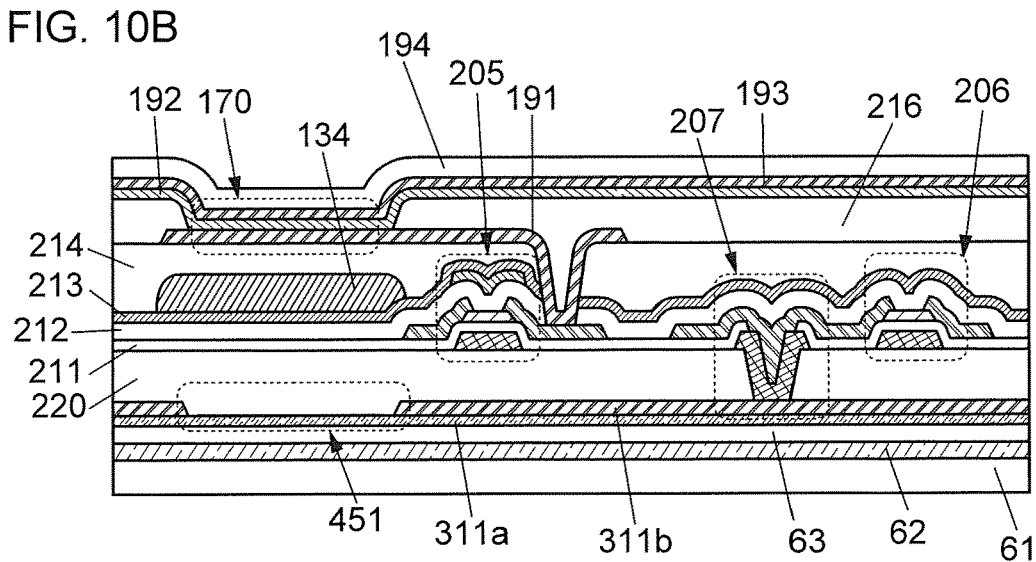

Then, the insulating layer 216 that covers the end portion of the electrode 191 is formed (FIG. 10B). For the insulating layer 216, the description of the resin or the inorganic insulating film that can be used for the insulating layer 121 can be referred to. The insulating layer 216 includes an opening in a region overlapping with the electrode 191.

Next, the EL layer 192 and the electrode 193 are formed (FIG. 10B). Part of the electrode 193 functions as the common electrode of the light-emitting element 170. The electrode 193 is formed using a conductive material that reflects visible light.

The EL layer 192 can be formed by an evaporation method, a coating method, a printing method, a discharge method, or the like. In the case where the EL layer 192 is formed for each individual pixel, an evaporation method using a shadow mask such as a metal mask, an ink-jet method, or the like can be used. In the case of sharing the EL layer 192 by some pixels, an evaporation method not using a metal mask can be used.

Either a low molecular compound or a high molecular compound can be used for the EL layer 192, and an inorganic compound may also be included.

Steps after the formation of the EL layer 192 are performed such that temperatures higher than the heat resistant temperature of the EL layer 192 are not applied to the EL layer 192. The electrode 193 can be formed by an evaporation method, a sputtering method, or the like.

In the above manner, the light-emitting element 170 can be formed (FIG. 10B). In the light-emitting element 170, the electrode 191 part of which functions as the pixel electrode, the EL layer 192, and the electrode 193 part of which functions as the common electrode are stacked. The light-emitting element 170 is formed such that the light-emitting region overlaps with the coloring layer 134 and the opening 451 in the electrode 311b.

Although an example where a bottom-emission light-emitting element is formed as the light-emitting element 170 is described here, one embodiment of the present invention is not limited thereto.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

Next, the insulating layer 194 is formed so as to cover the electrode 193 (FIG. 10B). The insulating layer 194 functions as a protective layer that prevents diffusion of impurities such as water into the light-emitting element 170. The light-emitting element 170 is sealed with the insulating layer 194. After the electrode 193 is formed, the insulating layer 194 is preferably formed without exposure to the air.

The inorganic insulating film that can be used for the insulating layer 121 can be used for the insulating layer 194, for example. It is particularly preferable that the insulating layer 194 include an inorganic insulating film with a high barrier property. A stack including an inorganic insulating film and an organic insulating film can also be used.

The insulating layer 194 is preferably formed at substrate temperature lower than or equal to the heat resistant temperature of the EL layer 192. The insulating layer 194 can be formed by an ALD method, a sputtering method, or the like. An ALD method and a sputtering method are preferable because a film can be formed at low temperatures. An ALD method is preferable because the coverage of the insulating layer 194 is improved.

Figure 10C:
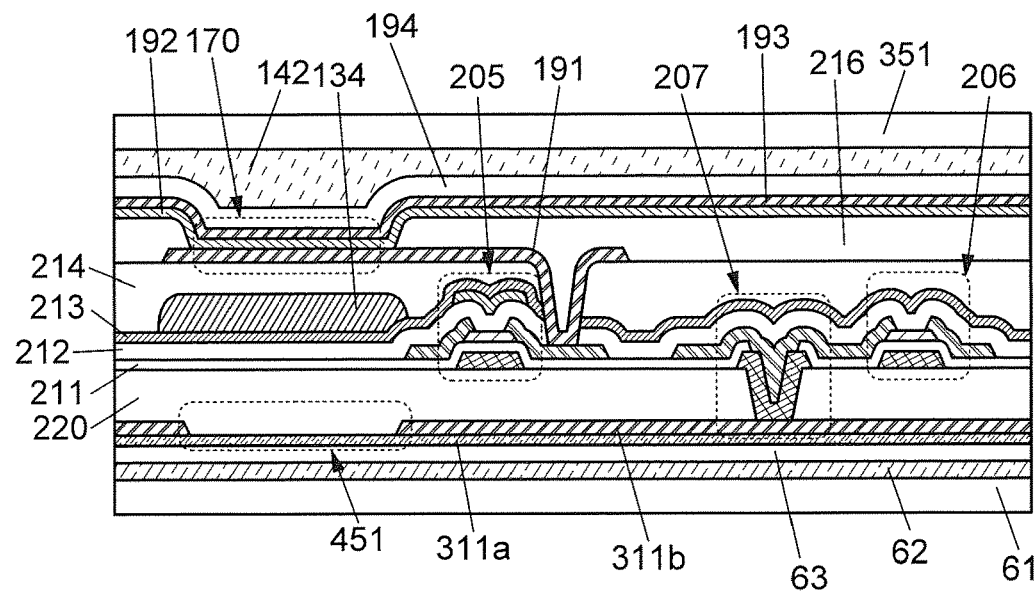

Then, the substrate 351 is bonded to a surface of the insulating layer 194 with the adhesive layer 142 (FIG. 10C).

As the adhesive layer 142, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 351, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Any of a variety of materials such as glass, quartz, a resin, a metal, an alloy, and a semiconductor can be used for the substrate 351. The substrate 351 formed using any of a variety of materials such as glass, quartz, a resin, a metal, an alloy, and a semiconductor may be thin enough to be flexible.

Figure 11A:
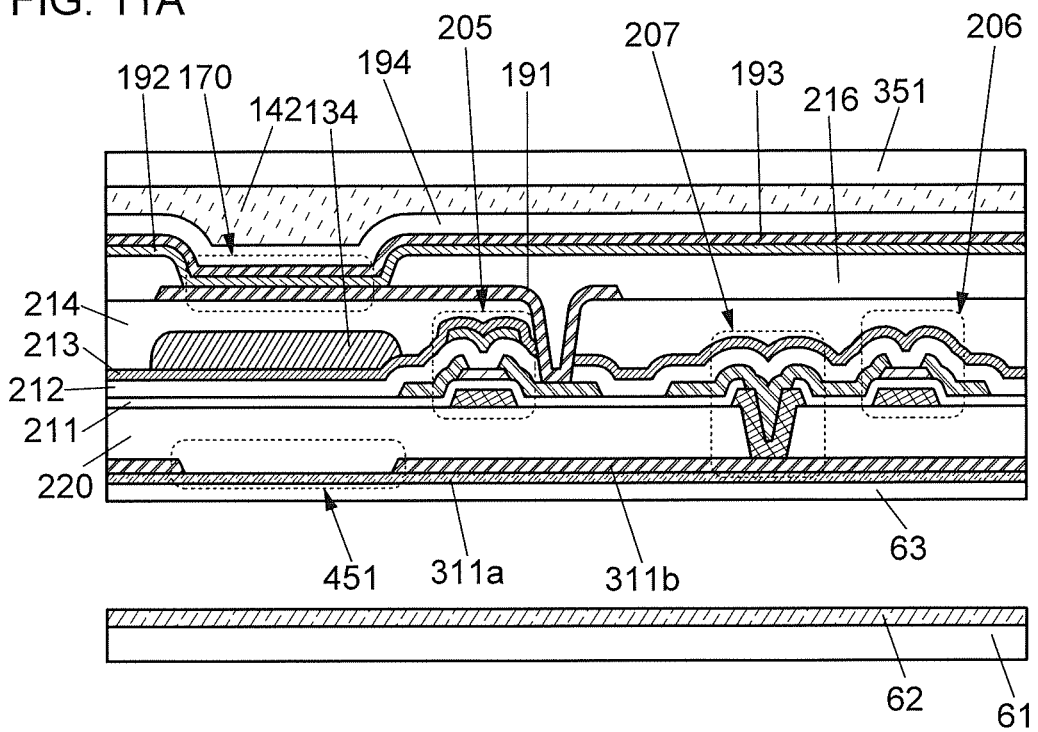
FIGS. 11A and 11B are cross-sectional views illustrating an example of a manufacturing method of a display device.

After that, the formation substrate 61 is peeled (FIG. 11A).

The position of the separation surface depends on the materials, the formation methods, and the like of the insulating layer 63, the separation layer 62, the formation substrate 61, and the like.

FIG. 11A illustrates an example where the separation occurs at the interface between the separation layer 62 and the insulating layer 63. By the separation, the insulating layer 63 is exposed.

Before the separation, a separation trigger may be formed in the separation layer 62. For example, part of or the entire separation layer 62 may be irradiated with laser light, in which case the separation layer 62 can be embrittled or the adhesion between the separation layer 62 and the insulating layer 63 (or the formation substrate 61) can be reduced.

The formation substrate 61 can be peeled by applying a perpendicular tensile force to the separation layer 62, for example. Specifically, the formation substrate 61 can be peeled by pulling up the substrate 351 by part of its suction-attached top surface.

The separation trigger may be formed by inserting a sharp instrument such as a knife between the separation layer 62 and the insulating layer 63 (or the formation substrate 61). Alternatively, the separation trigger may be formed by cutting the separation layer 62 from the substrate 351 side with a sharp instrument.

Figure 11B:
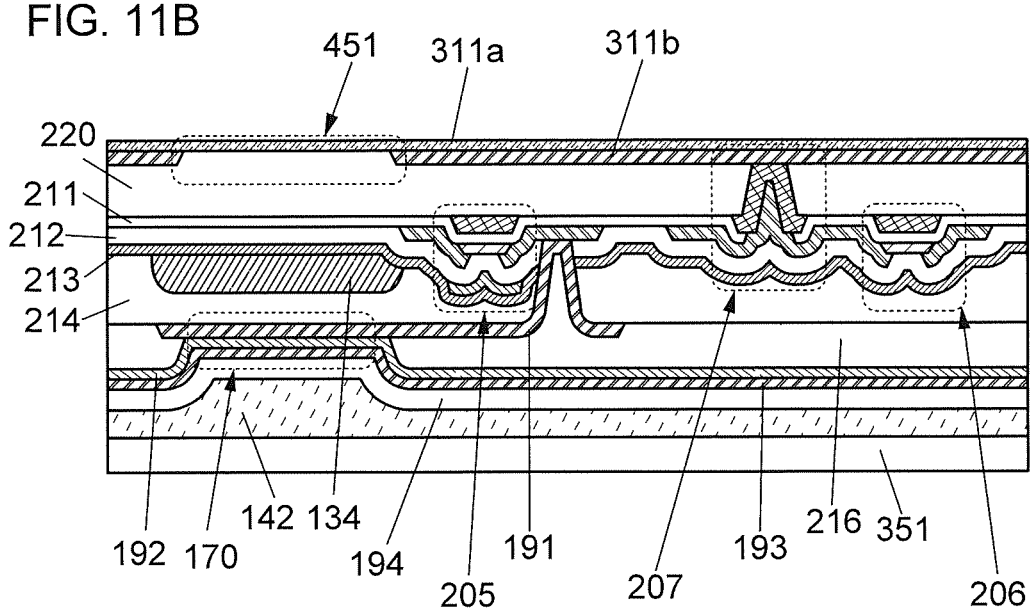

Next, the insulating layer 63 is removed. The insulating layer 63 can be removed by a dry etching method, for example. Accordingly, the electrode 311a is exposed (FIG. 11B).

Figure 12A:
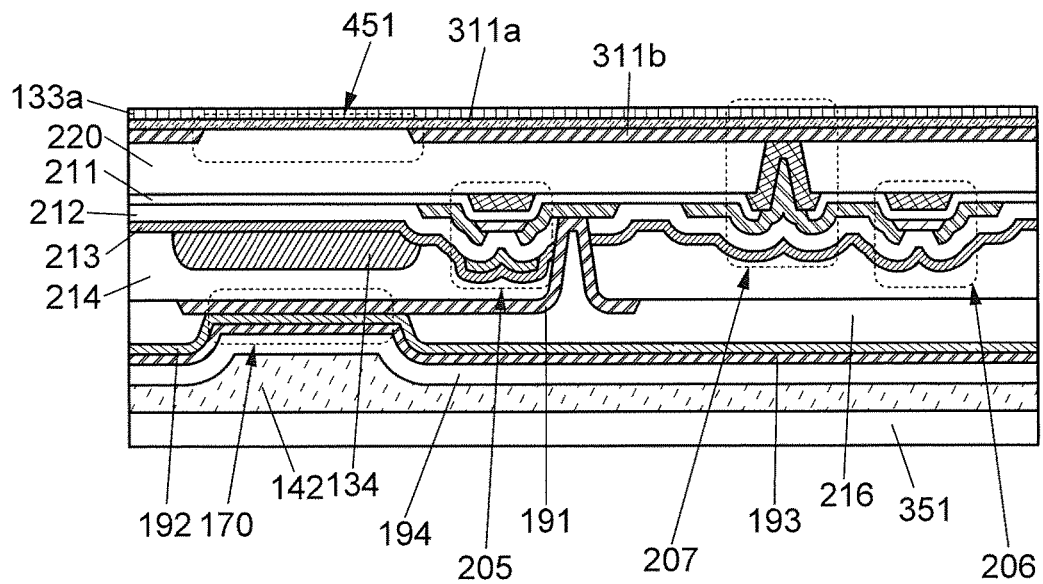
FIGS. 12A and 12B are cross-sectional views illustrating an example of a manufacturing method of a display device.

Subsequently, the alignment film 133a is formed on the exposed surface of the electrode 311a (FIG. 12A). The alignment film 133a can be formed in the following manner: a thin film is formed using a resin or the like, and then, rubbing treatment is performed.

Figure 12B:
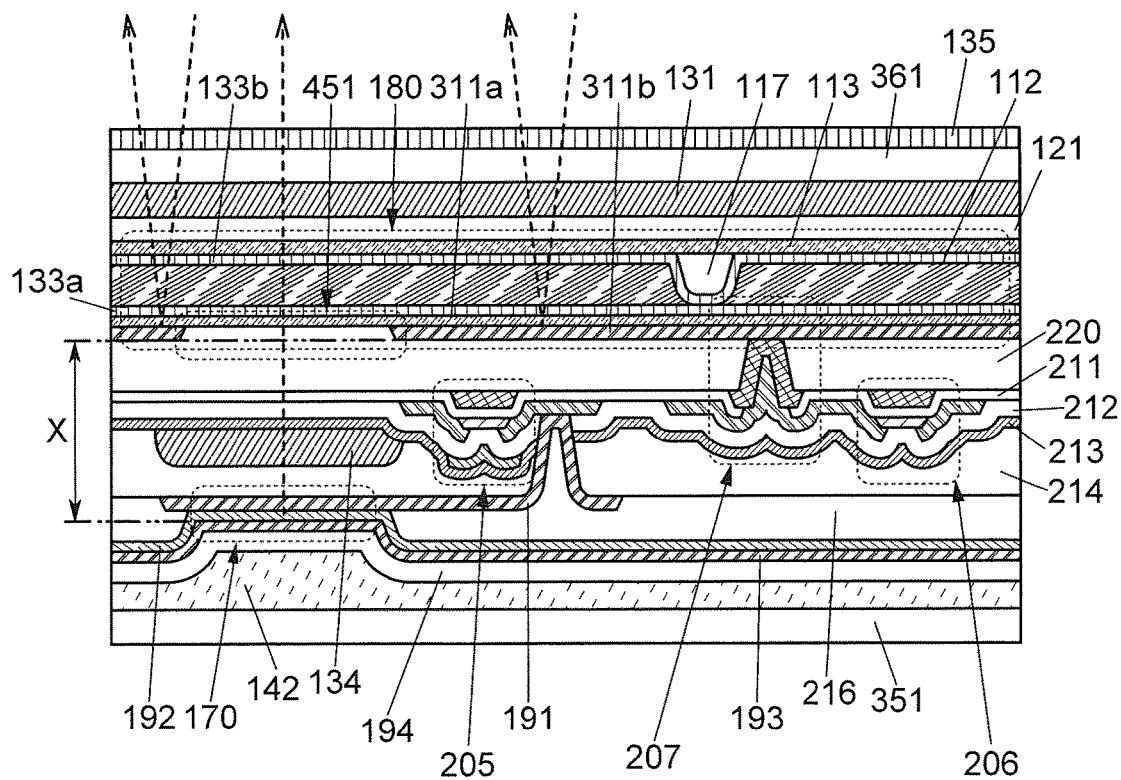

Then, the substrate 361 obtained from the steps described using FIG. 9A and the substrate 351 obtained from the steps up to the step illustrated in FIG. 12A are bonded to each other with the liquid crystal layer 112 provided therebetween (FIG. 12B). Although not illustrated in FIG. 12B, the substrate 351 and the substrate 361 are bonded to each other with the adhesive layer 141 as illustrated in FIG. 5 and other drawings. For materials of the adhesive layer 141, the description of the materials that can be used for the adhesive layer 142 can be referred to.

In the liquid crystal element 180 illustrated in FIG. 12B, the electrode 311a (and the electrode 311b) part of which functions as the pixel electrode, the liquid crystal layer 112, and the electrode 113 part of which functions as the common electrode are stacked. The liquid crystal element 180 is formed so as to overlap with the coloring layer 131.

Through the above steps, the display device 300 can be fabricated. Note that the polarizing plate 135 is placed on the outer surface of the substrate 361. Furthermore, the FPC 372 is connected to the display device via the connection layer 242, as illustrated in FIG. 5 and other drawings.

The display device of this embodiment includes two types of display elements as described above; thus, switching between a plurality of display modes is possible. Accordingly, the display device can have high visibility regardless of the ambient brightness, leading to high convenience.

In the display device of this embodiment, the distance between the layer included in the first display element that has a function of reflecting visible light and the second display element can be shortened; thus, high viewing angle characteristics of the display device and a high aperture ratio of the first display element can be both achieved. In addition, the total aperture ratio of the first display element and the second display element can be increased.

This embodiment can be combined with any other embodiment as appropriate. In the case where a plurality of structure examples are described in one embodiment in this specification, some of the structure examples can be combined as appropriate.

Embodiment 2

In this embodiment, the display device of one embodiment of the present invention will be described with reference to FIG. 1, FIG. 4, FIGS. 13A and 13B, FIG. 14, FIGS. 15A and 15B, FIG. 16, FIG. 17, and FIGS. 18A and 18B.

As in Embodiment 1, a display device including a first display element that reflects visible light and a second display element that emits visible light will be described in this embodiment.

First, the display device 10 illustrated in FIG. 1 is described as an example.

The display device of this embodiment has a wide viewing angle; thus, even when the display device is seen from an oblique direction, contrast is less likely to be reduced and chromaticity is less likely to change. Thus, high visibility can be obtained not only in the case of seeing the display device from the front, but also in the case of seeing the display device from an oblique direction. For example, even when a plurality of viewers see the display device of this embodiment from various angles at the same time, information displayed on the display device can be recognized by the viewers. The display device of this embodiment is suitable for display portions of portable electronic devices, display portions of personal electronic devices, and large display portions of television devices, digital signage (electronic signboards), public information displays (PIDs), and the like.

Specifically, when a viewer sees the display device of this embodiment from a direction inclined by 85° from a direction perpendicular to the display surface of the display device, the viewer can see 10% or more of the area of the light-emitting region of the light-emitting element 170. When a viewer can see 10% or more of the area of the light-emitting region of the light-emitting element 170, information displayed on the display device can be recognized enough. The area of the light-emitting region of the light-emitting element 170 that can be seen from the direction inclined by 85° is preferably as large as possible because information displayed on the display device can be easily recognized.

When a viewer sees the display device of this embodiment from a direction inclined by 30° from the direction perpendicular to the display surface of the display device, the viewer can see 100% of the area of the light-emitting region of the light-emitting element 170. In that case, the luminance of an image that a viewer sees is equivalent to that in the case of seeing from the direction perpendicular to the display surface ($\theta=0°$). This means that an image can be seen with the same quality even when a user sees the display device from the direction slightly inclined with respect to the display surface.

As described above, a viewer can recognize information displayed on the display device of this embodiment from an extremely wide range of viewing position.

Next, examples of conditions of the display device for obtaining such a structure will be described.

Figure 13A:
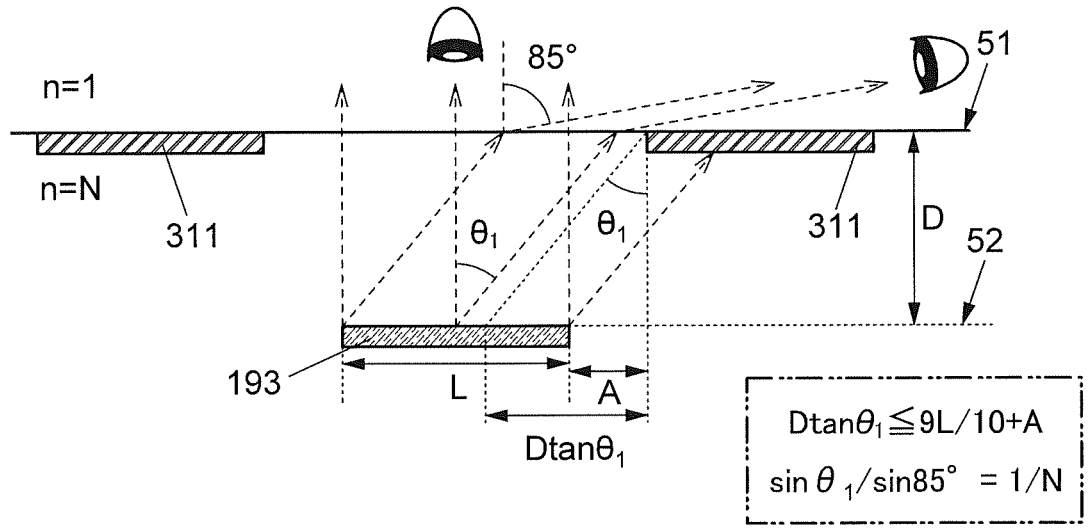
FIGS. 13A and 13B are cross-sectional views each illustrating a positional relationship between an electrode included in a liquid crystal element and an electrode included in a light-emitting element.
Figure 13B:
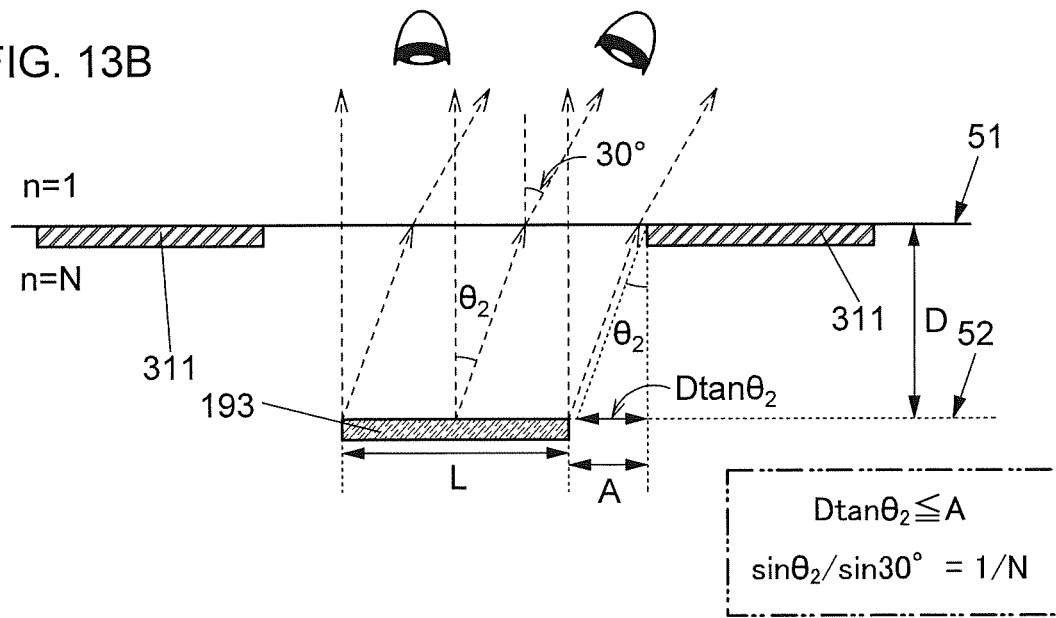

FIG. 13A illustrates light emission from the light-emitting element 170 that can be seen by a viewer from the direction perpendicular to the display surface ($\theta=0°$) and light emission that can be seen from a direction inclined by 85° from the direction perpendicular to the display surface ($\theta=85°$). FIG. 13B illustrates light emission from the light-emitting element 170 that can be seen by a viewer from the direction perpendicular to the display surface ($\theta=0°$) and light emission that can be seen from a direction inclined by 30° from the direction perpendicular to the display surface ($\theta=30°$). FIGS. 13A and 13B illustrate only the electrode 193 of the light-emitting element 170 for easy description.

The description below is made using a first plane 51 including a plane of the electrode 311 on the viewer's side in the display region of the liquid crystal element 180 and a second plane 52 including a plane of the electrode 193 on the viewer's side in the display region (also referred to as a light-emitting region) of the light-emitting element 170. Note that the electrode 311 is a layer having a function of reflecting visible light, which is included in the liquid crystal element 180. The electrode 193 is a layer having a function of reflecting visible light, which is included in the light-emitting element 170. The electrode 193 can reflect light emitted from the EL layer 192. Thus, a distance D, which will be described later, can be determined with reference to the electrode 193. Note that the display region of the display element is a region contributing to displaying an image in the display element.

The description below is made on the assumption that there is no layer that blocks light emission from the light-emitting element on a side closer to a viewer than the electrode 311. It is also assumed that total reflection of light emission from the light-emitting element does not occur on the side closer to a viewer than the electrode 311. Accordingly, a viewer can see all of light that is emitted from the light-emitting element and is extracted through an opening in the electrode 311.

In FIGS. 13A and 13B, a length A represents the length between the end portion of the electrode 311 and the foot of the perpendicular drawn from the end portion of the electrode 193 (or from an end portion of the display region of the light-emitting element 170) to the first plane 51. The length A is greater than or equal to 0. The distance D represents the shortest distance between the first plane 51 and the second plane 52. A refractive index N represents the refractive index between the first plane 51 and the second plane 52 in a region overlapping with the opening in the electrode 311. The refractive index N is greater than or equal to 1. The refractive index of the outside of the display device is 1. A length L represents the width of the electrode 193. The length L can also be referred to as the width of the display region of the light-emitting element 170. Each of an angle $\theta_1$ and an angle $\theta_2$ represents an angle formed by a perpendicular from the second plane 52 to the first plane 51 and incident light from the light-emitting element 170 to the first plane 51.

In the case of seeing the display device from the direction where $\theta$ is 0°, a viewer sees light that is emitted perpendicular to the display surface from the light-emitting element, as illustrated in FIG. 13A. Furthermore, in the case of seeing the display device from the direction where $\theta$ is 85°, a viewer sees light that enters the first plane 51 at the angle $\theta_1$ from the light-emitting element.

As illustrated in FIG. 13A, when the display device is seen from the direction inclined from the direction perpendicular to the display surface, the light-emitting region of the light-emitting element 170 is partially blocked from view by the electrode 311, in some cases. When light emitted from the light-emitting element 170 is partially blocked by the electrode 311, the luminance of an image that a viewer sees is lower than that in the case of seeing from the direction perpendicular to the display surface.

The display device of this embodiment preferably satisfies Formula (1) and Formula (2).

[Formulae 4]

$$D\tan\theta_1 \leq \frac{9}{10}L + A \quad (1)$$

$$\frac{\sin\theta_1}{\sin 85°} = \frac{1}{N} \quad (2)$$

If Formula (1) and Formula (2) are satisfied, a viewer can see 10% or more of the area of the light-emitting region of the light-emitting element 170 when seeing from the direction where $\theta$ is 85°. Thus, information displayed on the display device can be recognized even when the display device is seen from the direction greatly inclined with respect to the display device.

FIG. 13A illustrates an example where $D \tan\theta_1 = 9L/10 + A$ is satisfied and a viewer can see 50% or more of the area of the light-emitting region of the light-emitting element 170 from the direction where $\theta$ is 85°.

In the case of seeing from the direction where $\theta$ is 0°, a viewer sees light that is emitted perpendicular to the display surface from the light-emitting element, as illustrated in FIG. 13B. Furthermore, in the case of seeing from the direction where $\theta$ is 30°, a viewer sees light that enters the first plane 51 at the angle $\theta_2$ from the light-emitting element.

The display device of this embodiment preferably satisfies Formula (3) and Formula (4).

[Formulae 5]

$$D\tan\theta_2 \leq A \quad (3)$$

$$\frac{\sin\theta_2}{\sin 30°} = \frac{1}{N} \quad (4)$$

If Formula (3) and Formula (4) are satisfied, a viewer can see 100% of the area of the light-emitting region of the light-emitting element 170 when seeing from the direction where $\theta$ is 30°. Thus, an image can be seen with the same quality even when a user sees the display device from a direction slightly inclined with respect to the display surface.

FIG. 13B illustrates an example where $D \tan \theta_2 < A$ is satisfied.

Note that layers on a side closer to a viewer than the electrode 311 in FIG. 1 (e.g., the substrate 361 and the electrode 113) are not illustrated in FIGS. 13A and 13B.

Figure 14:
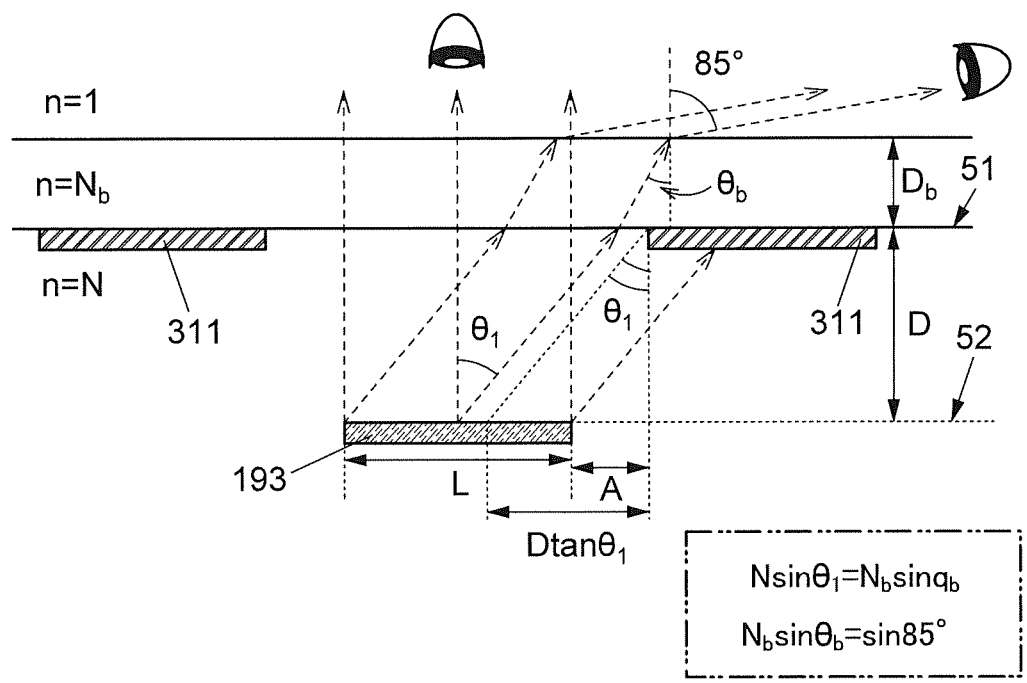
FIG. 14 is a cross-sectional view illustrating a positional relationship between an electrode included in a liquid crystal element and an electrode included in a light-emitting element.

In FIG. 14, the description is made on the assumption that a single layer having a refractive index $N_b$ and a thickness $D_b$ is on a side closer to a viewer than the electrode 311.

In the case of seeing from the direction where $\theta$ is 0°, a viewer sees light that is emitted perpendicular to the display surface from the light-emitting element, as illustrated in FIG. 14. Furthermore, in the case of seeing from the direction where $\theta$ is 85°, a viewer sees light that enters the first plane 51 at the angle $\theta_1$ from the light-emitting element.

Since $N \sin \theta_1 = N_b \sin \theta_b$ and $N_b \sin \theta_1 = \sin 85°$ are satisfied in accordance with the law of refraction (also referred to as Snell's law), $N \sin \theta_1 = \sin 85°$ is satisfied.

As described above, the refractive index $N_b$ and the thickness $D_b$ of the layer on a side closer to a viewer than the electrode 311 do not affect the relationship between the direction from which the viewer sees and the angle $\theta_1$. This means that there is no difference in the area of the light-emitting region of the light-emitting element 170 seen by a viewer, between the case of assuming a layer on a side closer to the viewer than the electrode 311 and the case of assuming no such a layer. For this reason, layers on a side closer to a viewer than the electrode 311 are not illustrated in FIGS. 13A and 13B.

In Formula (2) and Formula (4), the refractive index between the first plane 51 and the second plane 52 in the region overlapping with the opening in the electrode 311 is represented by N. In the case where there is a layer having a single-layer structure between the first plane 51 and the second plane 52 in the region overlapping with the opening in the electrode 311, the refractive index of the layer can be represented by N.

In FIG. 1, in contrast, the insulating layer 220 and the insulating layer 214 are provided between the first plane 51 and the second plane 52 in the region overlapping with the opening in the electrode 311. In the case where there is a stacked-layer structure between the first plane 51 and the second plane 52 in the region overlapping with the opening in the electrode 311 as in FIG. 1, the refractive index N can be obtained using the refractive indices and the thicknesses of layers included in the stacked-layer structure.

Figure 15A:
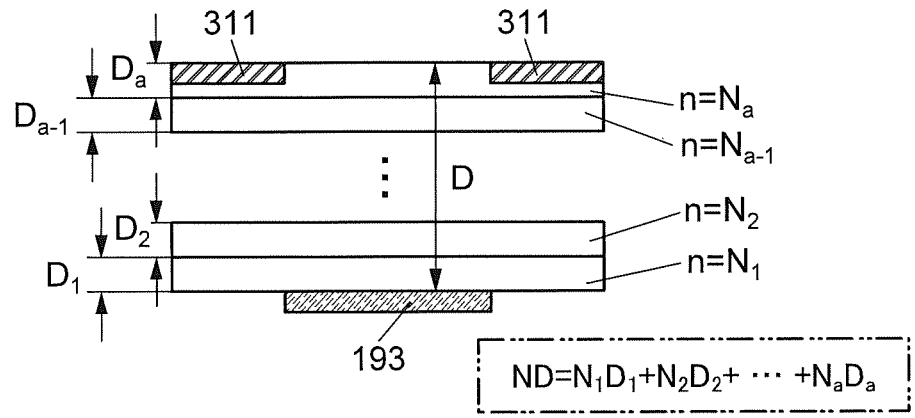
FIGS. 15A and 15B are cross-sectional views each illustrating a positional relationship between an electrode included in a liquid crystal element and an electrode included in a light-emitting element.

FIG. 15A illustrates an example where a stacked-layer structure of a layers (a is an integer greater than or equal to 2) is provided between the first plane 51 and the second plane 52 in the region overlapping with the opening in the electrode 311. In FIG. 15A, the layer closest to the electrode 193 is illustrated as a first layer and the layer closest to the electrode 311 is illustrated as an a-th layer; the order may be reversed. The sum of thicknesses $D_x$ (x is an integer greater than or equal to 1 and less than or equal to a) of the layers corresponds to the distance D. The sum of the products of a refractive index $N_x$ and the thickness $D_x$ of an x-th layer in all layers corresponds to the product of the refractive index N and the distance D. Thus, the refractive index N satisfies Formula (5).

[Formula 6]

$$N = \frac{\sum_{x=1}^{a} N_x D_x}{D} \quad (5)$$

Note that the refractive index N is not necessarily obtained from Formula (5).

Formula (5) indicates that a thick layer greatly affects the value of the refractive index N. Thus, the value of the refractive index of the thickest layer in the stacked-layer structure may be used as the refractive index N. In many cases, an organic insulating film is formed thicker than an inorganic insulating film, for example. Accordingly, the value of the refractive index of a layer formed using an organic insulating film in the stacked-layer structure of a layers may be used as the refractive index N.

A display device having a wide viewing angle can be fabricated also in the case where Formulae (6) to (9) described below are satisfied.

Hereinafter, an example where a layer with a refractive index $N_1$ and a thickness $D_1$ and a layer with a refractive index $N_2$ and a thickness $D_2$ are provided between the first plane 51 and the second plane 52 in the region overlapping with the opening in the electrode 311 is described. Note that in the case where the refractive index $N_1$ and the refractive index $N_2$ are different from each other, light emitted from the light-emitting element is refracted at the interface between the two layers.

Figure 15B:
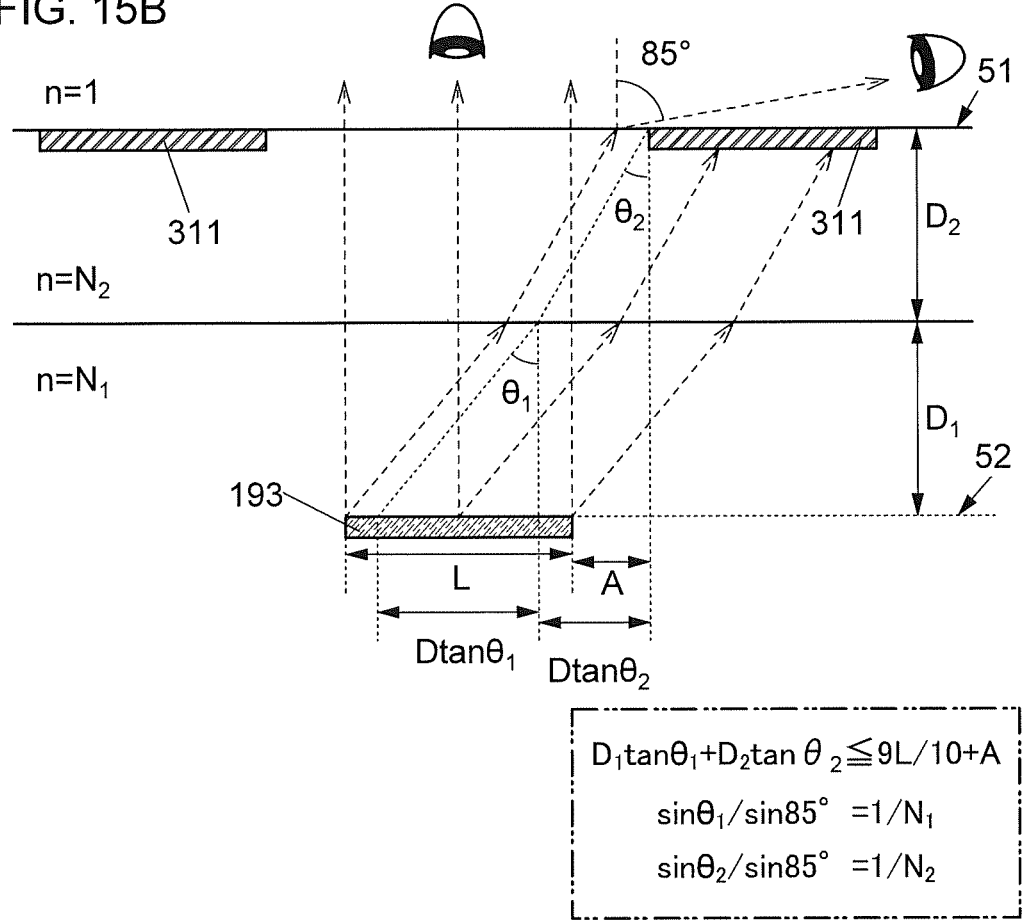

FIG. 15B illustrates light emission from the light-emitting element 170 that can be seen by a viewer from the direction perpendicular to the display surface (θ=0°) and light emission that can be seen from the direction inclined by 85° from the direction perpendicular to the display surface (θ=85°). FIG. 15B illustrates only the electrode 193 of the light-emitting element 170 for easy description.

In FIG. 15B, the length A represents the length between the end portion of the electrode 311 and the foot of the perpendicular drawn from the end portion of the electrode 193 (or from the end portion of the display region of the light-emitting element 170) to the first plane 51. The length A is greater than or equal to 0. The refractive index of the outside of the display device is 1. The length L represents the width of the electrode 193. The length L can also be referred to as the width of the display region of the light-emitting element 170. The angle $θ_1$ represents an angle formed by the perpendicular from the second plane 52 to the first plane 51 and incident light from the light-emitting element 170 to the layer with the refractive index $N_2$. The angle $θ_2$ represents an angle formed by the perpendicular from the second plane 52 to the first plane 51 and incident light from the light-emitting element 170 to the first plane 51.

In the case of seeing the display device from the direction where θ is 0°, a viewer sees light that is emitted perpendicular to the display surface from the light-emitting element, as illustrated in FIG. 15B. Furthermore, in the case of seeing the display device from the direction where θ is 85°, a viewer sees light that enters the first plane 51 at the angle $θ_2$ from the light-emitting element.

As illustrated in FIG. 15B, when the display device is seen from the direction inclined from the direction perpendicular to the display surface, the light-emitting region of the light-emitting element 170 is partially blocked from view by the electrode 311, in some cases. When light emitted from the light-emitting element 170 is partially blocked by the electrode 311, the luminance of an image that a viewer sees is lower than that in the case of seeing from the direction perpendicular to the display surface.

The display device illustrated in FIG. 15B preferably satisfies Formula (6A), Formula (7A), and Formula (8A).

[Formulae 7]

$$D_1 \tan θ_1 + D_2 \tan θ_2 \leq \frac{9}{10} L + A \quad (6A)$$

$$\frac{\sin θ_1}{\sin 85°} = \frac{1}{N_1} \quad (7A)$$

$$\frac{\sin θ_2}{\sin 85°} = \frac{1}{N_2} \quad (8A)$$

If Formula (6A), Formula (7A), and Formula (8A) are satisfied, a viewer can see 10% or more of the area of the light-emitting region of the light-emitting element 170 when seeing from the direction where θ is 85°. Thus, information displayed on the display device can be recognized even when the display device is seen from the direction greatly inclined with respect to the display device.

FIG. 15B illustrates an example where $D_1 \tan θ_1 + D_2 \tan θ_2 = L/2 + A$ is satisfied and a viewer can see 10% or more and less than 50% of the area of the light-emitting region of the light-emitting element 170 from the direction where θ is 85°.

Accordingly, in the case where the display device of this embodiment includes the stacked-layer structure of a layers between the first plane 51 and the second plane 52 in the region overlapping with the opening in the electrode 311, it is preferable to satisfy Formula (6) and Formula (7).

[Formulae 8]

$$\sum_{x=1}^{a} D_x \tan θ_x \leq \frac{9}{10} L + A \quad (6)$$

$$\frac{\sin θ_x}{\sin 85°} = \frac{1}{N_x} \quad (7)$$

In Formula (6) and Formula (7), a is an integer greater than or equal to 2, x is an integer greater than or equal to 1 and less than or equal to a, $D_x$ represents the thickness of the x-th layer in the stacked-layer structure, $N_x$ representing the refractive index of the x-th layer in the stacked-layer structure is greater than or equal to 1, and $θ_x$ represents an angle formed by the perpendicular from the second plane 52 to the first plane 51 and refracted light of light emitted by the light-emitting element 170 from an (x−1)-th layer to the x-th layer.

If Formula (6) and Formula (7) are satisfied, a viewer can see 10% or more of the area of the light-emitting region of the light-emitting element 170 when seeing from the direction where θ is 85°. Thus, information displayed on the display device can be recognized even when the display device is seen from the direction greatly inclined with respect to the display device.

In the case where the display device of this embodiment includes the stacked-layer structure of a layers between the first plane 51 and the second plane 52 in the region overlapping with the opening in the electrode 311, it is also preferable to satisfy Formula (8) and Formula (9).

[Formulae 9]

$$\sum_{y=1}^{a} D_y \tan\theta_y \leq A \quad (8)$$

$$\frac{\sin\theta_y}{\sin 30°} = \frac{1}{N_y} \quad (9)$$

In Formula (8) and Formula (9), a is an integer greater than or equal to 2, y is an integer greater than or equal to 1 and less than or equal to a, $D_y$ represents the thickness of a y-th layer in the stacked-layer structure, $N_y$ representing the refractive index of the y-th layer in the stacked-layer structure is greater than or equal to 1, and $\theta_y$ represents an angle formed by the perpendicular from the second plane 52 to the first plane 51 and refracted light of light emitted by the light-emitting element 170 from an (y−1)-th layer to the y-th layer.

If Formula (8) and Formula (9) are satisfied, a viewer can see 100% of the area of the light-emitting region of the light-emitting element 170 when seeing from the direction where θ is 30°. Thus, an image can be seen with the same quality even when a user sees the display device from a direction slightly inclined with respect to the display surface.

As described above, the display device of this embodiment has a wide viewing angle; thus, even when the display device is seen from an oblique direction, contrast is less likely to be reduced and chromaticity is less likely to change. Thus, high visibility can be obtained not only in the case of seeing the display device from the front, but also in the case of seeing the display device from an oblique direction.

Next, structure examples of the display device of this embodiment will be described with reference to FIG. 4, FIG. 16, FIG. 17, and FIGS. 18A and 18B.

FIG. 4 is a schematic perspective view of the display device of this embodiment. The details of the display device 300 illustrated in FIG. 4 are described in Embodiment 1 and are thus omitted here.

Figure 16:
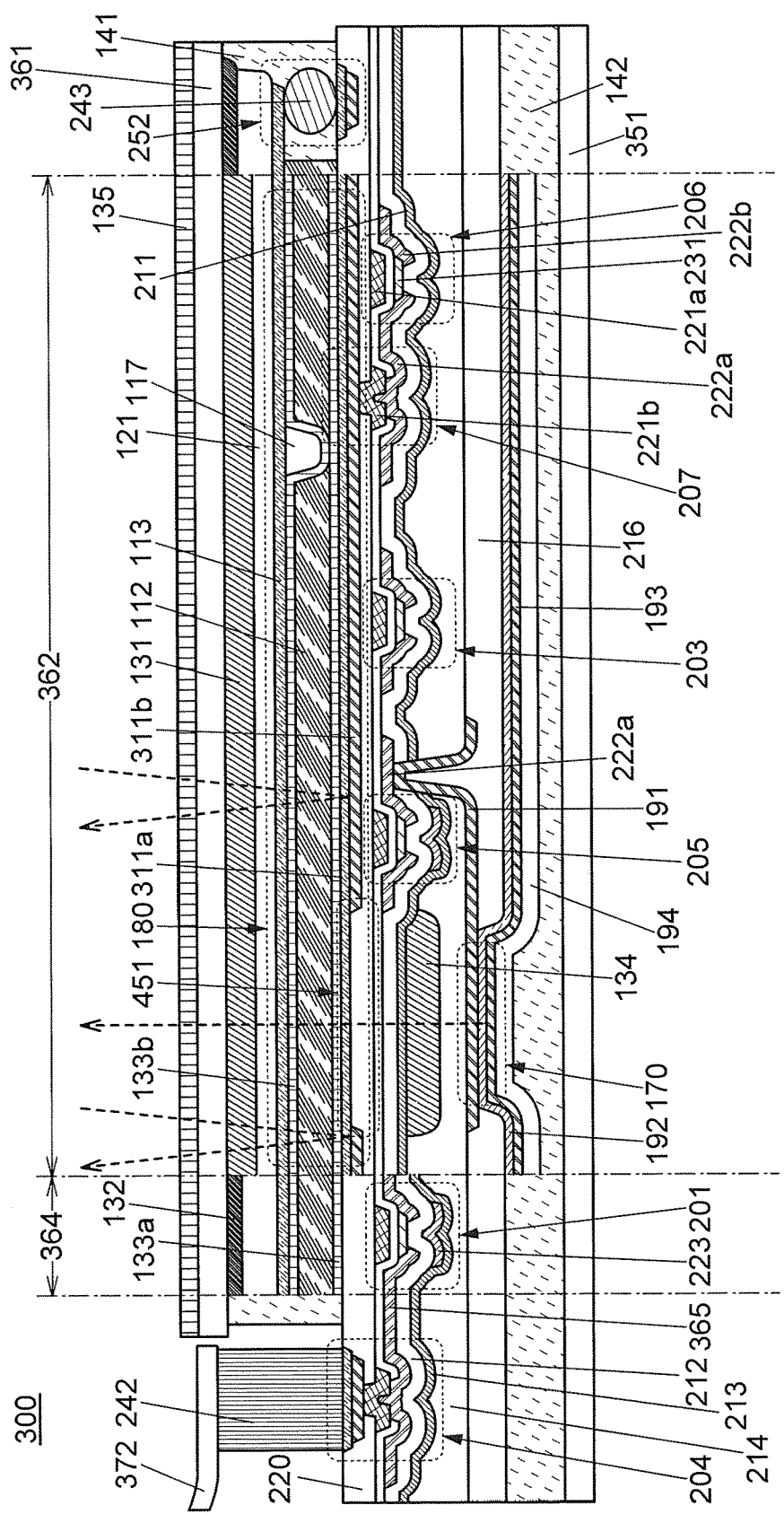
FIG. 16 is a cross-sectional view illustrating an example of a display device.

FIG. 16 illustrates an example of cross-sections of part of a region including the FPC 372, part of a region including the circuit 364, and part of a region including the display portion 362 of the display device 300 illustrated in FIG. 4.

In the display device 300 illustrated in FIG. 16, the width of the opening 451 is larger and the thickness of the insulating layer 220 is smaller than those in the display device 300 illustrated in FIG. 5. The display device 300 illustrated in FIG. 16 has a wider viewing angle than the display device 300 illustrated in FIG. 5; thus, a reduction in contrast and a change in chromaticity are less likely to occur even when the display device is seen from an oblique direction.

Figure 17:
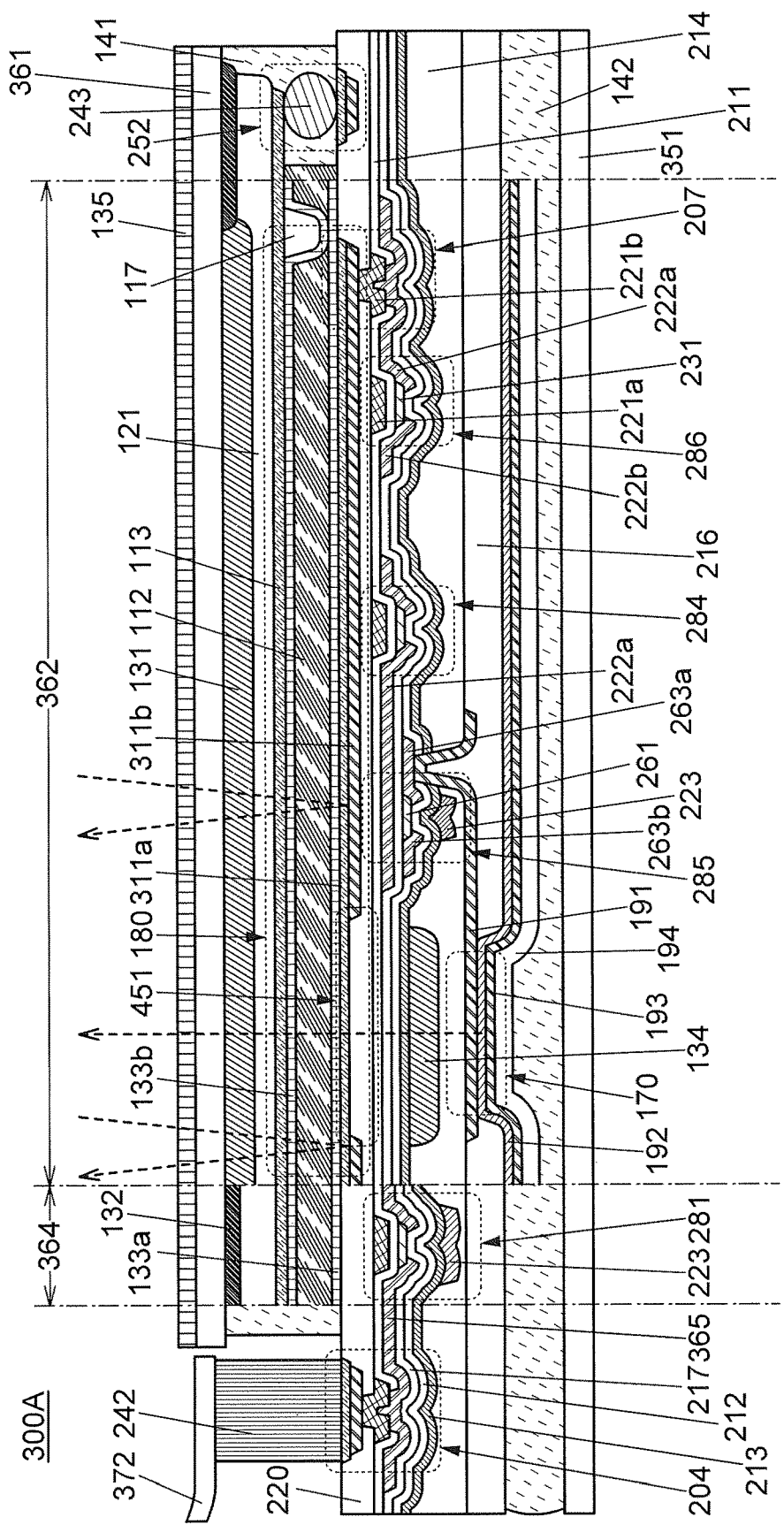
FIG. 17 is a cross-sectional view illustrating an example of a display device.
Figure 18A:
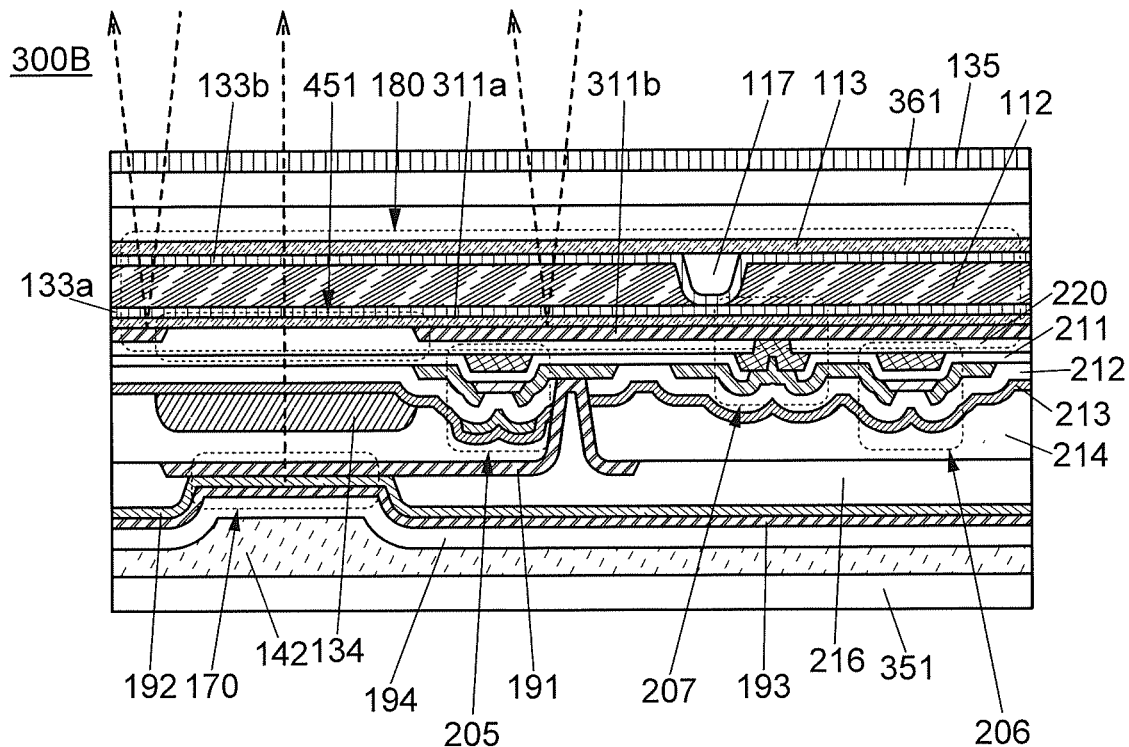
FIGS. 18A and 18B are cross-sectional views each illustrating an example of a display device.
Figure 18B:
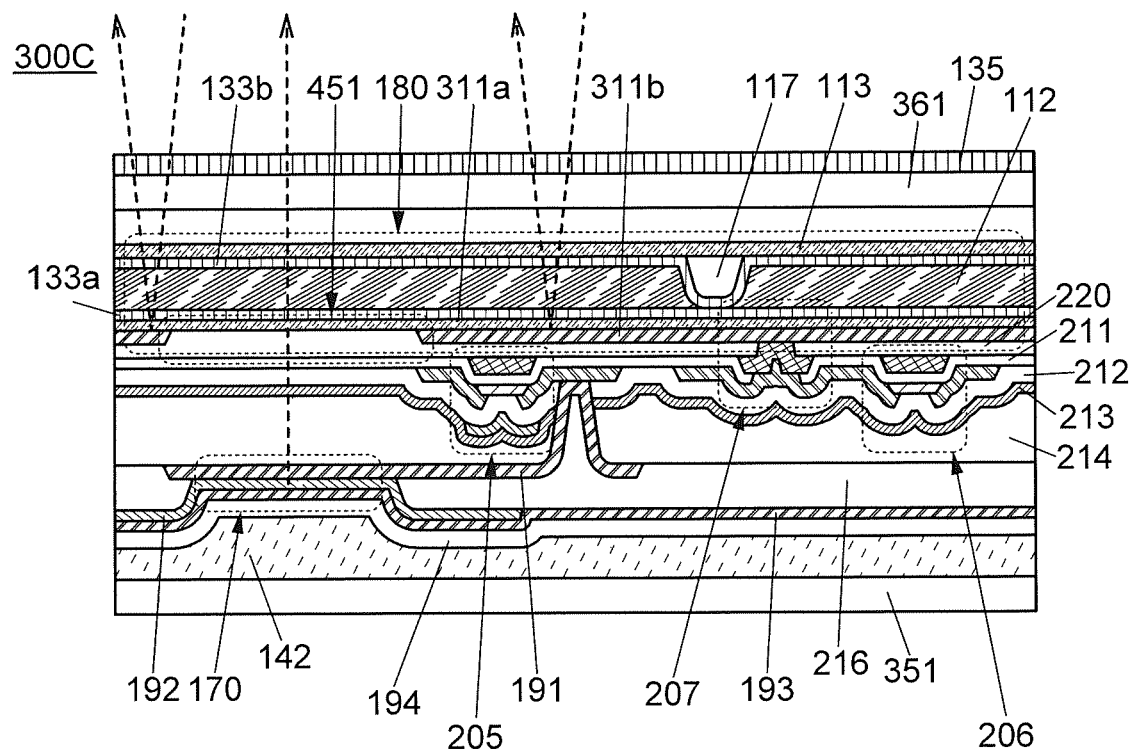

FIG. 17 is a cross-sectional view of the display device 300A. FIG. 18A is a cross-sectional view of the display device 300B. FIG. 18B is a cross-sectional view of the display device 300C.

In the display device 300A illustrated in FIG. 17, the width of the opening 451 is larger and the thickness of the insulating layer 220 is smaller than those in the display device 300A illustrated in FIG. 6. The same applies to the comparison between the display device 300B illustrated in FIG. 18A and the display device 300B illustrated in FIG. 7A and to the comparison between the display device 300C illustrated in FIG. 18B and the display device 300C illustrated in FIG. 7B.

Like in the display device illustrated in FIG. 16, each of the display devices illustrated in FIG. 17 and FIGS. 18A and 18B has a wide viewing angle; thus, a reduction in contrast and a change in chromaticity are less likely to occur even when the display device is seen from an oblique direction.

The display device of this embodiment can be fabricated by a method described as an example in Embodiment 1.

The display device of this embodiment includes two types of display elements as described above; thus, switching between a plurality of display modes is possible. Accordingly, the display device can have high visibility regardless of the ambient brightness, leading to high convenience.

The display device of this embodiment has a wide viewing angle; thus, even when the display device is seen from an oblique direction, contrast is less likely to be reduced and chromaticity is less likely to change. Thus, information displayed on the display device can be recognized even when the display device is seen from the direction greatly inclined with respect to the display device.

This embodiment can be combined with any other embodiment as appropriate.

Embodiment 3

In this embodiment, the display device of one embodiment of the present invention will be described with reference to FIG. 19, FIGS. 20A to 20C, FIGS. 21A to 21C, and FIGS. 22A to 22C.

The display device of this embodiment includes a plurality of first pixels including first display elements and a plurality of second pixels including second display elements. The first pixels and the second pixels are preferably arranged in matrices.

Each of the first pixels and the second pixels can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

The display device of this embodiment can display a full-color image using either the first pixels or the second pixels. Alternatively, the display device of this embodiment can display a black-and-white image or a grayscale image using the first pixels and can display a full-color image using the second pixels. The first pixels that can be used for displaying a black-and-white image or a grayscale image is suitable for displaying information that need not be displayed in color such as text information.

Figure 19:
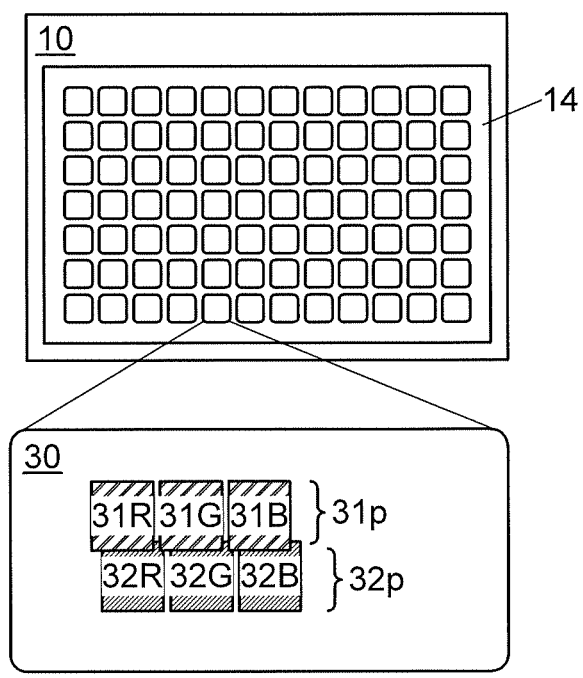
FIG. 19 is a block diagram illustrating an example of a display device.

FIG. 19 is a block diagram of the display device 10. The display device 10 includes a display portion 14.

The display portion 14 includes a plurality of pixel units 30 arranged in a matrix. The pixel units 30 each include a first pixel 31p and a second pixel 32p.

FIG. 19 illustrates an example where the first pixel 31p and the second pixel 32p each include display elements corresponding to three colors of red (R), green (G), and blue (B).

The display elements included in the first pixel 31p are each a display element that utilizes reflection of external light. The first pixel 31p includes a first display element 31R corresponding to red (R), a first display element 31G corresponding to green (G), and a first display element 31B corresponding to blue (B).

The display elements included in the second pixel 32p are each a light-emitting element. The second pixel 32p includes a second display element 32R corresponding to red (R), a second display element 32G corresponding to green (G), and a second display element 32B corresponding to blue (B).

Figure 20A:
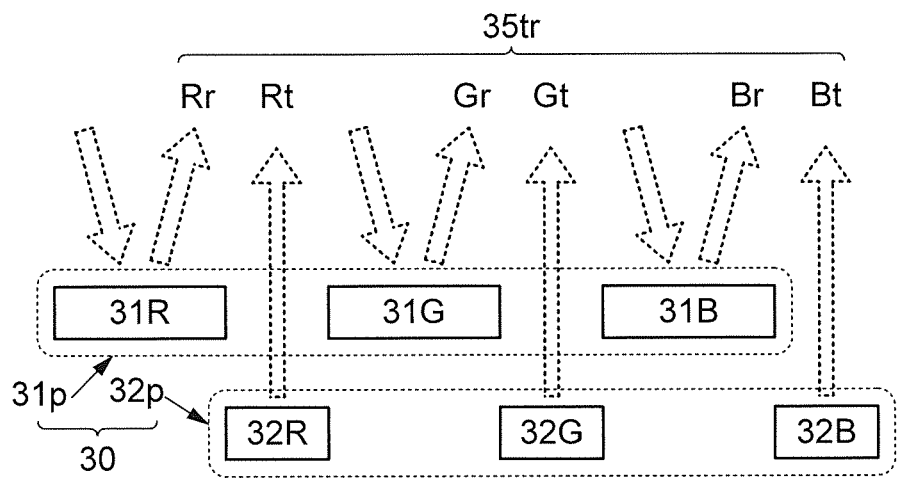
FIGS. 20A to 20C each illustrate an example of a pixel unit.
Figure 20B:
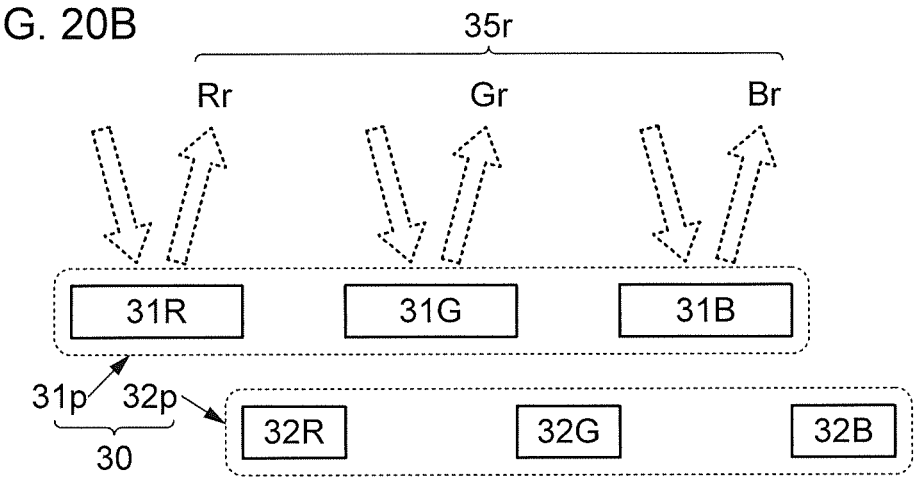
Figure 20C:
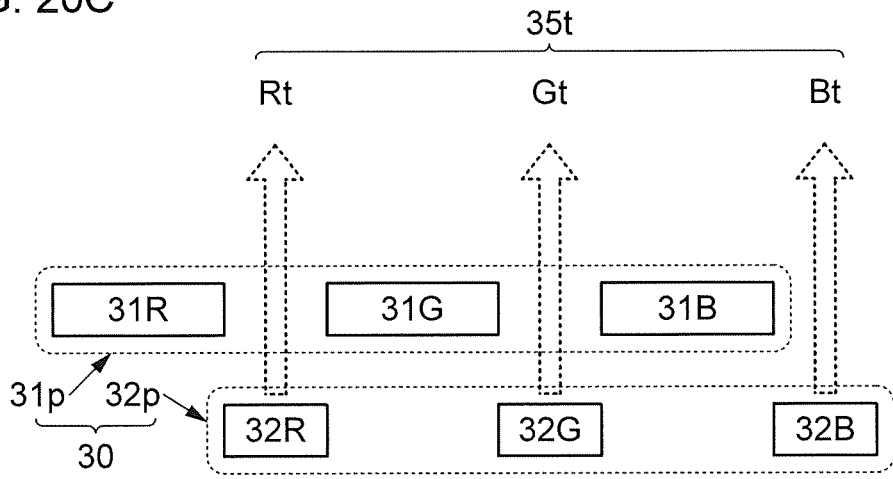

FIGS. 20A to 20C are schematic views illustrating a structure example of the pixel unit 30.

The first pixel 31p includes the first display element 31R, the first display element 31G, and the first display element 31B. The first display element 31R reflects external light and emits red light Rr to the display surface side. Similarly, the first display element 31G and the first display element 31B emit green light Gr and blue light Br, respectively, to the display surface side.

The second pixel 32p includes the second display element 32R, the second display element 32G, and the second display element 32B. The second display element 32R emits red light Rt to the display surface side. Similarly, the second display element 32G and the second display element 32B emit green light Gt and blue light Bt, respectively, to the display surface side.

FIG. 20A corresponds to a display mode (third mode) in which both the first pixel 31p and the second pixel 32p are driven. The pixel unit 30 can emit light 35tr of a predetermined color to the display surface side using the reflected light (the light Rr, the light Gr, and the light Br) and the transmitted light (the light Rt, the light Gt, and the light Bt).

FIG. 20B corresponds to a display mode (first mode) using reflected light in which only the first pixel 31p is driven. For example, when the intensity of external light is high enough, the pixel unit 30 can emit light 35r to the display surface side using only the light from the first pixel 31p (the light Rr, the light Gr, and the light Br), without driving the second pixel 32p. Thus, driving with extremely low power consumption can be performed.

FIG. 20C corresponds to a display mode (second mode) using generated light (transmitted light) in which only the second pixel 32p is driven. For example, when the intensity of external light is extremely low, the pixel unit 30 can emit light 35t to the display surface side using only the light from the second pixel 32p (the light Rt, the light Gt, and the light Bt), without driving the first pixel 31p. Thus, a vivid image can be displayed. Furthermore, by lowering the luminance in a dark environment, a user can be prevented from feeling glare and power consumption can be reduced.

There is no limitation on the color and number of display elements included in the first pixel 31p and the second pixel 32p.

FIGS. 21A to 21C and FIGS. 22A to 22C each illustrate a structure example of the pixel unit 30. Although FIGS. 21A to 21C and FIGS. 22A to 22C are schematic views corresponding to the display mode (third mode) in which both the first pixel 31p and the second pixel 32p are driven, an image can be displayed in the mode (first mode or second mode) in which only the first pixel 31p or the second pixel 32p is driven, like the above-described structure example.

Figure 21A:
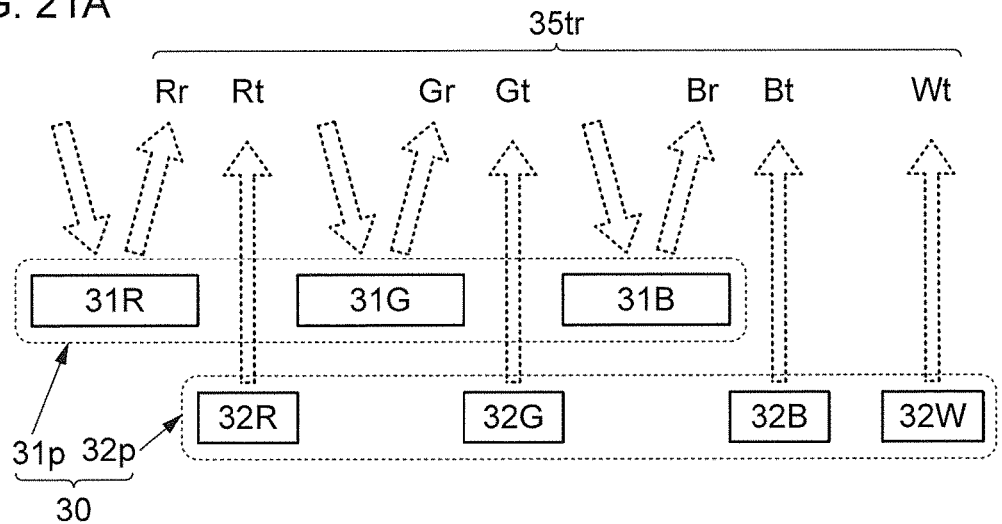
FIGS. 21A to 21C each illustrate an example of a pixel unit.
Figure 21B:
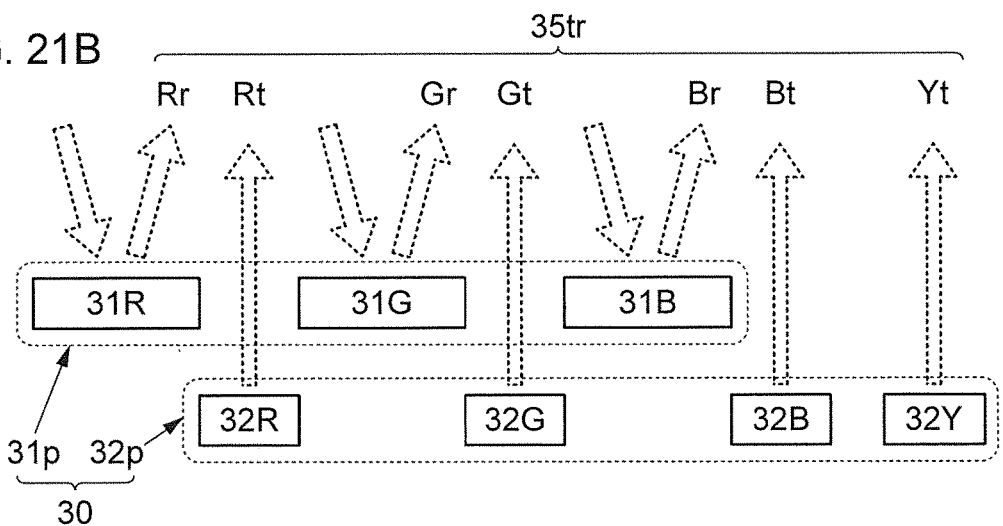
Figure 21C:
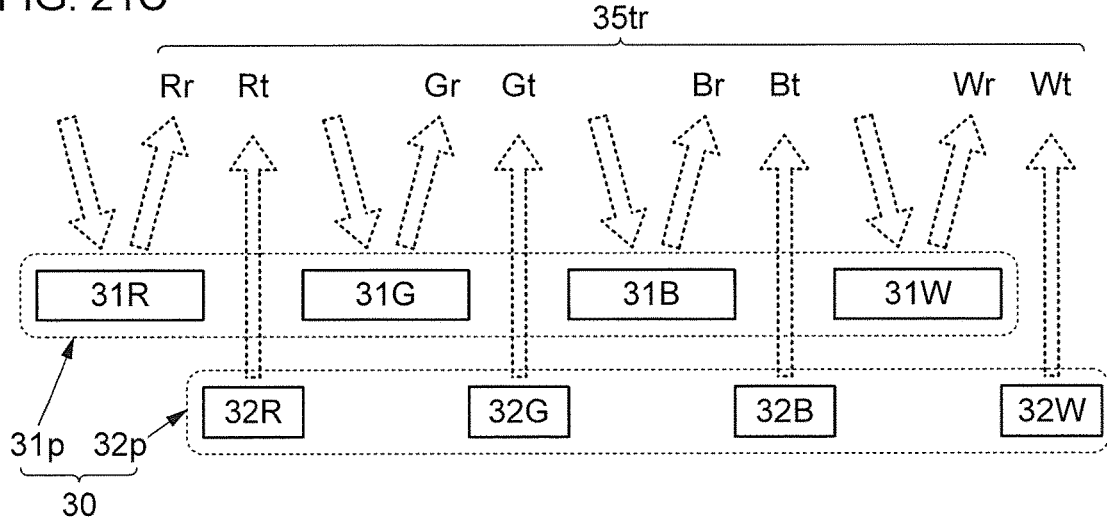
Figure 22A:
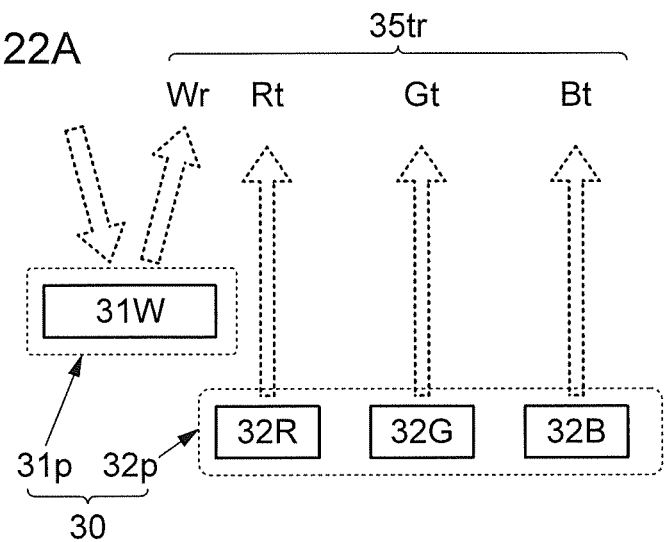
FIGS. 22A to 22C each illustrate an example of a pixel unit.
Figure 22B:
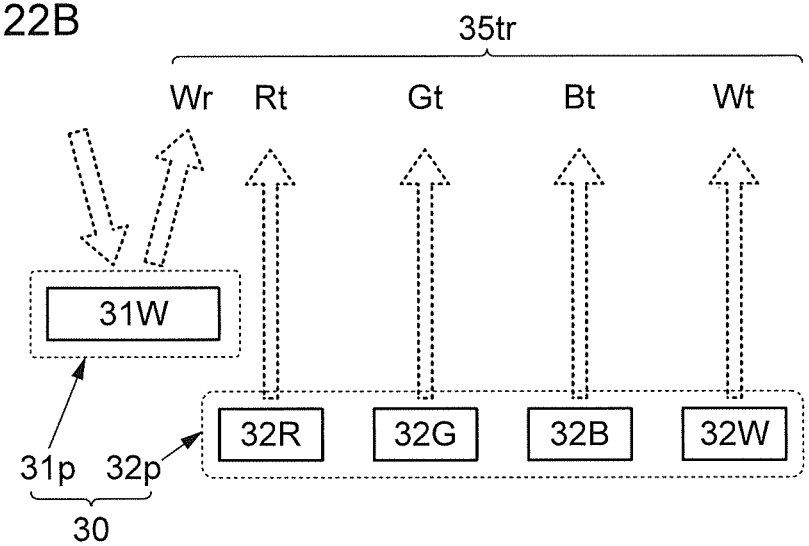

The second pixel 32p illustrated in FIGS. 21A and 21C and FIG. 22B includes a second display element 32W emitting white (W) light in addition to the second display element 32R, the second display element 32G, and the second display element 32B.

Figure 22C:
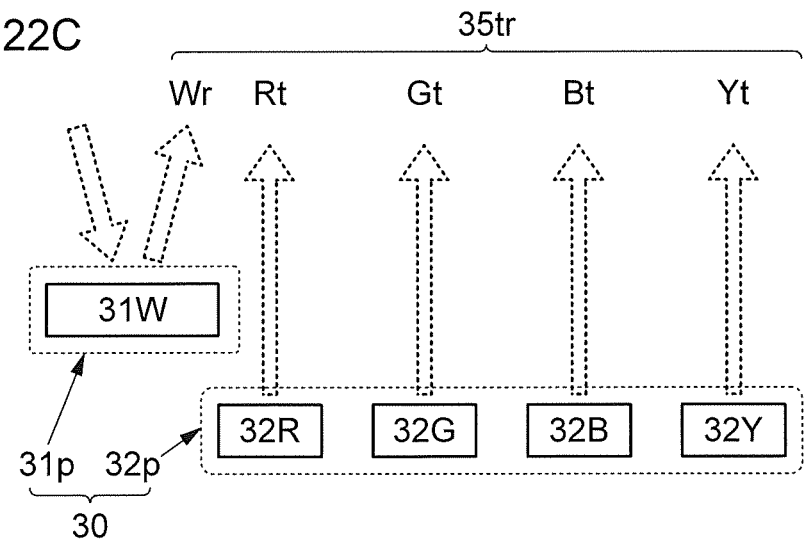

The second pixel 32p illustrated in FIG. 21B and FIG. 22C includes a second display element 32Y emitting yellow (Y) light in addition to the second display element 32R, the second display element 32G, and the second display element 32B.

Power consumption in the display mode using the second pixel 32p (second mode and third mode) can be lower in the structures illustrated in FIGS. 21A to 21C and FIGS. 22B and 22C than in the structure not including the second display element 32W or the second display element 32Y.

The first pixel 31p illustrated in FIG. 21C includes a first display element 31W emitting white (W) light in addition to the first display element 31R, the first display element 31G, and the first display element 31B.

Power consumption in the display mode using the first pixel 31p (first mode and third mode) can be lower in the structure illustrated in FIG. 21C than in the structure illustrated in FIG. 20A.

The first pixel 31p illustrated in FIGS. 22A to 22C includes only the first display element 31W emitting white (W) light. In this structure, a black-and-white image or a grayscale image can be displayed in the display mode (first mode) using only the first pixel 31p, and a color image can be displayed in the display mode (second mode and third mode) using the second pixel 32p.

This structure can increase the aperture ratio of the first pixel 31p and thus increase the reflectivity of the first pixel 31p; accordingly, a brighter image can be displayed.

The first mode is suitable for displaying information that need not be displayed in color such as text information.

This embodiment can be combined with any other embodiment as appropriate.

Embodiment 4

In this embodiment, more specific structure examples of the display device described in Embodiment 1 will be described with reference to FIGS. 23A, 23B1, 23B2, 23B3, and 23B4, FIG. 24, and FIGS. 25A and 25B.

FIG. 23A is a block diagram of a display device 400. The display device 400 includes the display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings S1, and a plurality of wirings S2. The plurality of wirings G1, the plurality of wirings G2, the plurality of wirings ANO, and the plurality of wirings CSCOM are each electrically connected to the circuit GD and the plurality of pixels 410 arranged in a direction indicated by an arrow R. The plurality of wirings S1 and the plurality of wirings S2 are each electrically connected to the circuit SD and the plurality of pixels 410 arranged in a direction indicated by an arrow C.

Although the structure including one circuit GD and one circuit SD is illustrated here for simplicity, the circuit GD and the circuit SD for driving liquid crystal elements and the circuit GD and the circuit SD for driving light-emitting elements may be provided separately.

The pixels 410 each include a reflective liquid crystal element and a light-emitting element.

FIGS. 23B1, 23B2, 23B3, and 23B4 illustrate structure examples of the electrode 311 included in the pixel 410. The electrode 311 serves as a reflective electrode of the liquid crystal element. The opening 451 is provided in the electrode 311 in FIGS. 23B1 and 23B2.

In FIGS. 23B1 and 23B2, a light-emitting element 360 positioned in a region overlapping with the electrode 311 is indicated by a broken line. The light-emitting element 360 overlaps with the opening 451 included in the electrode 311. Thus, light from the light-emitting element 360 is emitted to the display surface side through the opening 451.

In FIG. 23B1, the pixels 410 which are adjacent in the direction indicated by the arrow R are pixels emitting light of different colors. As illustrated in FIG. 23B1, the openings 451 are preferably provided in different positions in the electrodes 311 so as not to be aligned in two adjacent pixels provided in the direction indicated by the arrow R. This allows two light-emitting elements 360 to be apart from each other, thereby preventing light emitted from the light-emitting element 360 from entering a coloring layer in the adjacent pixel 410 (such a phenomenon is referred to as crosstalk). Furthermore, since two adjacent light-emitting elements 360 can be arranged apart from each other, a high-resolution display device is achieved even when EL layers of the light-emitting elements 360 are separately formed with a shadow mask or the like.

In FIG. 23B2, the pixels 410 which are adjacent in a direction indicated by the arrow C are pixels emitting light of different colors. Also in FIG. 23B2, the openings 451 are preferably provided in different positions in the electrodes 311 so as not to be aligned in two adjacent pixels provided in the direction indicated by the arrow C.

The smaller the ratio of the total area of the opening 451 to the total area except for the opening is, the brighter an image displayed using the liquid crystal element can be. Furthermore, the larger the ratio of the total area of the opening 451 to the total area except for the opening is, the brighter an image displayed using the light-emitting element 360 can be.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

As illustrated in FIGS. 23B3 and 23B4, a light-emitting region of the light-emitting element 360 may be positioned in a region where the electrode 311 is not provided, in which case light emitted from the light-emitting element 360 is emitted to the display surface side.

In FIG. 23B3, the light-emitting elements 360 are not aligned in two adjacent pixels 410 provided in the direction indicated by the arrow R. In FIG. 23B4, the light-emitting elements 360 are aligned in two adjacent pixels 410 provided in the direction indicated by the arrow R.

The structure illustrated in FIG. 23B3 can, as mentioned above, prevent crosstalk and increase the resolution because the light-emitting elements 360 included in two adjacent pixels 410 can be apart from each other. The structure illustrated in FIG. 23B4 can prevent light emitted from the light-emitting element 360 from being blocked by the electrode 311 because the electrode 311 is not positioned along a side of the light-emitting element 360 which is parallel to the direction indicated by the arrow C. Thus, high viewing angle characteristics can be achieved.

As the circuit GD, any of a variety of sequential circuits such as a shift register can be used. In the circuit GD, a transistor, a capacitor, and the like can be used. A transistor included in the circuit GD can be formed in the same steps as the transistors included in the pixels 410.

The circuit SD is electrically connected to the wirings S1. For example, an integrated circuit can be used as the circuit SD. Specifically, an integrated circuit formed on a silicon substrate can be used as the circuit SD.

For example, a chip on glass (COG) method, a COF method, or the like can be used to mount the circuit SD on a pad electrically connected to the pixels 410. Specifically, an anisotropic conductive film can be used to mount an integrated circuit on the pad.

Figure 24:
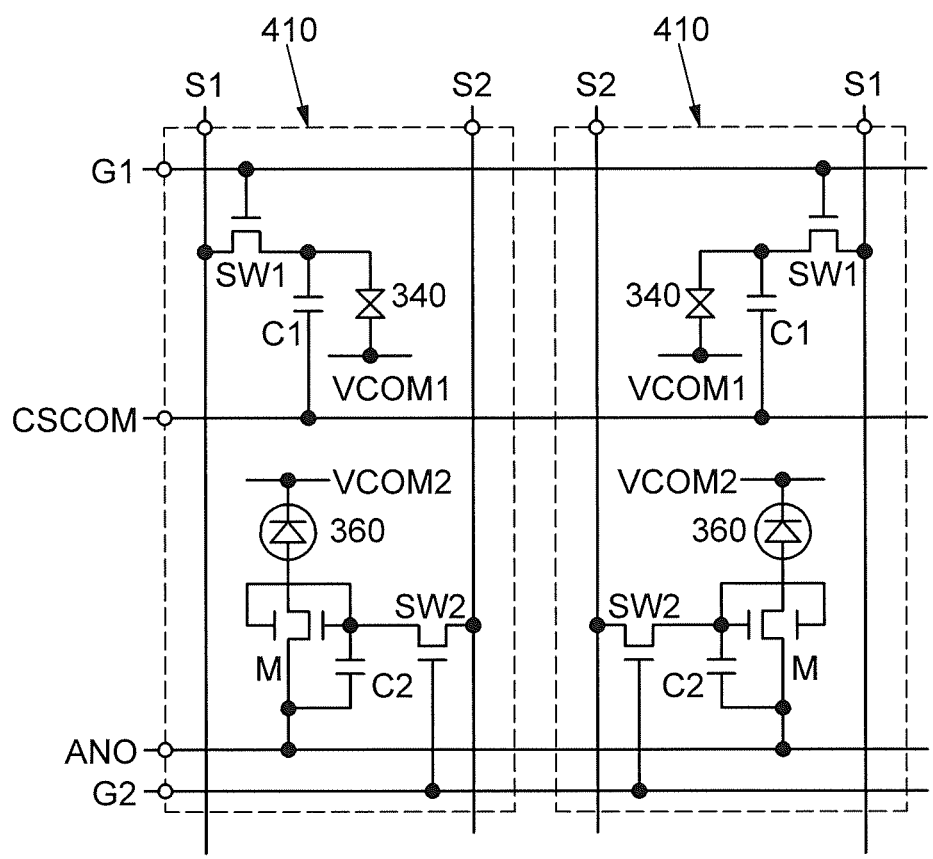
FIG. 24 is a circuit diagram illustrating an example of a pixel circuit in a display device.

FIG. 24 is an example of a circuit diagram of the pixels 410. FIG. 24 illustrates two adjacent pixels 410.

The pixels 410 each include a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 24 illustrates a wiring VCOM1 electrically connected to the liquid crystal element 340 and a wiring VCOM2 electrically connected to the light-emitting element 360.

FIG. 24 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 360. Furthermore, the other electrode of the light-emitting element 360 is connected to the wiring VCOM2.

FIG. 24 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 24, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 25A:
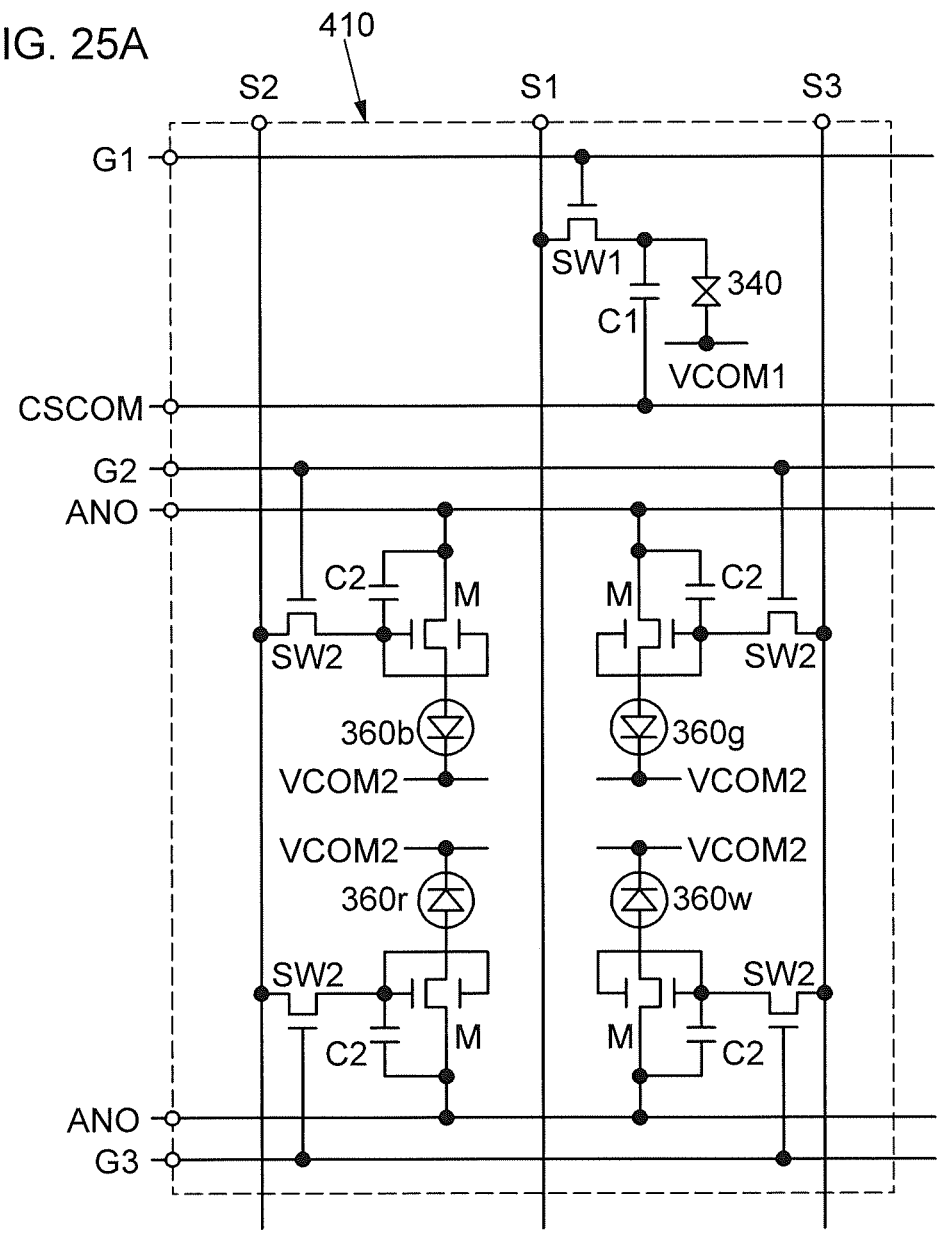
FIG. 25A is a circuit diagram illustrating an example of a pixel circuit in a display device.

Although FIG. 24 illustrates an example in which one liquid crystal element 340 and one light-emitting element 360 are provided in one pixel 410, one embodiment of the present invention is not limited thereto. FIG. 25A illustrates an example in which one liquid crystal element 340 and four light-emitting elements 360 (light-emitting elements 360r, 360g, 360b, and 360w) are provided in one pixel 410. The pixel 410 illustrated in FIG. 25A differs from that in FIG. 24 in being capable of displaying a full-color image with the use of the light-emitting elements by one pixel.

In FIG. 25A, in addition to the wirings in FIG. 24, a wiring G3 and a wiring S3 are connected to the pixel 410.

In the example in FIG. 25A, light-emitting elements emitting red light (R), green light (G), blue light (B), and white light (W) can be used as the four light-emitting elements 360, for example. Furthermore, as the liquid crystal element 340, a reflective liquid crystal element emitting white light can be used. Thus, in the case of displaying an image in the reflective mode, a white image can be displayed with high reflectivity. In the case of displaying an image in the transmissive mode, an image can be displayed with a higher color rendering property at low power consumption.

Figure 25B:
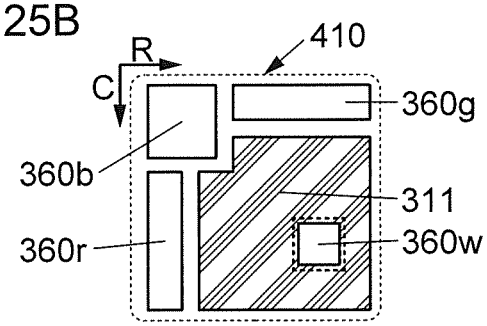
FIG. 25B is a diagram illustrating an example of a pixel.

FIG. 25B illustrates a structure example of the pixel 410 corresponding to FIG. 25A. The pixel 410 includes the light-emitting element 360w overlapping with the opening included in the electrode 311 and the light-emitting element 360r, the light-emitting element 360g, and the light-emitting element 360b which are arranged in the periphery of the electrode 311. It is preferable that the light-emitting elements 360r, 360g, and 360b have almost the same light-emitting area.

This embodiment can be combined with any other embodiment as appropriate.

Embodiment 5

In this embodiment, described below is the composition of a cloud-aligned composite oxide semiconductor (CAC-OS) applicable to a transistor disclosed in one embodiment of the present invention.

The CAC-OS refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which indium oxide ($InO_{X1}$, where X1 is a real number greater than 0) or indium zinc oxide ($In_{X2}Zn_{Y2}O_{Z2}$, where X2, Y2, and Z2 are real numbers greater than 0) forming a mosaic pattern is evenly distributed in the film (this composition is also referred to as a cloud-like composition). The mosaic pattern is formed by separating the materials into $InO_{X1}$ or $In_{X2}Zn_{Y2}O_{Z2}$ and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), for example.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-s \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure of two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally. In the case where the CAC-OS is formed by a sputtering method, one or more of an inert gas (typically, argon), an oxygen gas, and a nitrogen gas can be used as a deposition gas. Furthermore, the flow rate of the oxygen gas to the total flow rate of the deposition gas in deposition is preferably as low as possible, for example, the flow rate of the oxygen gas is higher than equal to 0% and lower than 30%, preferably higher than equal to 0% and lower than or equal to 10%.

The CAC-OS is characterized in that a clear peak is not observed when measurement is conducted using a θ/2θ scan by an out-of-plane method with an X-ray diffraction (XRD). That is, it is found by the XRD that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_n$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

This embodiment can be combined with any other embodiment as appropriate.

Embodiment 6

In this embodiment, a display module and electronic devices of embodiments of the present invention are described.

Figure 26:
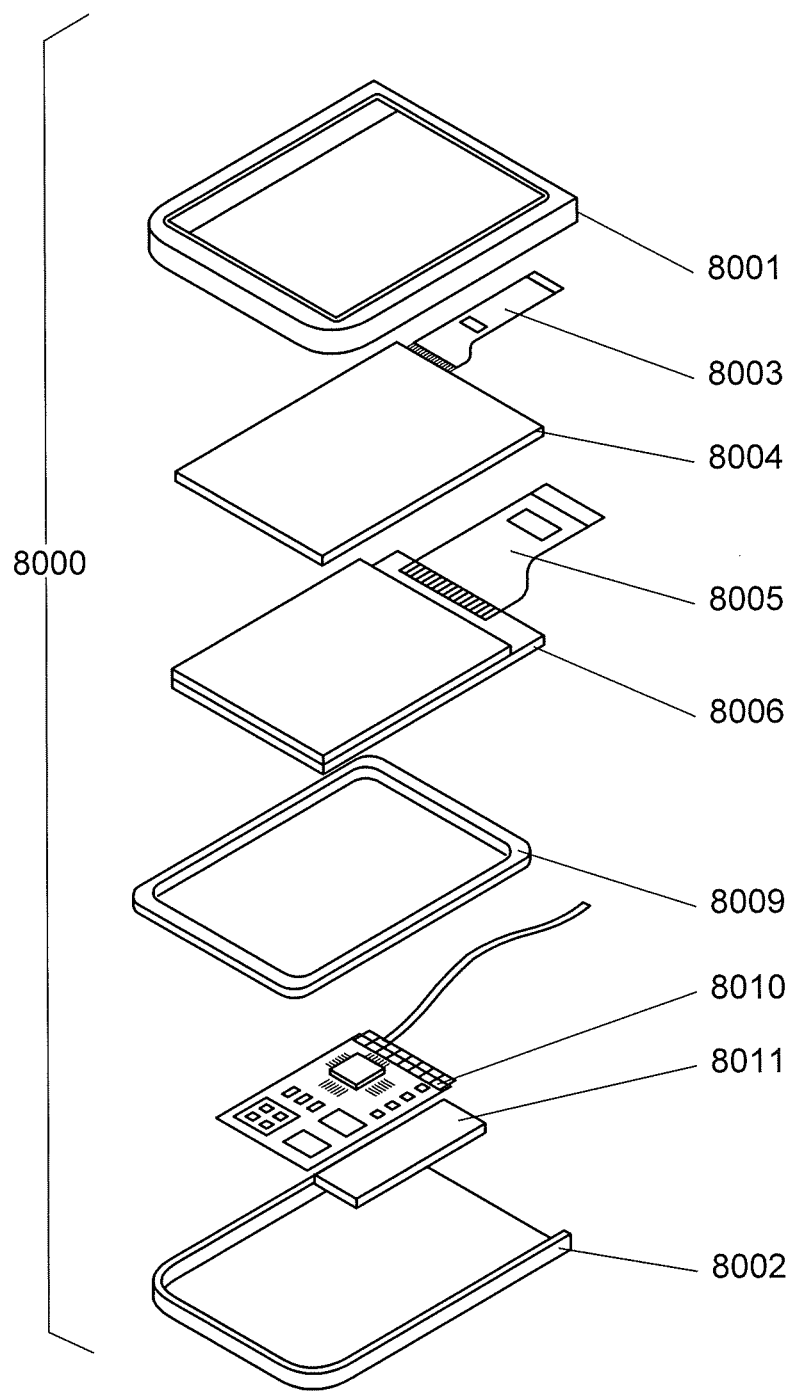
FIG. 26 illustrates an example of a display module.

In a display module 8000 in FIG. 26, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for, for example, the display panel 8006. In that case, a display module with high visibility regardless of the ambient brightness, a display module with low power consumption, or a display module with a wide viewing angle can be fabricated.

The shape and size of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. Instead of providing the touch panel 8004, the display panel 8006 can have a touch panel function.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

The display device of one embodiment of the present invention has a wide viewing angle. Thus, the display device can be suitably used for large display portions of television devices, monitors of computers and the like, digital signage, and PIDs, for example.

Figure 27A:
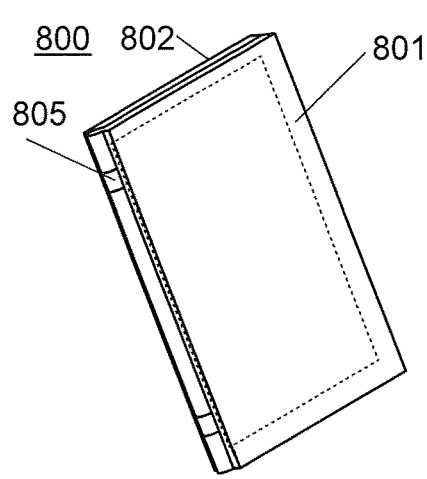
FIGS. 27A to 27D illustrate examples of electronic devices.
Figure 27B:
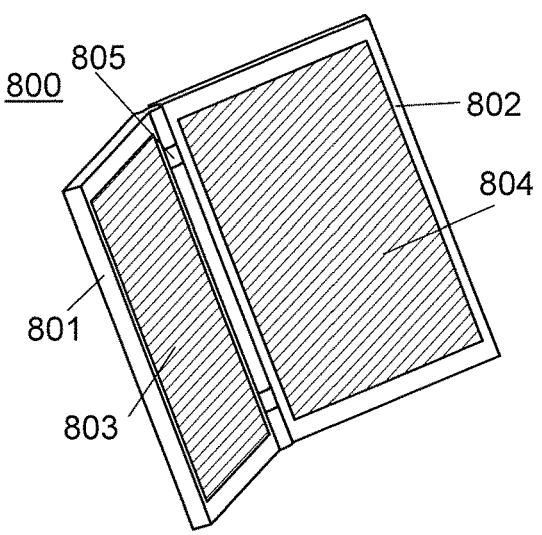

A portable information terminal 800 illustrated in FIGS. 27A and 27B includes a housing 801, a housing 802, a display portion 803, a display portion 804, a hinge portion 805, and the like.

The housing 801 and the housing 802 are joined together with the hinge portion 805. The portable information terminal 800 can be opened as illustrated in FIG. 27B from a closed state (FIG. 27A).

The display device of one embodiment of the present invention can be used for at least one of the display portion 803 and the display portion 804. In that case, a portable information terminal with high visibility regardless of the ambient brightness, a portable information terminal with low power consumption, or a portable information terminal with a wide viewing angle can be fabricated. When a plurality of viewers look at the display portion of the portable information terminal from various angles at the same time, information displayed on the display portion can be recognized by the viewers.

The display portion 803 and the display portion 804 can each display at least one of a text, a still image, a moving image, and the like. When a text is displayed on the display portion, the portable information terminal 800 can be used as an e-book reader.

Since the portable information terminal 800 is foldable, the portable information terminal 800 has high portability and excellent versatility.

A power button, an operation button, an external connection port, a speaker, a microphone, or the like may be provided for the housing 801 and the housing 802.

Figure 27C:
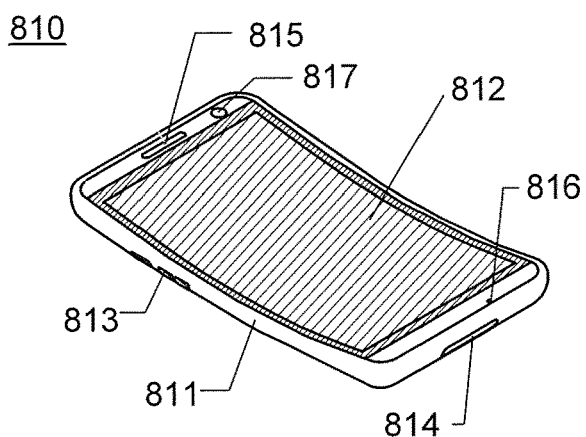

A portable information terminal 810 illustrated in FIG. 27C includes a housing 811, a display portion 812, an operation button 813, an external connection port 814, a speaker 815, a microphone 816, a camera 817, and the like.

The display device of one embodiment of the present invention can be used for the display portion 812. In that case, a portable information terminal with high visibility regardless of the ambient brightness, a portable information terminal with low power consumption, or a portable information terminal with a wide viewing angle can be fabricated. When a plurality of viewers look at the display portion of the portable information terminal from various angles at the same time, information displayed on the display portion can be recognized by the viewers.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications such as mobile phone calls, e-mailing, viewing and editing texts, music reproduction, reproducing a moving image, Internet communication, and computer games, for example.

Figure 27D:
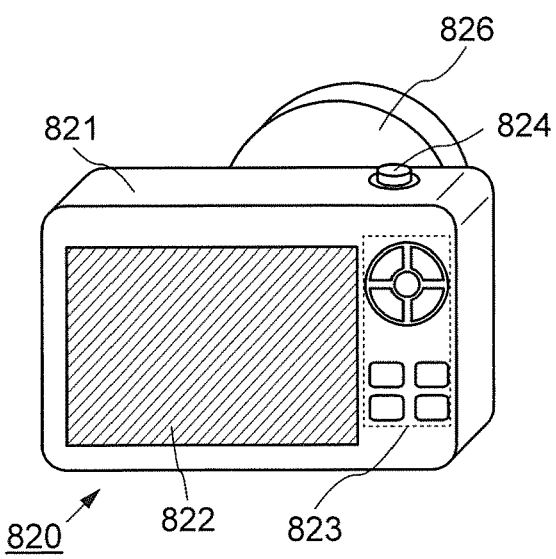

A camera 820 illustrated in FIG. 27D includes a housing 821, a display portion 822, operation buttons 823, a shutter button 824, and the like. Furthermore, an attachable lens 826 is attached to the camera 820.

The display device of one embodiment of the present invention can be used for the display portion 822. The use of the display portion with high visibility regardless of the ambient brightness can increase the convenience of the camera. Furthermore, a camera with low power consumption or a camera with a wide viewing angle can be fabricated. When a plurality of viewers look at the display portion of the camera from various angles at the same time, information displayed on the display portion can be recognized by the viewers.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which serves as a touch panel.

Note that a stroboscope, a viewfinder, or the like can be additionally attached to the camera 820. Alternatively, these may be incorporated into the housing 821.

FIGS. 28A to 28E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device of one embodiment of the present invention can be suitably used for the display portion 9001. Thus, an electronic device including a display portion with high visibility regardless of the surrounding brightness can be manufactured. Furthermore, an electronic device with low power consumption or an electronic device with a wide viewing angle can be fabricated.

The electronic devices illustrated in FIGS. 28A to 28E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 28A to 28E are not limited to the above, and the electronic devices may have other functions.

Figure 28A:
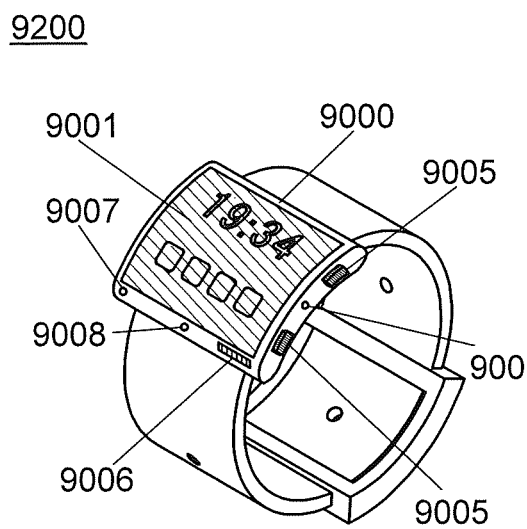
FIGS. 28A to 28E illustrate examples of electronic devices.
Figure 28B:
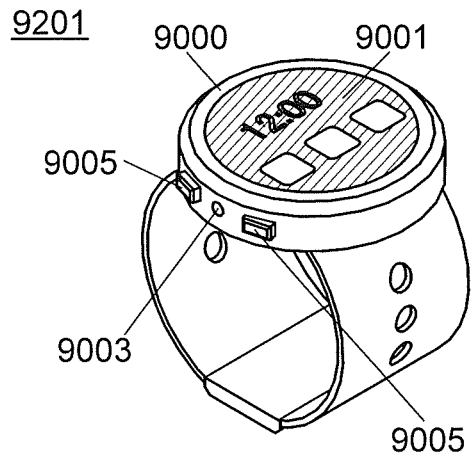

FIG. 28A is a perspective view of a watch-type portable information terminal 9200. FIG. 28B is a perspective view of a watch-type portable information terminal 9201.

The portable information terminal 9200 illustrated in FIG. 28A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 28A, the display surface of the display portion 9001 is not curved in the portable information terminal 9201 illustrated in FIG. 28B. Furthermore, the external state of the display portion of the portable information terminal 9201 is a non-rectangular shape (a circular shape in FIG. 28B).

Figure 28C:
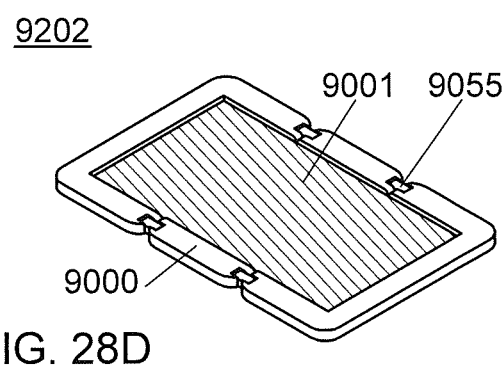
Figure 28D:
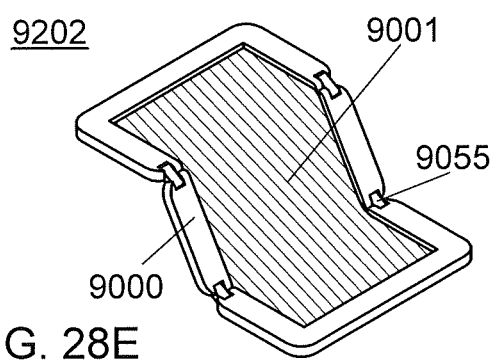
Figure 28E:
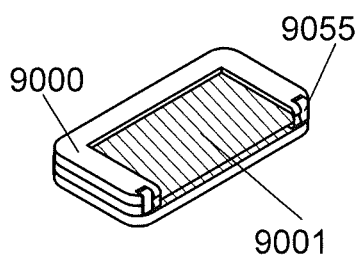

FIGS. 28C to 28E are perspective views of a foldable portable information terminal 9202. FIG. 28C is a perspective view illustrating the portable information terminal 9202 that is opened. FIG. 28D is a perspective view illustrating the portable information terminal 9202 that is being opened or being folded. FIG. 28E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any other embodiment as appropriate.

This application is based on Japanese Patent Application serial No. 2016-130007 filed with Japan Patent Office on Jun. 30, 2016 and Japanese Patent Application serial No. 2016-136220 filed with Japan Patent Office on Jul. 8, 2016, the entire contents of which are hereby incorporated by reference.

What is claimed is:

1. A display device comprising:
a first display element;
a second display element; and
an insulating layer,
wherein the first display element includes a first pixel electrode configured to reflect visible light,
wherein the second display element is configured to emit visible light,
wherein the second display element includes a second pixel electrode and a common electrode,
wherein the first pixel electrode is positioned on an opposite side of the insulating layer from the second pixel electrode,
wherein the common electrode is positioned on an opposite side of the second pixel electrode from the insulating layer,
wherein a shortest distance X between a first plane and a second plane is longer than or equal to 500 nm and shorter than or equal to 200 µm,
wherein the first plane includes a plane of the first pixel electrode on the insulating layer side in a display region of the first display element, and
wherein the second plane includes a plane of the common electrode on the insulating layer side in a display region of the second display element.

2. The display device according to claim 1, further comprising:
a first transistor; and
a second transistor,
wherein the first transistor is configured to control driving of the first display element,
wherein the second transistor is configured to control driving of the second display element, and
wherein the insulating layer has a portion serving as a gate insulating layer of the first transistor and a portion serving as a gate insulating layer of the second transistor.

3. The display device according to claim 1, wherein the shortest distance X is longer than or equal to 1 µm and shorter than or equal to 20 µm.

4. The display device according to claim 1,
wherein the first pixel electrode includes an opening,
wherein the second display element includes a region overlapping with the opening, and
wherein the second display element is configured to emit visible light to the opening.

5. The display device according to claim 1, wherein the display device is configured to display an image using one or both of light reflected by the first display element and light emitted from the second display element.

6. The display device according to claim 1, wherein the first display element is a reflective liquid crystal element.

7. The display device according to claim 1, wherein the second display element is an electroluminescent element.

8. A display module comprising a circuit board and the display device according to claim 1.

9. An electronic device comprising at least one of an antenna, a battery, a housing, a camera, a speaker, a microphone and an operation button, and the display module according to claim 8.

10. A display device comprising:
a first display element;
a second display element;
a first insulating layer;
a second insulating layer;
a first transistor; and
a second transistor,
wherein the first transistor is configured to control driving of the first display element,
wherein the second transistor is configured to control driving of the second display element,
wherein the first display element includes a first pixel electrode configured to reflect visible light,
wherein the second display element is configured to emit visible light,
wherein the second display element includes a second pixel electrode and a common electrode,
wherein the first transistor and the second transistor are positioned between the first insulating layer and the second insulating layer,
wherein the first transistor is electrically connected to the first pixel electrode through an opening in the first insulating layer,
wherein the second transistor is electrically connected to the second pixel electrode through an opening in the second insulating layer,
wherein the common electrode is positioned on an opposite side of the second pixel electrode from the second insulating layer,
wherein a shortest distance X between a first plane and a second plane is longer than or equal to 500 nm and shorter than or equal to 200 µm,
wherein the first plane includes a plane of the first pixel electrode on the first transistor side in a display region of the first display element, and
wherein the second plane includes a plane of the common electrode on the second transistor side in a display region of the second display element.

11. The display device according to claim 10, wherein one or both of the first transistor and the second transistor include an oxide semiconductor in a channel formation region.

12. The display device according to claim 10, further comprising an optical member,
wherein a shortest distance between the optical member and the first transistor is longer than a shortest distance between the optical member and the first display element, and
wherein a shortest distance between the optical member and the second display element is longer than the shortest distance between the optical member and the first transistor.

13. The display device according to claim 12, wherein the optical member includes at least one of a polarizing plate, a light diffusion layer, and an anti-reflective layer.

14. The display device according to claim 10, wherein the shortest distance X is longer than or equal to 1 μm and shorter than or equal to 20 μm.

15. The display device according to claim 10,
wherein the first pixel electrode includes an opening,
wherein the second display element includes a region overlapping with the opening, and
wherein the second display element is configured to emit visible light to the opening.

16. The display device according to claim 10, wherein the display device is configured to display an image using one or both of light reflected by the first display element and light emitted from the second display element.

17. The display device according to claim 10, wherein the first display element is a reflective liquid crystal element.

18. The display device according to claim 10, wherein the second display element is an electroluminescent element.

19. A display module comprising a circuit board and the display device according to claim 10.

20. An electronic device comprising at least one of an antenna, a battery, a housing, a camera, a speaker, a microphone and an operation button, and the display module according to claim 19.

* * * * *